US009404986B2

(12) United States Patent
White et al.

(10) Patent No.: US 9,404,986 B2
(45) Date of Patent: Aug. 2, 2016

(54) MEASURING BIOLOGICAL TISSUE PARAMETERS USING DIFFUSION MAGNETIC RESONANCE IMAGING

(75) Inventors: Nathan S. White, San Diego, CA (US); Anders M. Dale, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 1050 days.

(21) Appl. No.: 13/466,081

(22) Filed: May 7, 2012

(65) Prior Publication Data
US 2012/0280686 A1  Nov. 8, 2012

Related U.S. Application Data

(60) Provisional application No. 61/483,591, filed on May 6, 2011.

(51) Int. Cl.
*G01V 3/00* (2006.01)
*G01R 33/563* (2006.01)
*G01R 33/48* (2006.01)

(52) U.S. Cl.
CPC .......... *G01R 33/56341* (2013.01); *G01R 33/48* (2013.01)

(58) Field of Classification Search
CPC ................................. G01R 33/56341
USPC .......................... 324/309, 307, 306
See application file for complete search history.

(56) References Cited

U.S. PATENT DOCUMENTS 6,130,958 A   10/2000   Rohler et al.
6,587,707 B2   7/2003   Nehrke et al.
6,771,068 B2   8/2004   Dale et al.
(Continued)

FOREIGN PATENT DOCUMENTS

JP   2004089224   3/2004
JP   2005525206   8/2005
(Continued)

OTHER PUBLICATIONS

"Hidden Markov Model" Wikipedia, the free encyclopedia, http://en.wikipedia.org/wiki/Hidden_Markov_model, accessed on Apr. 12, 2006, 4 pages.
(Continued)

*Primary Examiner* — Louis Arana
(74) *Attorney, Agent, or Firm* — Perkins Coie LLP

(57) ABSTRACT

Methods, devices and systems are disclosed for measuring biological tissue parameters using restriction spectrum magnetic resonance imaging. In one aspect, a method of characterizing a biological structure includes determining individual diffusion signals from magnetic resonance imaging (MRI) data in a set of MRI images that include diffusion weighting conditions (e.g., diffusion gradient directions, diffusion gradient strengths, sensitivity factors (b-values), or diffusion times), combining the individual diffusion signals to determine a processed diffusion signal corresponding to at least one location within one or more voxels of the MRI data, calculating one or more parameters from the processed diffusion signal by using the diffusion weighting conditions, and using the one or more parameters to identify a characteristic of the biological structure, in which the one or more parameters include values over a range of one or more diffusion length scales based on at least one of diffusion distance or diffusion rate.

45 Claims, 29 Drawing Sheets

(56) References Cited

U.S. PATENT DOCUMENTS

| | | | |
|---|---|---|---|
| 6,952,097 | B2 | 10/2005 | Schreck et al. |
| 6,958,605 | B2 | 10/2005 | Dale et al. |
| 7,022,077 | B2 | 4/2006 | Mourad et al. |
| 7,324,842 | B2 | 1/2008 | Dale et al. |
| 7,358,732 | B2 | 4/2008 | Van Der Kouwe et al. |
| 8,126,291 | B2 | 2/2012 | Paragios et al. |
| 8,170,305 | B2 | 5/2012 | Laidlaw |
| 9,097,778 | B2 * | 8/2015 | Bito et al. |
| 2003/0065535 | A1 | 4/2003 | Karlov et al. |
| 2003/0118227 | A1 | 6/2003 | Winsor et al. |
| 2004/0113615 | A1 | 6/2004 | Bammer et al. |
| 2005/0107808 | A1 | 5/2005 | Evans et al. |
| 2005/0143634 | A1 | 6/2005 | Baker et al. |
| 2006/0001424 | A1 | 1/2006 | Harvey et al. |
| 2007/0081706 | A1 | 4/2007 | Zhou et al. |
| 2007/0122018 | A1 | 5/2007 | Zhou et al. |
| 2007/0238969 | A1 * | 10/2007 | Song et al. .................... 600/410 |
| 2007/0253599 | A1 | 11/2007 | White et al. |
| 2007/0253611 | A1 | 11/2007 | Rousson et al. |
| 2008/0069446 | A1 | 3/2008 | Ancelin |
| 2008/0154118 | A1 | 6/2008 | Dale et al. |
| 2008/0285835 | A1 | 11/2008 | Holland et al. |
| 2009/0046951 | A1 | 2/2009 | Paragios et al. |
| 2010/0004527 | A1 | 1/2010 | Dale |
| 2012/0068702 | A1 * | 3/2012 | Feiweier ...................... 324/309 |
| 2012/0288171 | A1 | 11/2012 | Beymer |
| 2015/0073258 | A1 * | 3/2015 | Mazer et al. .................. 600/410 |

FOREIGN PATENT DOCUMENTS

| | | |
|---|---|---|
| JP | 2006524088 | 10/2006 |
| JP | 2007275312 | 10/2007 |
| WO | 2008054947 | 5/2008 |
| WO | 2009065079 | 5/2009 |

OTHER PUBLICATIONS

"Kalman Filter" Wikipedia, three free encyclopedia, http://enlwikipedia.org/wiki/Kalman_filter, accessed on Apr. 12, 2006, 15 pages.

"Motion Correction," Magnetic Resonance Research Laboratory, Mayo Clinic, http://mayoresearch.mayo.edu/mayo/research/mri-lab/motion_correction.cfm, accessed on Apr. 11, 2006, 3 pages.

"Recursive Bayesian estimation" Wikipedia, thre free encyclopedia, http://en.wikipedia.org/wiki/Recursive_Bayesian_estimation, accessed on Apr. 12, 2006, 3 pages.

Ashburner, J., et al., "High-Dimensional Image Warping", Human Brain Function, second ed. Elsevier, Academic Press, Amsterdam, Boston, pp. 635-653.

Basser, P. J. et al., " In vivo fiber tractography using DT-MRI data," Magnetic Resonance in Medicine 44(4):625-632 (2000).

Basser, P.J. et al., "MR diffusion tensor spectroscopy and imaging," Biophysical Journal 66(1):259-267 (Jan. 1994).

Behrens, T. E. J., "Characterization and propagation of uncertainty in diffusion-weighted MR imaging," Magnetic Resonance in Medicine 50(5):1077-1088 (2003).

Behrens, T. E. J., "Probabilistic diffusion tractography with multiple fibre orientations: What can we gain?," NeuroImage 34(1):144-155 (2007).

Berman, J. I., "Probabilistic streamline q-ball tractography using the residual bootstrap," NeuroImage 39(1): 215-222 (2008).

Berman, J.I.,. "Accuracy of diffusion tensor magnetic resonance imaging tractography assessed using intraoperative subcortical stimulation mapping and magnetic source imaging," J Neurosurg. 107(3): 488-494 (2007).

Bernasconi, N. et al., "Mesial temporal damage in temporal lobe epilepsy: a volumetric MRI study of the hippocampus, amygdala and parahippocampal region," Brain 126(Pt 2):462-469 (2003).

Bernstein, M.A. et al., "Ringlet motion correction for 3D MRI acquired with the elliptical centric view order," Magn Reson Med, 50(4): p. 802-12 (2003).

Bonilha, L et al., "Extrahippocampal gray matter atrophy and memory impairment in patients with medial temporal lobe epilepsy," Human Brain Mapping 28(12):1376-1390 (2007).

Burgel et al., "White matter fiber tracts of the human brain: Three-dimensional mapping at microscopic resolution bpography and intersubject variability", NeuroImage 29, 2006, pp. 1092-1105.

Catani, M., et al., "Virtual in vivo interactive dissection of white matter fasciculi in the human brain," NeuroImage 17 (1):77-94 (2002).

Chang, H. and J.M. Fitzpatrick, "A technique for accurate magnetic resonance imaging in the presence of field Inhomogeneities," IEEE Transactions on Medical Imaging 11(3):319-329 (Sep. 1992).

Christensen et al., "Volumetric Transformation of Brain Anatomy", IEEE Trans on Med Imag., vol. 16, No. 6, Dec. 1997, p. 864.

Clayden, J. D. et al., "A probabilistic model-based approach to consistent white matter tract segmentation," IEEE Transactions on Medical Imaging 26(11):1555-1561 (Nov. 2007).

Clayden, J. D. et al., "Improved segmentation reproducibility in group tractography using a quantitative tract similarity measure," NeuroImage 33(2):482-492 (2006).

Collins, D. Louis et al., "An Automated 3D nonlinear deformation procedure for determination of gross morphometric variability in human brain", Proc. SPIE 2359, Visualization in Biomedical Computing 1994, 180 (Sep. 9, 1994); doi:10.1117/12.185178.

Conturo, T.E. et al., "Tracking neuronal fiber pathways in the living human brain," Proc. Natl. Acad. Sci. USA 96 (18):10422-10427 (Aug. 1999).

Cook et al., "An Automated Approach to Connectivity-Based Partitioning of Brain Structures", Medical Image Computing and Computer-Assisted Intervention—MIC CAI 2005 Lecture Notes in Computer Science, Jan. 1, 2005, pp. 164-171.

Cook et al., "Atlas-guided probabilistic diffusion-tensor fiber tractography", IEEE International Symposium on Biomedical Imaging: From Nano to Macro, May 14, 2008-May 17, 2008, Paris, France, pp. 951-954.

Corouge, et al., "Fiber tract-oriented statistics for quantitative diffusion tensor MRI analysis," Medical Image Analysis, 10, 2006, pp. 786-798.

Costa, A.F. et al., "Using the axis of rotation of polar navigator echoes to rapidly measure 3D rigid-body motion", Magn Reson Med., 53(1), 2005, pp. 150-158.

Csernansky et al., "Preclinical detection of Alzheimer's disease: hippocampal shape and volume predict dementia onset in the elderly", NeuroImage 25, 2005, pp. 783-792.

Derbyshire, J.A., et al., "Dynamic scan-plane tracking using MR position monitoring," J Magn Reson Imaging, 8(4), 1998, pp. 924-932.

Dietrich, O. et al., t"Reducing motion artefacts in diffusion-weighted MRI of the brain: efficacy of navigator echo correction and pulse triggering", Neuroradiology, 42(2), 2000, pp. 85-91.

Dinov, et al., "Applied Probability & Statistics for Engineers: Joint Probability Distribution and Random Samples," UCLA, Spring 2004.

Ehman, R.L. et al., "Adaptive Technique for High-Definition MR Imaging of Moving Structures", Radiology 173, 1989, pp. 255-263.

Fischl, B. et al., "Whole brain segmentation: automated labeling of neuroanatomical structures in the human brain," Neuron 33(3):341-355 (Jan. 31, 2002).

Franklin, L.R., "Characterization of anisotrophy in high angular resolution diffusion-weighted MRI," Magnetic Resonance in medicine 47(6):1083-1099 (2002).

Freeborough et al., "The Boundary Shift Integral: An Accurate and Robust Measure of Cerebral Volume Changes from Registered Repeat MRI", IEEE Trans. On Med Imag., vol. 16, No. 5, Oct. 1997, p. 623.

Friman, O. et al., "A Bayesian approach for stochastic white matter tractographym," IEEE Transactions on Medical Imaging 25(8):965-978 (Aug. 2006).

Friston, K.J. et al., "Spatial registration and normalization of images," Human Brain Mapping 2:165-189 (1995).

Fu, Z.W. et al., "Oribtal navigator echoes for motion measurements in magnetic resonance imaging", Magn Reson Med, 34(5), 1995, pp. 746-753.

(56) References Cited

OTHER PUBLICATIONS

Genovese, C.R. et al., "Thresholding of statistical maps in functional neuroimaging using the false discovery rate," NeuroImage 15(4):870-878 (2002).
Hagler, Jr., D. J. et al., "Automated white-matter tractography using a probabilistic diffusion tensor atlas: Application to temporal lobe epilepsy," Human Brain Mapping, 30(5)1535-1547 (2009).
Holland et al., "Nonlinear registration of longitudinal images and measurement of change in regions of interest", Medical Image Analysis 15 (2011) 489-497.
Hua, K. et al., "Tract probability maps in stereotaxic spaces: Analyses of white matter anatomy and tract-specific quantification," Neuroimage 39(1)336-347 (2008).
Jansons, K. M. And D.C. Alexander, "Persistent Angular Structure: new insights from diffusion MRI data. Dummy version," Proceedings of the Information Processing in Medical Imaging, 18th International Conference, IPMI 2003, LNCS 2732, Ambleside, UK, Jul. 20-25, 2003, C. Taylor and J. A. Noble (Eds.), 18: 672-683 (2003).
Jellison et al., "Diffusion Tensor Imaging of Cerebral White Matter: A pictorial review of Physics, Fiber tract anatomy, and Tumor Imaging Patterns", AJNR, 25, 2004, pp. 356-369.
Jones, D.K. And C. Pierpaoli, "Confidence mapping in diffusion tensor magnetic resonance imaging tractography using a bootstrap approach," Magnetic Resonance in Medicine 53(5):1143-1149 (2005).
Jovicich, J. et al., "Reliability in multi-site structural MRI studies: Effects of gradient non-linearity correction on phantom and human data," Neuroimage 30(2):436-443 (2006).
Kadah, Y.M. et al., "Floating navigator echo (FNAV) for in-plane 2D translational motion estimation", Magn Reson Med, 51(2), 2004, pp. 403-407.
Keller, S.S. et al, "Voxel-based morphometric comparison of hippocampal and extrahippocampal abnormalities in patients with left and right hippocampal atrophy," Neuroimage 16(1):23-31 (2002).
Knesaurek et al., "A new iterative reconstruction technique for attenuation correction in high-resolution positron mission tomography", European Journal of Nuclear Medicine, Jun. 1996, vol. 23, Issue 6, pp. 656-661.
Lawes, I.N. et al., "Atlas-based segmentation of white matter tracts of the human brain using diffusion tensor tractography and comparison with classical dissection," NeuroImage 39(1):62-79 (2008).
Lazar M. and A.L. Alexander, "Bootstrap white matter tractography (BOOT-TRAC)," NeuroImage 24(2):524-32 (2005).
Leventon, M.E. and W.E.L. Grimson, "Multi-modal volume registration using joint intensity distributions,"Proceedings of the International Conference on Medical Image Computing and Computer-Assisted Intervention—MIMCCAI'98, vol. 1496, pp. 1057-1066 (1998).
Lin et al., "Diffusion tensor tractography-based group mapping of the Pyramidal tract in relapsing-remitting multiple sclerosis patients", AJNR 28, 2007, pp. 278-282.
Maddah, M. et al., "Automated atlas-based clustering of white matter fiber tracts from DTMRI," Proceedings of the International Conference on Medical Image Computing and Computer-Assisted Intervention—MIMCCAI'05, vol. 8(Pt 1):188-195 (2005).
Manduca, A. et al., "Autocorrection in MR Imaging: Adaptive Motion Correction without Navigator Echoes", Radiology 215, 2000, pp. 904-909.
Masutani et al., "Building Statistical Atlas of White Matter Fiber Tract Based on Vector/Tensor Field Reconstruction in Diffusion Tensor MRI", Advances in Visual Computing Lecture Notes in Computer Science, Jam. 1, 2005, pp. 84-91.
Masutani et al., "Model-Based Tractography Based on Statisitcal Atlas of MR-DTI", IEEE, 2006, pp. 89-92.
Morgan, P.S. et al., "Correction of spatial distortion in EPI due to inhomogeneous static magnetic fields using the reversed gradient method," Journal of Magnetic Resonance Imaging 19(4): 499-507 (2004).
Mori, S. et al., "A motion correction scheme by twin-echo navigation for diffusion-weighted magnetic resonance imaging with multiple RF echo acquisition", Magn Reson Med, 40(4), 1998, pp. 511-516.
Mori, S. et al., "Imaging cortical association tracts in the human brain using diffusion-tensor-based axonal tracking,"Magnetic Resonance in Medicine 47(2):215-223 (2002).
Mori, S. et al., "Three-dimensional tracking of axonal projections in the brain by magnetic resonance imaging," Ann. Neurol. 45:265-269 (1999).
Moriguchi, H. et al., "Novel interleaved spiral imaging motion correction technique using orbital navigators", Magn Reson Med, 50(2): 2003, pp. 423-428.
Nehrke, K. et al., "Prospective Correction of Affine for Arbitrary MR Sequences on a Clinical Scanner", Magnet Resonance in Medicine 54 2005, pp. 1130-1138.
Nucifora et al., "Diffusion-tensor MR imaging and tractography: Exploring brain microstructure and connectivity", Radiology, vol. 245, No. 2, Nov. 1, 2007, pp. 367-384.
O'Donnell, L. And C.-F. Westin, "High-dimensional white matter atlas generation and group analysis," Proceedings of the International Conference on Medical Image Computing and Computer-Assisted Intervention—MIMCCAI'06, vol. 9(Pt 2), pp. 243-251 (2006).
O'Donnell, L. J. et al., "Automatic tractography segmentation using a high-dimensional white matter atlas," IEEE Transactions on Medical Imaging 26(11):1562-1575 (2007).
Oldfield, R.C., "The assessment and analysis of handedness: the Edinburgh inventory," Neuropsychologia 9(1):97-113 (1971).
Park, H.- J. et al., 'Spatial normalization of diffusion tensor MRI using multiple channels. NeuroImage 20 (4):1995-2009 (2003).
Park, H.-J. et al., "Method for combining information from white matter fiber tracking and gray matter parcellation," AJNR Am J Neuroradiol 25(8):1318-1324 (Sep. 2004).
Parker, G. J. M. et al., "Initial demonstration of in vivo tracing of axonal projections in the macaque brain and comparison with the human brain using diffusion tensor imaging and fast marching tractography," NeuroImage 15(4):797-809 (2002).
Peshkovsky, A. et al., "Motion correction in MRI using an apparatus for dynamic angular position tracking (ADAPT)," Magn Reson Med, 49(1): 138-143 (2003).
Poupon, C. et al., "Regularization of diffusion-based direction maps for the tracking of brain white matter fascicles," NeuroImage 12(2):184-195 (2000).
Reinsberg, S.A. et al., "A complete distortion correction for MR images: II Rectification of static-field inhomogeneities by similarity-based profile mapping," Phys. Med. Biol. 50(11):2651-2661 (2005).
Sachs, T.S. et al., "Real-time motion detection in spiral MRI using navigators", Magn Reson Med, 32(5): 639-645 (1994).
Scahill et al., "Mapping the evolution of regional atrophy in Alzheimer's disease: Unbiased analysis of fluid-registered serial MRI", Dementia Research Group, Department of Clinical Neurology, Institute of Neurology, University college London, Queen Square, London WC1N 3BG, United Kingdom; and Division of Neuroscience and Psychological Medicine, Fac.
Shankaranarayanan, A., "Motion Insensitive 3D Imaging Using a Novel Real-Time Image-Based 3D Prospective Motion Correction Method (3D Promo)", ISMRM 15th Scientific Meeting, Berlin, Germany, May 19-25, 2007, pp. 2117.
Speck et al., "Prospective real-time slice-by-slice motion correction for fMRI in freely moving subjects", Mag Reson Mater Phy 19, 2006 pp. 55-61.
Stieltjes, B. et al., "Diffusion tensor imaging and axonal tracking in the human brainstem," NeuroImage 14(3):723-735 (2001).
Studholme et al., "Dense feature deformation morphometry: Incorporating DTE data into conventional MRI morphometry", Medical Image Analysis, vol. 12, No. 6, Apr. 16, 2008, pp. 742-751.
Thesen, S. et al., "Prospective Acquisition Correction for Head Motion with Image-Based Tracking for Real-Time fMRI" Magnetic Resonance in Medicine 44, 2000, pp. 457-465.
Tournier, J.-D. et al., "Direct estimation of the fiber orientation density function from diffusion-weighted MRI data using spherical deconvolution," NeuroImage 23(3):1176-1185 (2004).
Tuch, D.S., "Q-ball imaging," Magnetic Resonance in Medicine 52(6):1358-1372 (2004).

(56) References Cited

OTHER PUBLICATIONS

Van Der Kouwe, AJW et al., "Rapid real-time prospective rigid body motion correction during imaging using aloverleaf navigators", in Proc. Intl. Soc. Mag. Reson. Med. 11, 2004, p. 95.
Wakana, S. et al., "Fiber tract-based atlas of human white matter anatomy," Radiology 230(1):77-87 (2004).
Wakana, S. et al., "Reproducibility of quantitative tractography methods applied to cerebral white matter," NeuroImage 36(3):630-644 (2007).
Wan, Eric et al., "Dual Extended Kalman Filter Methods", Chapter 5 in Kalman Filtering and Neural Networks, 2001, pp. 123-173.
Ward, H.A. et al., "Prospective multiaxial motion correction for fMRI", Magn Reson Med, 43(3), 2000 pp. 459-469.
Weih, K.S. et al., "Online motion correction for diffusion-weighted segmented-EPI and FLASH imaging", Magma, 16(6), 2004, pp. 277-283.
Welch, E.B. et al., "Spherical navigator echoes for full 3D rigid body motion measurement in MRI", Magn Reson Med, 17(1): 2002, pp. 32-41.
Welch, EB.B. et al., "Interscan registration using navigator echoes", Magn Reson Med, 52(6): 2004, pp. 1448-1452.
White, Nathan S. et al., "Prospective Motion Correction Using Nonlinear Predictive Filtering", Joint Annual Meeting ISMRM-ESMRMB, Berlin, Germany, May 19-25, 2007, p. 1829.
Xia, Y. et al., "Knowledge-based classification of neuronal fibers in entire brain," Proceedings of the International Conference on Medical Image Computing and Computer-Assisted Interventation—MIMCCAI'05, vol. 8(Pt 1): 205-212(2005).
Yogarajah, M. And J.S. Duncan, "Diffusion-based magnetic resonance imaging and tractography in epilepsy," Epilepsia 49(2): 189-200 (2008).
Zhang, J. et al., "Evidence of slow maturation of the superior longitudinal fasciculus in early childhood by diffusion tensor imaging", Neuroimage, vol. 38, No. 2, Aug. 8, 2007, pp. 239-247.
Alexander DC. (2005a): Maximum entropy spherical deconvolution for diffusion MRIU. Inf Process Med Imaging 19:76-87.
Alexander DC. (2005b): Multiple-fiber reconstruction algorithms for diffusion MRI. Ann.N.Y.Acad.Sci. 1064:113-133.
Alexander DC, Barker GJ, Arridge SR. (2002): Detection and modeling of non-Gaussian apparent diffusion coefficient profiles in human brain data. Magn Reson Med 48(2):331-40.
Alexander DC, Hubbard PL, Hall MG, Moore EA, Ptito M, Parker GJ, Dyrby TB. (2010): Orientationally invariant indices of axon diameter and density from diffusion MRI. Neuroimage 52(4):1374-89.
Alloway KD, Crist J, Mutic JJ, Roy SA. (1999): Corticostriatal projections from rat barrel cortex have an anisotropic Drganization that correlates with vibrissal whisking behavior. Journal of Neuroscience 19(24):10908-10922.
Anderson AW. (2005): Measurement of fiber orientation distributions using high angular resolution diffusion imaging. Magn Reson Med 54:1194-1206.
Assaf Y, Basser PJ. (2005): Composite hindered and restricted model of diffusion (CHARMED) MR imaging of the human brain. Neuroimage 27(1):48-58.
Assaf Y, Cohen Y. (2000): Assignment of the water slow-diffusing component in the central nervous system using q-space diffusion MRS: implications for fiber tract imaging. Magn Reson Med 43(2):191-9.
Barazany D, Basser PJ, Assaf Y. (2009): in vivo measurement of axon diameter distribution in the corpus callosum of rat brain. Brain 132(Pt 5):1210-20.
Basser PJ. (2002): Relationships between diffusion tensor and q-space MRI. Magn Reson Med 47(2):392-7.
Basser PJ, Mattiello J, LeBihan D. (1994a): Estimation of the effective self-diffusion tensor from the NMR spin echo. J Magn Reson B 103:247-254.
Basser PJ, Pierpaoli C. (1996): Microstructural and physiological features of tissues elucidated by quantitative-diffusion-tensor MRI. J Magn Reson B 111:209-219.

Beaulieu C. (2002): The basis of anisotropic water diffusion in the nervous system—a technical review. NMR Biomed. 15(7-8):435-455.
Brown LL, Smith DM, Goldbloom LM. (1998): Organizing principles of cortical integration in the rat neostriatum: corticostriate map of the body surface is an ordered lattice of curved laminae and radial points. J.Comp Neurol. 392(4):468-488.
Chen KC, Nicholson C. (2000): Changes in brain cell shape create residual extracellular space volume and explain tortuosity behavior during osmotic challenge. Proc Natl Acad Sci USA 97(15):8306-11.
Cowan RL, Wilson CJ. (1994): Spontaneous tiring patterns and axonal projections of single corticostriatal neurons in the rat medial agranular cortex. J.Neurophysiol. 71(1):17-32.
D'Arceuil I-I, de Crespigny A. (2007): The effects of brain tissue decomposition on diffusion tensor imaging and tractography. NeuroImage. 36(1):64-68.
D'Arceuil HE, Westmoreland S, de Crespigny AJ. (2007): An approach to high resolution diffusion tensor imaging in fixed primate brain. Neuroimage 35(2):553-65.
Dell'Acqua F, Rizzo G, Scifo P, Clarke RA, Scotti G, Fazio F. (2007): A model-based deconvolution approach to solve fiber crossing in diffusion-weighted MR imaging. IEEE Trans Biomed Eng 54:462-472.
Deschenes M, Veinante P, Zhang ZW. (1998): The organization of corticothalamic projections: reciprocity versus parity. Brain Res. Brain Res.Rev. 28(3):286-308.
Descoteaux M, Angelino E, Fitzgibbons S, Deriche R. (2007): Regularized, fast, and robust analytical Q-ball imaging. Magn Reson Med 58(3):497-510.
Zhou FM, Hablitz JJ. (1996): Morphological properties of intracellularly labeled layer I neurons in rat neocortex. J. Comp Neurol. 376(2)198-213.
Hess CP, Mukherjee P, Han ET, Xu D, Vigneron DB. (2006): Q-ball reconstruction of multimodal fiber orientations using the spherical harmonic basis. Magn Reson Med 56(1):104-17.
Jespersen SN, Bjarkam CR, Nyengaard JR, Chakravarty MM, Hansen B, Vosegaard T, Ostergaard L, Yablonskiy D, Nielsen NC, Vestergaard-Poulsen P. (2010): Neurite density imaging from magnetic resonance diffusion measurements at ultrahigh field: comparison with light microscopy and electron microscopy. Neuroimage 49(1):205-16.
Jespersen SN, Kroenke CD, Ostergaard L, Ackerman JJ, Yablonskiy DA. (2007): Modeling dendrite density from magnetic resonance diffusion measurements. Neuroimage 34(4):1473-86.
Jian B, Vemuri BC. (2007): A unified computational framework for deconvolution to reconstruct multiple fibers from diffusion weighted MRI. IEEE Trans Med Imaging 26(11):1464-71.
Kaden E, Knosche TR, Anwander A. (2007): Parametric spherical deconvolution: inferring anatomical connectivity using diffusion, MR imaging. Neuroimage 37(2):474-88.
Kalisman N, Silberberg G, Markram H. (2005): The neocortical microcircuit as a tabula rasa. Proc Nati Acad Sci U S A 102(3):880-5.
Krristt DA. (1978): Neuronal differentiation in somatosensory cortex of the rat. I. Relationship to synaptogenesis in the first postnatal week. Brain Res. 150(3):467-486.
Leergaard TB, White NS, de Crespigny A, Bolstad I, D'Arceuil H, Bjaalie JG, Dale AM. (2010): Quantitative histological validation of diffusion MRI fiber orientation distributions in the rat brain. PLoS One 5(1):e8595.
Maier Se, Mulkem RV. (2008): Biexponential analysis of diffusion-related signal decay in normal human cortical and deep gray matter. Magn Reson Imaging. 26(7):897-904. Epub 2008 May 7.
Mountcastle VB. (1997): The columnar organization of the neocortex. Brain 120:701-722.
Mulkem RV, Gudbjartsson H, Westin CF, Zengingonul HP, Gartner W, Guttmann CR, Robertson RL, Kyriakos W, Schwartz R, Holtzman D and others. (1999): Multi-component apparent diffusion coefficients in human brain. NMR Biomed. 12(1):51-62.
Mulkem RV, Haker SJ, Maier SE. (2009): On high b diffusion imaging in the human brain: ruminations and experimental insights. Magn Reson Imaging 27(8):1151-62.
Nicholson C, Sykova E. (1998): Extracellular space structure revealed by diffusion analysis. Trends Neurosci 21 (5):207-15.

(56) References Cited

OTHER PUBLICATIONS

Niendorf T, Dijkhuizen RM, Norris DG, van Lookeren Campagne M, Nicolay K. (1996): Biexponential diffusion attenuation in various states of brain tissue: implications for diffusion-weighted imaging. Magn Reson Med. 36 (6):847-57.
Oberheim NA, Tian GF, Han X, Peng W, Takano T, Ransom B, Nedergaard M. (2008): Loss of astrocytic domain organization in the epileptic brain. J Neurosci 28(13):3264-76.
Ozarslan E, Shepherd TM, Vemuri BC, Blackband SJ, Mareci TH. (2006): Resolution of complex tissue microarchitecture using the diffusion orientation transform (DOT). Neuroimage 31(3):1086-103.
Partadiredja G, Miller R, Oorschot DE. (2003): The number, size, and type of axons in rat subcortical white matter on left and right sides: a stereological, ultrastructural study. J Neurocytol 32(9):1165-79.
Ronen I, Kim KH, Garwood M, Ugurbil K, Kim DS. (2003): *Conventional DTI vs. slow and fast diffusion tensors in cat visual cortex*. Magn Reson Med 49(5):785-90.
Sadek AR, Magill PJ, Bolam JP. (2007): A single-cell analysis of intrinsic connectivity in the rat *globus pallidus*. Journal of Neuroscience 27(24):6352-6362.
Schwarz G. (1978): Estimating the Dimension of a Model. Ann. Statist 6(2):461-464.
Solenov E, Watanabe I-1, Manley GT, Verkman As (2004): Sevenfold-reduced osmotic water permeability in primary astrocyte cultures from AQP-4-deficient mice, measured by a fluorescence quenching method. Am J Physiol Cell Physiol 286(2):C426-32.
Sykova E, Nicholson C. (2008): Diffusion in brain extracellular space. Physiol. Rev. 88(4):1277-1340.
Szentagothai J. (1975): The 'module-concept' in cerebral cortex architecture. Brain Res. 95(2-3):475-496.
Tao A, Tao L, Nicholson C. (2005): Cell cavities increase tortuosity in brain extracellular space. J Theor Biol 234 (4):525-36.
Veinante P, Deschenes M. (2003): Single-cell study of motor cortex projections to the barrel field in rats. J.Comp Neurol. 464(1):98-103.
Wedeen VJ, Hagmann P, Tseng WY, Reese TG, Weisskoff RM. (2005): Mapping complex tissue architecture with diffusion spectrum magnetic resonance imaging. Magn Reson Med 54:1377-1386.
White NS, Dale AM. (2009): Optimal diffusion MRI acquisition for fiber orientation density estimation: An analytic approach. Human Brain Mapping:In press.
Wilhelmsson U, Bushong EA, Price DL, Smarr BL, Phung V, Terada M, Ellisman MH, Pekny M. (2006): Redefining the concept of reactive astrocytes as cells that remain within their unique domains upon reaction to injury. Proc Natl Acad Sci USA 103(46):17513-8.
Wu HS, Sugihara I, Shinoda Y. (1999): Projection patterns of single mossy fibers originating from the lateral reticular nucleus in the rat *cerebellar*cortex and nuclei. J.Comp Neurol. 411(1):97-118.
Yablonskiy DA, Sukstanskii AL. (2010): Theoretical models of the diffusion weighted MR signal. NMR Biomed 23 (7):661-81.
Fulton JF. 1938. The cerebral cortex: architecture, intracortical connections and motor projections. Physiology of the Nervous System. London: Oxford University Press p. 291-321.

\* cited by examiner

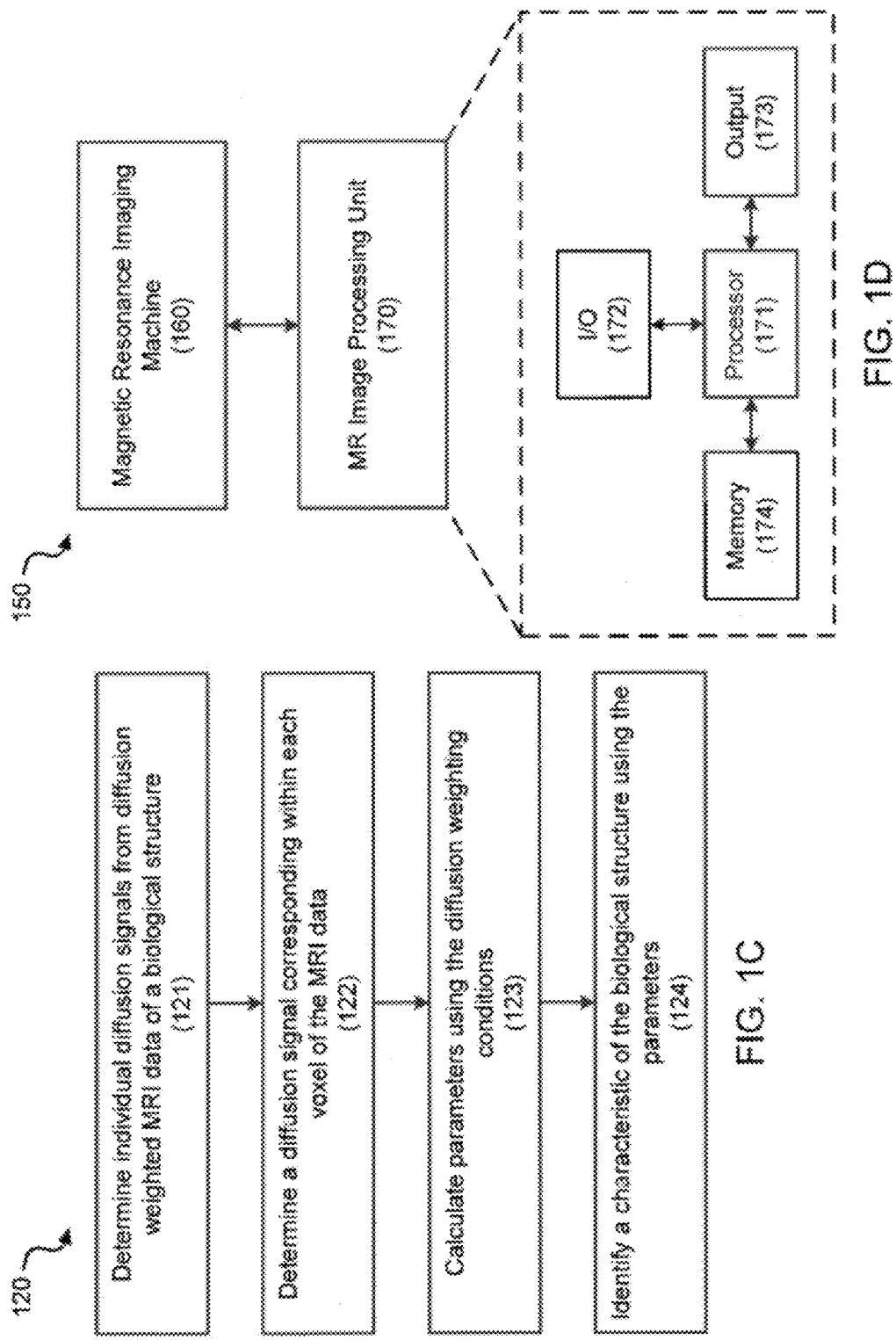

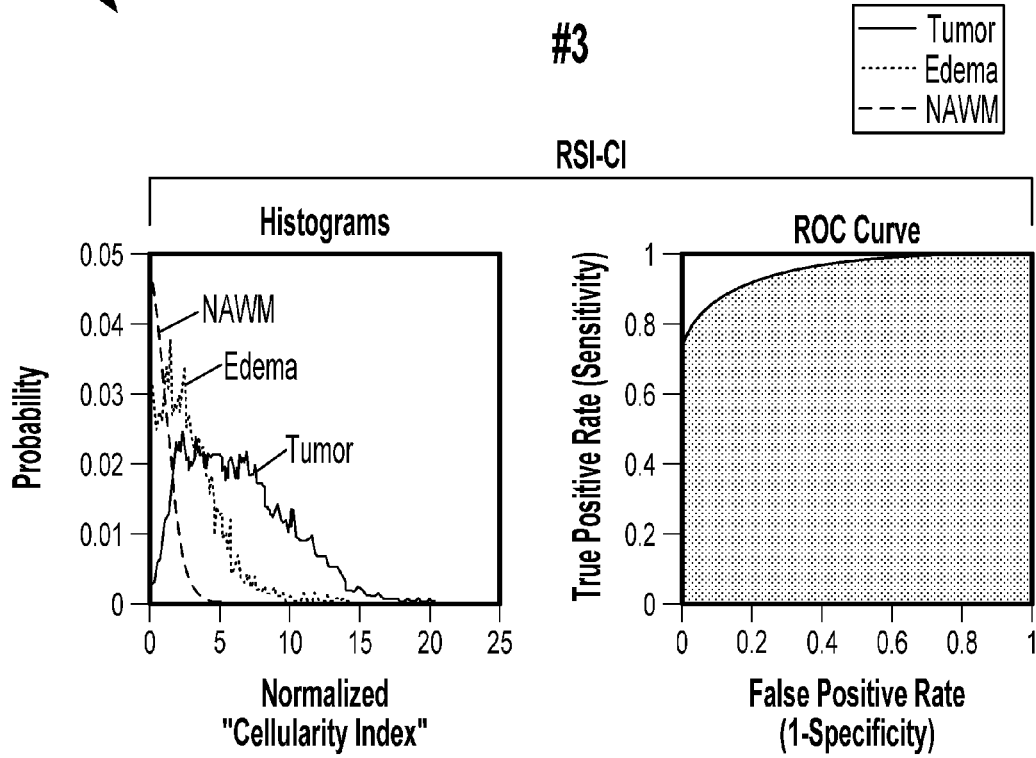
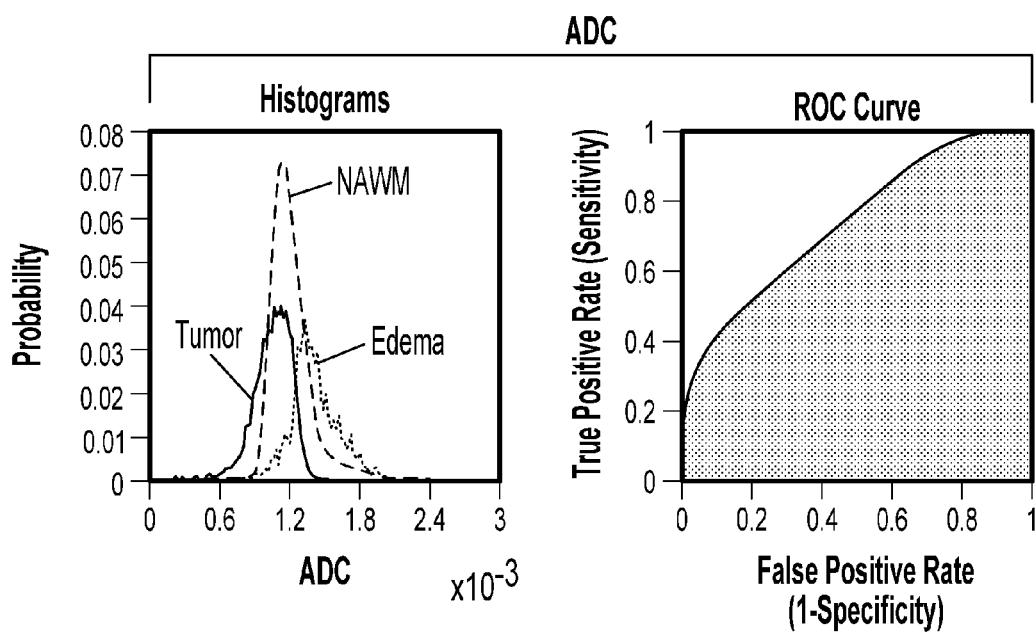
FIG. 19C

MEASURING BIOLOGICAL TISSUE PARAMETERS USING DIFFUSION MAGNETIC RESONANCE IMAGING

CROSS REFERENCE TO RELATED APPLICATIONS

This patent document claims the priority of U.S. provisional application No. 61/483,591 entitled "MEASURING BIOLOGICAL TISSUE PARAMETERS USING DIFFUSION MAGNETIC RESONANCE IMAGING" filed on May 6, 2011, which is incorporated by reference as part of this document.

STATEMENT REGARDING FEDERALLY SPONSORED RESEARCH OR DEVELOPMENT

This invention was made with government support under grant DA029475 awarded by the National Institutes of Health (NIH). The government has certain rights in the invention.

TECHNICAL FIELD

This patent document relates to magnetic resonance imaging.

BACKGROUND

Magnetic resonance imaging (MRI) is a medical imaging technique that applies a magnetic field and a pulse of radio frequency (RF) energy to produce images used for characterizing internal biological structures. MRI is based on the property of nuclear magnetic resonance (NMR). NMR is a physical property in which the nuclei of atoms absorb and re-emit electromagnetic energy at a specific resonance frequency in the presence of a magnetic field. The absorption and reemission of energy can be dependent on the strength of the magnetic field and the magnetic property of the atoms (e.g., atoms whose nuclei possesses magnetic spin).

MRI offers the ability to produce various types of contrast within an image, e.g., which can be referred to as 'weighting'. For example, water protons and other atomic nuclei have characteristic NMR properties based on their physical and chemical environments that can be used to create a contrast effect between different types of body tissue or between other properties. Various MRI weighting techniques can be employed to differentiate regions of interest within biological tissue based on these differences in these NMR properties.

For example, magnetic resonance imaging can be performed in the following way. For example, a strong static magnetic field can be generated through a region of a subject's body that aligns the average magnetic moment of protons (e.g., water protons within the tissues of the body) with the direction of the applied magnetic field. A dynamic electromagnetic field (e.g., an RF pulse), which includes the resonance frequency of the protons, can be generated such that the dynamic electromagnetic field is absorbed and flips the spin of the protons in the magnetic field. For example, between RF pulses or after the electromagnetic field is turned off, the proton spins return to their equilibrium state realigning the bulk magnetization with the magnetic field, thereby producing a measurable radio frequency signal. During this relaxation state, the proton spins return to their equilibrium at different rates, e.g., based on the different physical and chemical environments of the protons. Signal processing techniques can be implemented that determine various parameters (e.g., spin density, T1 and T2 relaxation times, and flow and spectral shifts) used to produce an MRI image. In addition, for example, MRI can include the generation of additional magnetic fields during the RF signal scan to obtain three dimensional information of a target tissue.

SUMMARY

Techniques, systems, and devices are disclosed for characterizing biological tissue using restriction spectrum imaging (RSI) based on diffusion MRI data.

In one aspect of the disclosed technology, a method of characterizing a biological structure includes determining individual diffusion signals from MRI data in a set of MRI images of a biological structure, the MRI data including diffusion weighting conditions that include at least one of diffusion gradient directions, diffusion gradient strengths, sensitivity factors (b-values), or diffusion times. The method also includes combining the individual diffusion signals to determine a processed diffusion signal corresponding to at least one location within one or more voxels of the MRI data. The method also includes calculating one or more parameters from the processed diffusion signal by using the diffusion weighting conditions. The method also includes using the one or more parameters to identify a characteristic of the biological structure, in which the one or more parameters include values over a range of one or more diffusion length scales based on at least one of diffusion distance or diffusion rate.

In another aspect, an MRI system includes a magnetic resonance imaging data acquisition system and a data processing unit. The magnetic resonance imaging data acquisition system is adapted to acquire magnetic resonance (MR) data from a biological structure of a subject, the MR data including one or more data voxels. The data processing unit is configured to receive the MR data from the magnetic resonance data imaging acquisition system. The data processing unit includes a mechanism that generates diffusion data of the biological structure from the MR data by determining a diffusion signal corresponding to at least one location within the one or more data voxels by combining a plurality of individual diffusion signals, each individual diffusion signal having an orientation and a volume fraction, in which the diffusion data includes one or more parameters. The data processing unit also includes a mechanism that uses the one or more parameters to identify a characteristic of the biological structure, in which the one or more parameters include values over a range of one or more diffusion length scales based on at least one of diffusion distance or diffusion rate, and in which the MR data includes at least one of diffusion gradient directions, diffusion gradient strengths, diffusion waveforms, diffusion sensitivity factors (b-values), or diffusion times.

In another aspect, a computer program product comprising a nonvolatile computer-readable storage medium having instructions stored thereon includes code for determining individual diffusion signals from MRI data in a set of MRI images of a biological structure, the MRI data including diffusion weighting conditions that include at least one of diffusion gradient directions, diffusion gradient strengths, sensitivity factors (b-values), or diffusion times, code for calculating one or more parameters of the MRI data by combining the individual diffusion signals to determine a processed diffusion signal corresponding to at least one location within one or more voxels of the MRI data, wherein the combining includes fitting estimate values into a linear mixture model of the processed diffusion signal for a plurality of conditions of the diffusion weighting conditions, and code for using the one or more parameters to identify a characteristic of the biological structure.

In another aspect, a method for estimating parameters of a linear mixture model of diffusion magnetic resonance imaging data includes receiving MR data from diffusion MRI signals of a biological structure, using model regularization of a solution vector to estimate model parameters from the MRI data by placing constraints on the form and the extent of the estimated model parameters, and using the estimated model parameters to identify a characteristic of the biological structure.

The subject matter described in this patent document can be implemented in specific ways that provide one or more of the following features. The disclosed RSI technology includes methods, systems, and devices that utilize a linear mixture model to relate diffusion MRI signals to biological tissue parameters. The disclosed RSI technology can also be implemented to optimize diffusion MRI acquisition for measuring such biomarkers. For example, the diffusion MRI signals may be collected with various combinations of diffusion gradient strengths, waveforms, diffusion times, diffusion sensitivity factors ("b-values"), and diffusion directions. Also, described are techniques to estimate the unknown parameters of the linear mixture model, e.g., using linear and or nonlinear estimation theory. For example, the disclosed RSI technology can harness multiple b-value MRI data to separate scale information at the hindered and restricted diffusion level. The disclosed RSI technology can use a distribution of non-exchanging cylinders to model the tissue microstructure and spherical harmonics to describe their orientation distribution. For example, implementations of the disclosed RSI technology can determine neurite volume fraction across various grey and white matter regions. For example, implementations of the disclosed RSI technology can characterize the intra- and extra-cylindrical diffusivities using a broad range (or spectrum) of values when fitting the data, rather than just an explicit fit. For example, this can preserve a linear implementation, e.g., simplifying estimation and decreasing computation time significantly. For example, the spectrum of independent scales and orientation distributions further allows the disclosed RSI technology to model the tissue microstructure with minimal a priori assumptions on the number of hindered and restricted water compartments, their respective geometries, and partial volume fractions. For example, the disclosed RSI technology can model the geometries of the hindered and restricted compartments independently, e.g., which can account for numerous additional structures in the extra-neurite compartment (e.g., cell bodies, glia, extracellular space, etc.) that can alter the tortuosity of the hindered compartment. For example, the described techniques can use an estimation procedure to remove unwanted contributions to the measured signal while preserving signals of interest (e.g., to estimate other model parameters more accurately) and combine various linear and nonlinear combinations of estimated model parameters and/or measurements to form non-invasive biomarkers of healthy and diseased tissue (e.g., cancer or neurodegenerative disease). For example, the disclosed technology may be used to characterize tumor growth, severity, cellularity probability of recurrence, treatment response, tumor classification (e.g., separation from healthy tissue) and the properties of healthy tissue in the presence of disease. Also for example, the disclosed technology may be used to identify areas of neurodegenerative disease, e.g., Alzheimer's disease, based on altered water diffusion properties, as well as predict various clinical outcomes, e.g., such as Alzheimer's conversion risk.

BRIEF DESCRIPTION OF THE DRAWINGS

FIGS. 1B and 1C show an exemplary process of the disclosed restriction spectrum imaging (RSI) technology for diffusion magnetic resonance imaging.

FIG. 1D shows an exemplary MRI-based system for implementing exemplary RSI techniques.

FIGS. 19A-19D show signal intensity histograms and receiver operating characteristic analysis of exemplary cancer patients.

Like reference symbols and designations in the various drawings indicate like elements.

DETAILED DESCRIPTION

Figure 1A:
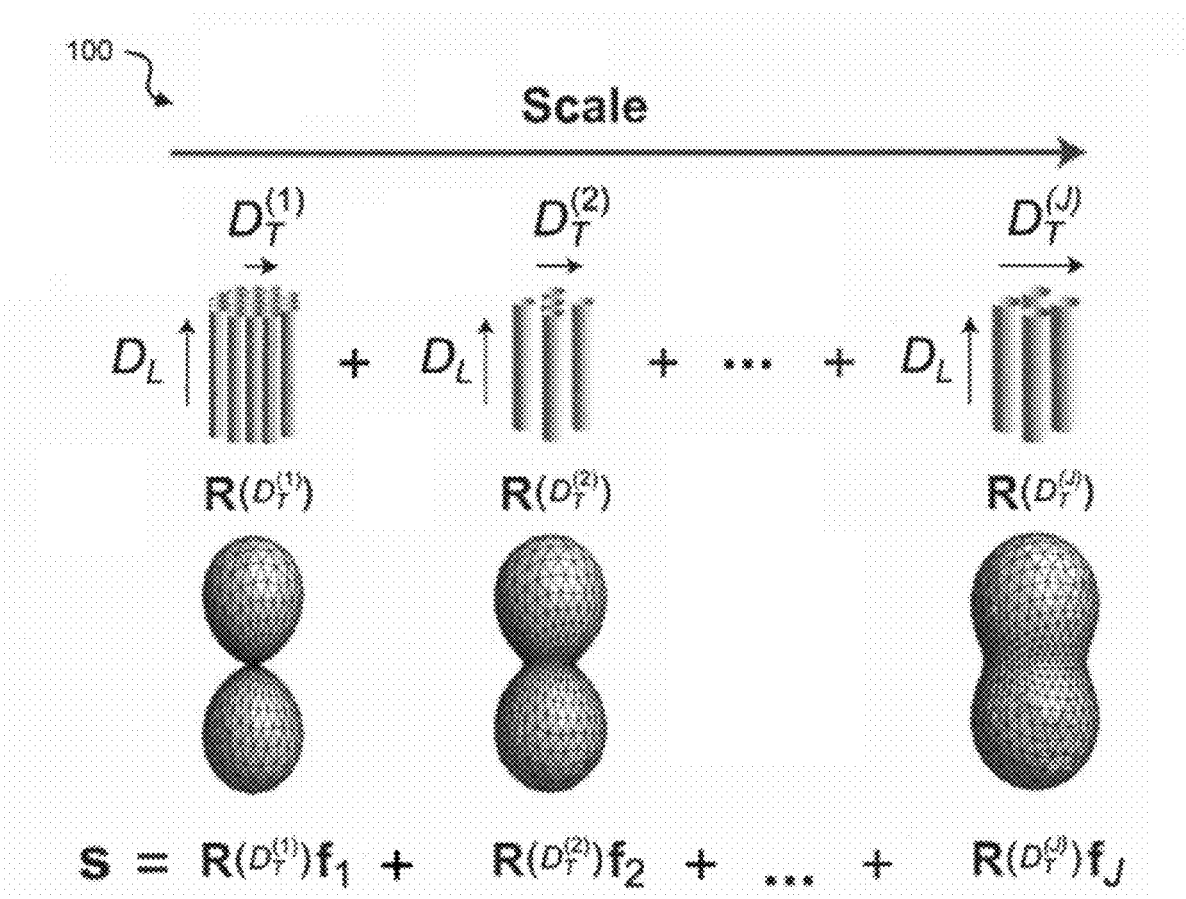
FIG. 1A shows an exemplary restriction spectrum model.

Diffusion magnetic resonance imaging (dMRI) is an MRI technique that includes a sensitive contrast mechanism for studying the microarchitecture and physiological properties of biological tissue in vivo and non-invasively. dMRI can map the diffusion process of molecules, e.g., mainly water, by characterizing the interactions of the molecules with the macromolecules, fibers, membranes, etc. of the biological tissue. For example, water does not diffuse equally in all directions in certain tissues and organs (e.g., including the brain), referred to as anisotropic diffusion. dMRI can include imaging techniques that control the anisotropic diffusion property as a probe to create images of the structure of spatial order in such biological tissues and organs.

For example, water in the brain diffuses preferentially along axonal fiber directions, and at normal brain temperatures, the diffusion coefficient of water in the CNS is about 1 $\mu m^2/ms$. During diffusion times of 20-80 ms, water molecules can probe length scales on the order of 5-20 $\mu m$. This can allow dMRI signals to be uniquely sensitive in the brain to a wide range of microstructural information at the cellular and sub-cellular level.

Q-space imaging (QSI) is a dMRI technique that can be used to identify the molecular diffusion probability density function without the need to assume a Gaussian distribution. QSI utilizes data collected over multiple q-values (e.g., defined as $q=\gamma\delta G/2\pi$, where $\gamma$ is the gyromagnetic ratio of the hydrogen nucleus, $\delta$ is the diffusion gradient duration, and G is the diffusion gradient magnitude) under the so-called narrow pulse-field regime (e.g., $\delta<<\Delta$, where $\Delta$ is the diffusion time, and $\delta$ is infinitesimally small) to probe length scale information on the basis of the statistical probability of water displacements along a single (1D) dimension. For example, QSI has been used in the identification and characterization of separable diffusion pools in nerve tissue samples, e.g., one hindered and one restricted by axonal membranes, with the length scale of the restricted pool offering information on the size of the compartment.

Tissue length scale information can also be probed on the basis of the apparent diffusion coefficient of water (ADC) using multi-exponential signal models for diffusion data collected with multiple b-values (e.g., $b\sim q^2\Delta$). Similar to QSI, these multi-exponential signal models assume a Gaussian mixture model for the displacement distribution with separable ADCs and show evidence for water compartmentation in biological tissue when measured over an extended b-value range. For example, at least two Gaussian diffusion pools (exponentials) are observed, e.g., one with a high ADC corresponding to "fast" diffusion at the coarse scale, and one with a small ADC corresponding to "slow" diffusion at the fine scale. However, for example, these fast and slow diffusion components have been attributed to hindered and restricted diffusion in the extracellular space (ECS) and intracellular (ICS) space, respectively, using paradoxically reversed estimates of their partial volume fractions.

For example, the use of multi-directional dMRI acquisitions at a fixed b-value (or q-value) can be used for studying the geometric organization of white matter tissue in vivo. Diffusion tensor imaging (DTI) is one technique of the multi-direction dMRI acquisition methods that uses a set of six or more images with non-collinear diffusion directions plus one or more images with no diffusion weighting (b=0) to estimate the three-dimensional (3D) apparent diffusion tensor at each voxel. For example, the eigensystem of the tensor is used to quantify both the degree of anisotropy and the principle direction the diffusion process. However, a known limitation of the tensor model to describe diffusion in nonhomogenous media has led to the development of high angular resolution diffusion imaging (HARDI) techniques to resolve complex (e.g., crossing or bending) fiber orientations within voxels. In contrast to DTI, HARDI methods require a large number of diffusion directions (e.g., >>6) to be collected at a fixed diffusion weighting, and include techniques such as spherical harmonic modeling of the ADC, Q-ball numerical approximation of the water diffusion orientation distribution (dODF), and spherical deconvolution (SD) reconstruction of the fiber orientation distribution (FOD). However, HARDI methods are generally limited to studying only the geometric aspect of the diffusion process, and are insensitive to length scale information (e.g. fast/slow hindered/restricted diffusion) due to the adherence of a single diffusion weighting factor with fixed diffusion time.

Diffusion spectrum imaging (DSI) is a non-parametric technique that generalizes the QSI method to a 3D Cartesian sampling of q-space to obtain the 3D water displacement probability density function or diffusion propagator at each voxel. However, DSI integrates the propagator (displacement spectra) in the radial direction to yield the dODF, which captures the orientation structure of the diffusion function at high angular resolutions at cost of removing all scale information inherent in the spectra. Moreover, DSI uses the classic q-space (Fourier) formalism to obtain the displacement spectra through Fourier Transform, but DSI does so without satisfying the narrow pulse-field requirement.

Techniques, systems, and devices are disclosed for characterizing biological tissue using restriction spectrum imaging (RSI) based on diffusion MRI data.

In one aspect, the disclosed RSI technology can provide length scale and orientation information to characterize biological tissue properties. For example, the disclosed RSI techniques can be used to separate the volume fraction and orientation structure of fine and coarse scale diffusion processes in the biological tissue. For example, acquired dMRI data including various combinations of parameters (e.g., diffusion gradient directions, waveforms, amplitudes, diffusion sensitivity factors ("b-values"), and/or diffusion times) can be used to provide information on non-invasive in vivo biomarkers, e.g., of healthy and diseased tissue. The disclosed RSI technology includes a linear mixture model that can express the relationship (e.g., mathematically) between the measured MRI signals and biological tissue parameters of interest. For example, the linear mixture model may include explanatory variables that express the relationship between the measured MRI signals and hindered and restricted diffusion in various exchanging and non-exchanging water compartments, e.g., such as cell bodies, axons, dendrites, and combined axons and dendrites (e.g., referred to as neurites) with various shapes, sizes, orientations and geometries. The disclosed linear mixture model may also include explanatory variables that parameterize these unknown quantities, e.g., such as using spherical harmonic functions to parameterize the unknown orientation distribution of axons and dendrites.

The disclosed technology includes an exemplary linear mixture model to optimize diffusion MRI acquisition for measuring such biomarkers. Disclosed are techniques that can use the linear mixture model to relate biological tissue parameters to dMRI signals. For example, dMRI signals may be collected with various combinations of diffusion gradient strengths, waveforms, diffusion times, diffusion sensitivity factors (e.g., "b-values"), and diffusion directions. For example, unknown parameters of the exemplary linear mixture model can be estimated using linear and or nonlinear estimation theory. For example, various linear and nonlinear combinations of estimated model parameters and/or measurements can be used to form non-invasive biomarkers of healthy and diseased tissue.

The disclosed technology describes exemplary techniques to probe both length scale and orientation information from multi-directional diffusion acquisitions with multiple diffusion weightings. For example, the disclosed techniques can be used to probe the orientation structure of tissue microstructures over a range (e.g., a spectrum) of length scales with minimal assumptions on the underlying microstructure and while preserving the linear model framework. For example, the disclosed linear analysis approach, referred to as restriction spectrum imaging (RSI), can use high b-value Cartesian q-space data to separate the volume fraction and orientation structure of fine and coarse scale diffusion processes in biological tissue (e.g., brain tissue), e.g., by analyzing restricted diffusion in the intra-neurite water compartment and hindered diffusion in the extra-neurite water compartment. Exemplary implementations using multidimensional Cartesian data (e.g., of DSI) on an exemplary fixed rat brain samples demonstrate how the disclosed RSI model can allow for separating fine and coarse scale diffusion processes. Additionally, for example, exemplary histological data from the same tissue samples provided further support of the efficacy of the exemplary results from implementing the disclosed RSI techniques. For example, the exemplary RSI estimates of the fine scale orientation distribution demonstrated the ability to capture additional structural information on the sample (e.g., neurite) that cannot be provided by existing DSI or spherical deconvolution (SD) techniques. For example, incorporating length scale information in the disclosed geometric models of diffusion can advance dMRI methods beyond white matter into gray matter structures while allowing more detailed characterization of tissue water compartmentalization in health and disease.

The basis of the disclosed RSI model is described herein. First, for example, an exemplary DSI Reconstruction is described. DSI is based on the Fourier relationship between the diffusion signal $S(q,\Delta)$ and the 3D propagator (displacement spectra) $P(R,\Delta)$:

$$S(q,\Delta) = \int P(R,\Delta) e^{-2\pi i q \cdot R} d^3 R \qquad [1]$$

where R is the net displacement of water molecules during the diffusion time $\Delta$, and q is the oriented q-space diffusion wave vector, in which $q=\gamma\delta G$. For example, to obtain $P(R,\Delta)$, the signal values were filled into 3D Cartesian coordinate space (e.g., placed on a 17×17×17 voxel grid) according to their respective position in q-space, and the inverse Fourier Transform was applied to the gridded data. Prior to the Fourier inversion, a 3D Hanning window (e.g., $h(r)=0.5 \cdot (1+\cos(2\pi r/17))$) was used to filter the data at high $|q|$, e.g., to reduce truncation artifacts (Gibbs ringing) in the reconstructed propagator. The dODF(x) in the direction of the unit vector x was obtained by evaluating the integral (e.g., by numerically integrating $P(R,\Delta)$ in the radial direction):

$$dODF(x) = \int_0^{Rmax} P(Rx,\Delta)|R|^2 dR. \qquad [2]$$

For example, the integral can be evaluated using a $3^{rd}$-order tessellation of the sphere (e.g., 642 vertices) to define each point x of dODF(x), and Sinc interpolation along 20 equally spaced points between 0 and $R_{max}$.

In existing spherical deconvolution (SD) techniques, the diffusion signal magnitude in each voxel s(q) is written as the convolution of the single fiber (impulse) response function R(q; x) with the fiber orientation distribution (FOD) f(x):

$$s(q) = s_0 \int R(q;x) f(x) d^3 x \qquad [3]$$

where $q=\gamma\delta G$ and is the q-space diffusion wave vector and x is the vector describing a point on the unit sphere, and $s_0$ is the signal measured with no diffusion weighting (e.g., $s_0=s$ (q=0)). To obtain the FOD, an axially-symmetric tensor (Gaussian) for the fiber response function R(q; x) can be applied:

$$R(q;x) = \exp(-b((D_L-D_T)|r \cdot x| + D_T)) \qquad [4]$$

where $b=|q|^2 (\Delta-\delta/3)$ in the diffusion weighting factor (or b-value), $r=q/|q|$ is a unit vector oriented along q, and where $D_L$ is the longitudinal diffusivity of the response function and $D_T$ is the transverse diffusivity of the response function, with $D_L > D_T$.

When these diffusivities are known a priori (or can be estimated from the data and held fixed), the convolution in Eq. [3] can be implemented as a linear system of equations. Given N q-space measurement directions $\{q_1, q_2, \ldots, q_N\}$ and M desired FOD reconstruction points on the sphere $\{x_1, x_2, \ldots, x_M\}$, Eq. [3] can be written:

$$\bar{s} = Rf, \qquad [5]$$

$$\begin{bmatrix} \bar{s}(q_1) \\ \vdots \\ \bar{s}(q_N) \end{bmatrix} = \begin{bmatrix} R(q_1;x_1) & \ldots & R(q_1;x_M) \\ \vdots & \ddots & \vdots \\ R(q_N;x_1) & \ldots & R(q_N;x_M) \end{bmatrix} \begin{bmatrix} f(x_1) \\ \vdots \\ f(x_M) \end{bmatrix}$$

where $\bar{s}=s/s_0$ denotes the normalized signal. However, rather than treating each of the M vertices of f(•) as unknown parameters, the FOD can be parameterized using a set of even order spherical harmonics (SH) $Y_l^m(\bullet)$ with order $l=0, 2, \ldots L$ and degree $m=-l, \ldots, 0, \ldots, l$, $$f(x) = \sum_{k=1}^{P} \beta_k Y_k(x) \qquad [6]$$

where $P=(L+2)(L+1)/2$ is the total number of spherical harmonics in the series, $\beta_k$ are the weights, and $$Y_k(x) = \begin{cases} \sqrt{2} \, \text{Re}\{Y_l^m(x)\}, & \text{if } -l \leq m < 0 \\ Y_l^0(x), & \text{if } m = 0 \\ \sqrt{2} \, \text{Im}\{Y_l^m(x)\}, & \text{if } 0 < m \leq l \end{cases} \qquad [7]$$

with index $k=k(l, m)=(l^2+l+2)/2+m$. This particular basis in Eq. [7] ensures the recovered FOD is both real and symmetric. Substituting Eqs. [6] and [7] into Eq. [5] yields the parameterized SD signal model:

$$\bar{s} = RY_L \beta, \qquad [8]$$

$$\begin{bmatrix} \bar{s}(q_1) \\ \vdots \\ \bar{s}(q_N) \end{bmatrix} = \begin{bmatrix} R(q_1;x_1) & \ldots & R(q_1;x_M) \\ \vdots & \ddots & \vdots \\ R(q_N;x_1) & \ldots & R(q_N;x_M) \end{bmatrix} \begin{bmatrix} Y_1(x_1) & \ldots & Y_P(x_1) \\ \vdots & \ddots & \vdots \\ Y_1(x_M) & \ldots & Y_P(x_M) \end{bmatrix} \begin{bmatrix} \beta_1 \\ \vdots \\ \beta_P \end{bmatrix}$$

where the subscript L is used to make the spherical harmonics expansion order of Y explicit.

Two main assumptions of the parameterized deconvolution model in Eq. [8] exist, which include (1) the orientation structure of the FOD lies within the subspace spanned by the spherical harmonic basis vectors in $Y_L$, which places an intrinsic upper limit to its angular resolution, and (2) the tissue architecture can be described by a linear mixture of (nonexchanging) cylindrical fiber elements with identical diffusion characteristics. In other words, for example, the diffusion length scale is presumed fixed for all fibers within the voxel.

The restriction spectrum imaging (RSI) model of the disclosed technology is described herein, which can do away with these assumptions. For example, the disclosed RSI techniques address the scale invariance by implementing an extension to the deconvolution model that allows for a mixture of cylindrically-symmetric Gaussians kernel functions with different $D_T$. For example, the disclosed RSI technique describes the equation of the diffusion signal magnitude (s=Rf) as:

$$s = R(D_T^{(1)})f_1 + R(D_T^{(2)})f_2 + R(D_T^{(J)})f_J \quad [9]$$

where $D_T^{(1)} < D_T^{(2)} < \ldots < D_T^{(J)} < D_L$ are the transverse diffusivities for each of the J total FODs (e.g., as shown in FIG. 1A). FIG. 1A shows a diagram 100 of an exemplary restriction spectrum imaging model where the oriented component of the diffusion signal is written a linear mixture (spectrum) of cylindrically symmetric Gaussian response functions (tensors) R with variable fixed transverse diffusivities $D_T$ and unknown volume fraction and orientation distribution f. This resultant distribution of FODs $f_{1:J}(f_1, f_2, \ldots f_J)$, referred to as the "FOD spectrum", describes the orientation structure of diffusion processes at differential length scales given by $D_T^{1:}$ $_H: D_T^{(1)}, D_T^{(2)}, \ldots, D_T^{(J)}$. For example, if the diffusivities are known a priori, the multi-scale model retains its efficient linear implementation, which can be written as:

$$s = A\beta', \quad [10]$$

$$= \begin{bmatrix} R(D_T^{(1)})Y_{L_1} & \ldots & R(D_T^{(J)})Y_{L_J} & e^{-bD_L} & e^{-bD_F} \end{bmatrix} \begin{bmatrix} \beta^{(1)} \\ \vdots \\ \beta^{(J)} \\ \beta_L \\ \beta_F \end{bmatrix}.$$

where A is now a large $$N \times \left( \sum_{i=1}^{J} P_i \right) + 2$$

matrix, and where $P_i = (L_i+2)(L_i+1)/2$ is the total number of SH for the $i^{th}$ FOD. For example, the two exemplary terms $e^{-bD_L}$ and $e^{-bD_F}$ are included to model the partial volume fraction of isotropic diffusion in both brain and non-brain voxels, e.g., in which $D_F \gg D_L$, where $D_L$ is the longitudinal diffusivity and $D_F$ is the "free" water diffusivity. In some examples, $D_L$ can be estimated from the white matter of the exemplary tissue sample, and $D_F$ can be estimated from the intraventricular space of the exemplary tissue sample. For example, the disclosed RSI model in Eq. [10] requires multiple b-values and diffusion directions to separate scale and geometric information.

An exemplary estimation technique is described that can be implemented to fit the exemplary multi-scale linear model of the RSI technique in Eq. [10]. For example, an estimate of $D_L$ was first derived by fitting a tensor model to the diffusion data in a small region of the corpus callosum, e.g., known to have a high density of uniformly orientated white matter fibers. In this region, the exemplary $D_L$ value was estimated to be 0.34 µm²/ms. This exemplary $D_L$ value was also used to estimate the compartment size diameter for restricted diffusion using Monte Carlo simulations, described later. Next, for example, an estimate of $D_F$ was derived by fitting the same tensor model to voxels including the intraventricular space of the exemplary tissue sample. In this region, the exemplary $D_F$ value was estimated to be 2.0 µm²/ms. Finally, with the values of $D_L$ and $D_F$ fixed, $D_T$ was let to take on J=12 linearly spaced values between 0 and 0.9 $D_L$, and used a $4^{th}$ order (L=4) SH expansion for each FOD and a $3^{rd}$ order tessellation of the sphere to define the M=642 FOD reconstruction points $\{x_1, x_2, \ldots, x_M\}$. For example, given the large number of unknown parameters for this particular parameterization (e.g., 182 total), a regularized solution for β' to prevent over-fitting was written:

$$\hat{\beta}' = A^\dagger s$$

$$A^\dagger = (A^T A + \alpha I)^{-1} A^T. \quad [11]$$

where α is the Tikhonov regularization factor. For example, the α was selected to optimize the regularization level, which minimized the Bayesian Information Criterion (BIC) over a large region of the exemplary tissue specimen, e.g., which included both gray and white matter. The BIC can be defined as $n \ln(\hat{\sigma}_e^2) + k \ln(n)$, where n is the number of measurements, $\hat{\sigma}_e^2$ is the error variance, and k=trace($A^\dagger A$) is the effective number of model parameters. For example, minimizing the BIC can balance the tradeoff between goodness-of-fit on the one hand, e.g., by penalizing models with large residual error (e.g., the $n \ln(\hat{\sigma}_e^2)$ term), and reducing model complexity on the other hand, e.g., by penalizing models with a large number of free parameters (e.g., the $k \ln(n)$ term). For example, at the optimum regularization level (minimum BIC), the effective number of model parameters was reduced to approximately k≈20.

An exemplary simulation of the compartment size diameter is described that can be implemented with the techniques of the disclosed restriction spectrum imaging technology. For example, the compartment size diameter for restricted diffusion was estimated using Monte Carlo simulations consisting of a population of "spins" undergoing random-walk diffusion within a single impermeable cylinder with known diameter. For example, the exact diameter (d) varied for each simulation experimental implementation and ranged between 0.1 and 100 µm. Exemplary spins were initially randomly distributed within the cylinder and allowed to diffuse with an intrinsic diffusion coefficient of $D_L$. Exemplary spins that encountered a boundary were reflected off the cylinder wall while preserving their unreflected diffusion path length. For example, the accumulated spin phase was used to generate synthetic diffusion signals for our Cartesian q-space acquisition parameters G, Δ, and δ. For example, for each cylinder diameter (simulation experiment), the logarithm of the signal measured perpendicular to the long axis of the cylinder was plotted as a function of b-value to obtain an estimate of $D_T$. This yielded a plot of $D_T$ versus d (diameter) after compiling across all simulation experiments. This exemplary curve was then interpolated into for each $D_T$ of the disclosed RSI model to yield the theoretical cylinder diameter for restricted diffusion at each scale.

Figure 1B:
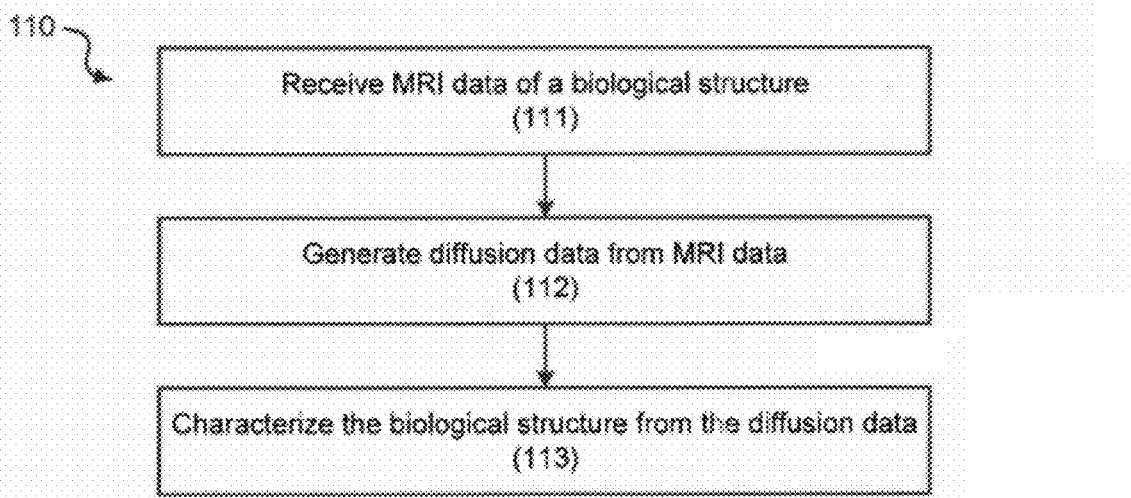

FIG. 1B shows a process 110 for diffusion magnetic resonance imaging implementing the disclosed RSI technique. The process 110 can include a process 111 to receive MRI data from a plurality of MRI images of a biological structure (e.g., biological tissue). For example, MRI data can be obtained from a set of multiple MRI images acquired from a variety of MRI techniques, e.g., including, but not limited to, diffusion tensor (DT) and diffusion weighted imaging (DWI) MRI scans, diffusion spectrum imaging (DSI) MRI scans, T1-weighted MRI scans, T2-weighted MRI scans, T2*-weighted MRI scans, spin (proton ($^1$H)) density weighted MRI scans, T1ρ MRI scans, magnetization transfer (MT) MRI scans, real-time MRI, functional MRI (fMRI) and related techniques such as arterial spin labeling (ASL), among other MRI techniques. For example, the MRI data received by implementing the exemplary process 111 can include, but is not limited to, diffusion gradient directions, diffusion gradient strengths, diffusion waveforms, diffusion sensitivity factors (b-values), or diffusion times. For example, the receiving can include receiving the MRI data as input into an MRI system and/or processing unit. For example, the biological structure that can include cell bodies, axons, dendrites, cell processes, intracellular, and extracellular space, among other biological structures. In other examples of process 111, the MRI images can be from a non-biological structure, e.g., including non-medical NMR uses such as various applications in chemistry, materials, pharmaceuticals, food sciences, etc.

The process 110 can include a process 112 to generate diffusion data from the MR data, e.g., which can be generated at each voxel. For example, the process 112 can be implemented to generate the diffusion data by determining a diffusion signal corresponding to at least one location within one or more voxels of the MRI data. For example, the diffusion signal at a particular location within an exemplary voxel can be determined by combining a plurality of individual diffusion signals, e.g., each individual diffusion signal having an orientation and volume fraction (e.g., as described previously in the exemplary RSI technique of Eq. [10]). For example, the generated diffusion data can include one or more parameters, e.g., which can include volume fraction, fiber orientation distribution (FOD), geometric tortuosity, compartment geometry, and compartment diameter, among other parameters. For example, the parameters of the diffusion data can represent values that are scaled over a range of diffusion length scales, e.g., in which the diffusion length scales can be based on diffusion distance or diffusion rate. For example, the process 112 can be implemented using a linear mixture model. For example, the fiber orientation distribution can be determined using spherical harmonic functions or Bessel functions, among other techniques.

The process 110 can include a process 113 to use the parameters of the generated diffusion data to characterize the biological structure. For example, the process 113 can include producing a model of the biological structure's microstructure or architecture, e.g., which can be based on the fiber orientation distribution or other parameters of the diffusion data. For example, the biological structure can be characterized using a model that includes intra-cylindrical and extra-cylindrical diffusivity values of fibers within the biological structure. For example, the characterization can include categorizing the biological structure as healthy or diseased structure, determining the shape or geometry of the biological structure, determining the size of the biological structure, and determining the orientation of the biological structure.

FIG. 1C shows an exemplary process 120 to characterize a biological structure from diffusion MRI data. For example, the process 120 can be implemented as part of or in addition to the process 112 to generate one or more parameters of the diffusion data from the MR data at each voxel. The process 120 can include a process 121 to determine individual diffusion signals from MRI data in a set of MRI images of a biological structure. For example, the MRI data can include diffusion weighting conditions that include at least one of diffusion gradient directions, diffusion gradient strengths, sensitivity factors (b-values), or diffusion times. The process 120 can include a process 122 to determine a processed diffusion signal corresponding to at least one location within one or more voxels of the MRI data. For example, the processed diffusion signal can be determined by combining the individual diffusion signals from the process 121. The process 120 can include a process 123 to calculate one or more parameters from the processed diffusion signal by using the diffusion weighting conditions. The process 120 can include a process 124 to use the one or more parameters to identify a characteristic of the biological structure. For example, the exemplary one or more parameters can include values over a range of one or more diffusion length scales based on at least one of diffusion distance or diffusion rate. For example, the one or more parameters can include volume fraction, fiber orientation distribution (FOD), geometric tortuosity, compartment geometry, and compartment diameter, among other parameters.

FIG. 1D shows an exemplary MRI-based system 150 for implementing the disclosed RSI techniques, e.g., determining non-invasive, in vivo biomarker data of healthy and diseased tissue using the described linear mixture model to express the relationship between the acquired MRI signals and biological tissue parameters of interest. FIG. 1D shows one aspect of the exemplary system 150 that can include a magnetic resonance imaging machine 160, which can be controlled by an MR image processing unit 170.

The exemplary MRI machine 160 can be used in the system 150 to implement an MRI-based RSI characterization process under the control of the exemplary MR image processing unit 170. The MRI machine 160 can include various types of MRI systems, which can perform at least one of a multitude of MRI scans that can include, but are not limited to, T1-weighted MRI scans, T2-weighted MRI scans, T2*-weighted MRI scans, spin (proton ($^1$H)) density weighted MRI scans, diffusion tensor (DT) and diffusion weighted imaging (DWI) MRI scans, diffusion spectrum imaging (DSI) MRI scans, T1ρ MRI scans, magnetization transfer (MT) MRI scans, real-time MRI, functional MRI (fMRI) and related techniques such as arterial spin labeling (ASL), among other MRI techniques. For example, the exemplary MR image processing unit 170 can be used to implement the process 110 and other processes of the disclosed RSI technology.

The exemplary MR image processing unit 170 can include a processor 171 that can be in communication with an input/output (I/O) unit 172, an output unit 173, and a memory unit 174. MR image processing unit 170 can be implemented as one of various data processing systems, such as a personal computer (PC), laptop, tablet, and mobile communication device. To support various functions of MR image processing unit 170, the exemplary processor 171 can be included to interface with and control operations of other components of MR image processing unit 170, such as the exemplary I/O unit 172, the exemplary output unit 173, and the exemplary memory unit 174.

To support various functions of the MR image processing unit 170, the memory unit 174 can store other information and data, such as instructions, software, values, images, and other data processed or referenced by the processor 171. Various types of Random Access Memory (RAM) devices, Read Only Memory (ROM) devices, Flash Memory devices, and other suitable storage media can be used to implement storage functions of the memory unit 174. The exemplary memory unit 174 can store MRI data and information, which can include subject MRI image data including spatial and spectral data, MRI machine system parameters, data processing parameters, and processed parameters and data that can be used in the implementation of an RSI characterization. The memory unit 174 can store data and information that can be used to implement an MRI-based RSI process and that can be generated from an MRI-based RSI characterization algorithm and model.

To support various functions of the MR image processing unit 170, the exemplary I/O unit 172 can be connected to an external interface, source of data storage, or display device. Various types of wired or wireless interfaces compatible with typical data communication standards, such as Universal Serial Bus (USB), IEEE 1394 (FireWire), Bluetooth, IEEE 802.111, Wireless Local Area Network (WLAN), Wireless Personal Area Network (WPAN), Wireless Wide Area Network (WWAN), WiMAX, IEEE 802.16 (Worldwide Interoperability for Microwave Access (WiMAX)), and parallel interfaces, can be used to implement the I/O unit 172. The I/O unit 172 can interface with an external interface, source of data storage, or display device to retrieve and transfer data and information that can be processed by the processor 171, stored in the memory unit 174, or exhibited on the output unit 173.

To support various functions of the MR image processing unit 170, the output unit 173 can be used to exhibit data implemented by the exemplary MR image processing unit 170. The output unit 173 can include various types of display, speaker, or printing interfaces to implement the exemplary output unit 173. For example, the output unit 173 can include cathode ray tube (CRT), light emitting diode (LED), or liquid crystal display (LCD) monitor or screen as a visual display to implement the output unit 173. In other examples, the output unit 173 can include toner, liquid inkjet, solid ink, dye sublimation, inkless (such as thermal or UV) printing apparatuses to implement the output unit 173; the output unit 173 can include various types of audio signal transducer apparatuses to implement the output unit 173. The output unit 173 can exhibit data and information, such as patient diagnostic data, MRI machine system information, partially processed MRI-based RSI processing information, and completely processed MRI-based RSI processing information. The output unit 173 can store data and information used to implement an exemplary MRI-based RSI characterization process and from an implemented MRI-based RSI characterization process.

Exemplary implementations were performed to demonstrate the disclosed technology. Exemplary diffusion data, histological materials, and procedures used in the exemplary implementations are described herein. For example, an adult Sprague Dawley® Rat (Charles River Laboratories International, Inc. Wilmington, Mass.) was deeply anesthetized (e.g., ketamine hydrochloride 50 mg/kg, and sodium pentobarbital 12 mg/kg, i.p.) and transcardially perfused with 4% paraformaldehyde. The brain of the exemplary rat was extracted and immersed in contrast enhancing Magnevist® solution (Bayer HealthCare Pharmaceuticals, Inc.) for approximately two weeks. For example, for image acquisition, the brain was immobilized in a molded plastic holder and placed in a sealable custom-build plastic chamber filled with perfluorocarbon liquid (Fomblin® LC/8, Solvay Solexis, Thorofare, N.J., USA), e.g., to avoid magnetic susceptibility image artifacts within the brain. High resolution diffusion images were collected, e.g., using a 4.7 T Bruker BioSpec Avance scanner (Bruker Instruments, Freemont, Calif., USA) featuring a 40 cm warm bore diameter and equipped with a 3 cm solenoid receiver coil. Exemplary data were acquired using a single-shot pulsed gradient spin echo (PGSE) echo planar imaging sequence with Cartesian q-space sampling with the following pulse sequence parameters, for example: TR/TE=650/49 ms, $\Delta/\delta$=23/12 ms, 515 q-space directions, $|G|_{max}$=380 mTm$^{-1}$, $b_{max}$=30452 sec/mm$^2$, matrix=64×64×128, voxel size=265 µm isotropic, total imaging time ~12 hours. For example, following tomographic imaging, the brain was sectioned coronally (e.g., at 50 µm) using a freezing microtome (Microm HM450, Microm Gmbh, Waldorf, Germany). For example, every fourth section was stained for myelin. Supplementary histological material was derived from another exemplary Sprague Dawley rat (Scanbur, Norway), which was sacrificed in the exemplary manner as described above. This brain was sectioned sagitally (e.g., at 50 µm), and selected sections were stained for myelin. Exemplary high-resolution mosaic images of the histological sections were obtained through UPlanApo 20/0.70 and 40/0.85 dry objectives, e.g., using a motorized Olympus BX52 microscope running the Neurolucida 7.0 software (Virtual Slice module, MBF Bioscience, Inc, Williston, Vt., USA) or a slide scanner (Mirax Scan, Carl Zeiss MicroImaging GmbH, Jena, Germany). Exemplary histological reference images were obtained, e.g., showing 40 µm thick coronal sections from an adult Sprague Dawley rat stained for potassium channel interacting protein (KChIP1) using the K55/7 monoclonal antibody (NeuorMab), and images showing the distribution of axonal plexuses anterogradely labeled with Phaseolus vulgaris leucoagglutinin.

Exemplary implementations of the disclosed RSI techniques were used to probe the orientation structure of the exemplary tissue sample at multiple length scales in a manner that reflects the underlying biology.

Figure 2:
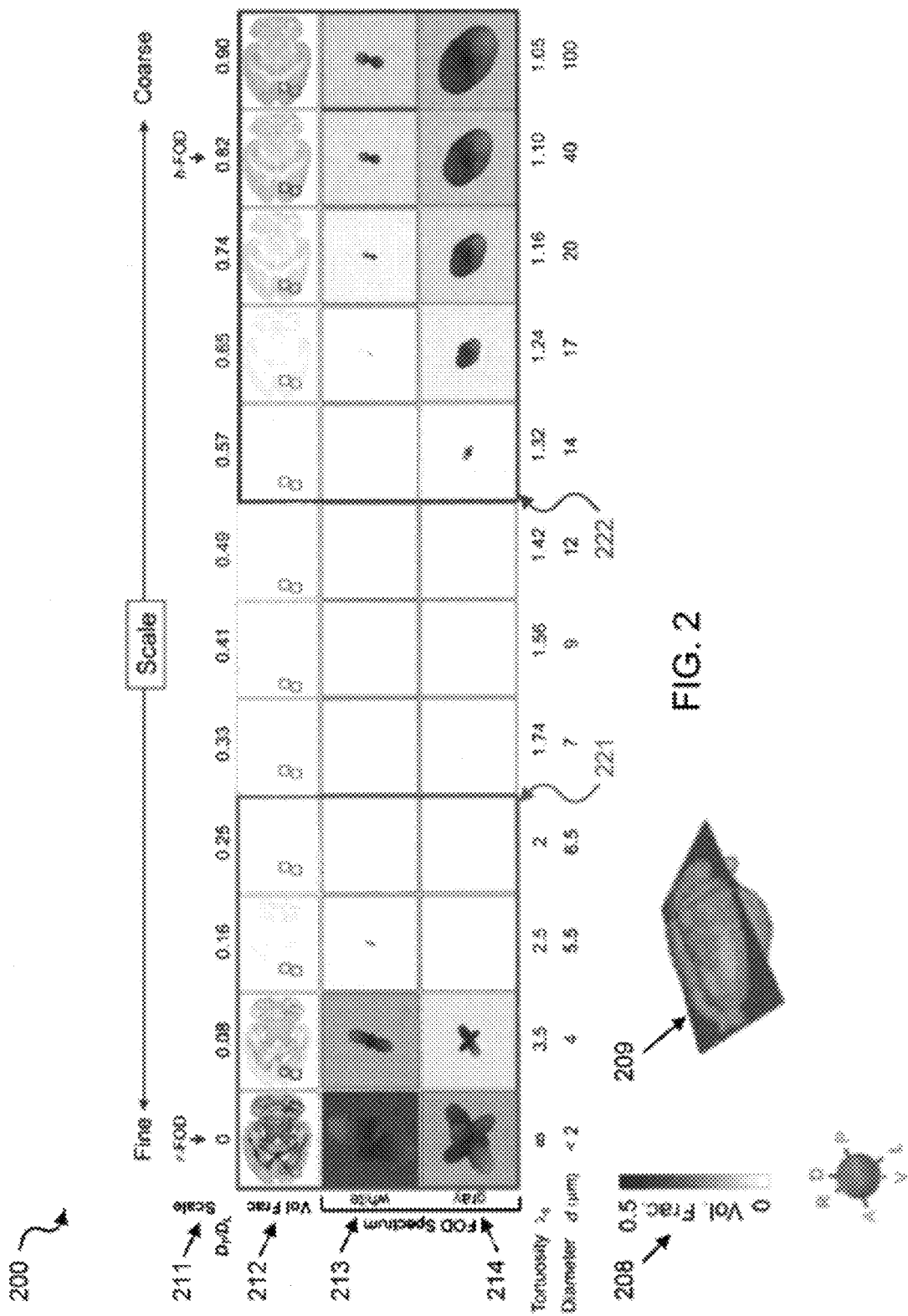
FIG. 2 shows a diagram of an exemplary RSI analysis of a brain slice at the level of the dorsal striatum, hippocampus, and tectum.

FIG. 2 shows a diagram 200 demonstrating the results of an exemplary RSI analysis for a single horizontal slice taken at the level of the dorsal striatum, hippocampus, and tectum. The diagram 200 includes a diffusion length scale 211, which is shown increasing from left to right. The diagram 200 includes volume fraction maps 212 (e.g., shown in the top row of the diagram 200), which are derived from $0^{th}$-ordered spherical harmonics (SH) coefficients normalized to sum to one (e.g., negative weights set to zero). These exemplary maps provide an estimate of the fractional contribution of diffusion at each scale to the total signal, e.g., with dark voxels indicating large contributions (e.g., volume fractions), and light voxels indicating little or no contribution. For example, the diagram 200 includes the apparent bimodal separation of fine scale diffusion process 221 (left side of the diagram 200, highlighted in the red frame) and coarse scale diffusion process 221 (right side of the diagram 200, highlighted in the blue frame), e.g., which is consistent with in vivo biexponential models of "slow" and "fast" diffusion, respectively. The diagram 200 includes fiber orientation distribution (FOD) spectrums 213 and 214 for two representative voxels in white matter (FOD spectrum 213) and gray matter (FOD spectrum 214). As shown in the diagram 200, the differences in orientation structure at the fine and coarse scale are demonstrated, particularly in gray matter FOD spectrum 214. For example, the exemplary FOD spectrums are displayed by subtracting the minimum (e.g., which highlights the oriented component of the FOD) and scaling their amplitudes by their relative volume fraction. Exemplary values for the geometric tortuosity ($\lambda_g$) and compartment diameter (d) are plotted under each scale of the diagram 200. The exemplary $\lambda_g$ values were computed directly from the exemplary RSI model scale. The exemplary d values were estimated using exemplary Monte Carlo simulations. The exemplary $\lambda_g$ and d values demonstrate that the exemplary fine and coarse scale diffusion processes 221 and 222 stem from restricted and hindered diffusion in the intra-neurite and extra-neurite water compartments, respectively. For example, comparison of the restricted fiber orientation distribution (r-FOD) and hindered fiber orientation distribution (h-FOD) against histology at the two scales are described later in this patent document. The diagram 200 includes a legend 208 representing the voxel strength of the volume fraction maps 212 and the orientation of the MRI parameters. The diagram 200 includes a graphic representing a single horizontal slice 209 of the exemplary rat brain from which the MRI data was acquired.

The results of the exemplary implementation shown in the diagram 200 demonstrate that the disclosed RSI technique can be used to probe the orientation structure of tissue samples at multiple length scales in a manner that reflects the underlying biology. These exemplary results show that the majority of the diffusion signal in the exemplary fixed tissue sample occurs at the fine scale 221 and coarse scale 222, with little or no signal at intermediate scales. For example, the fine scale diffusion processes 221 were characterized by transverse diffusivities that are significantly smaller than the longitudinal diffusivity ($D_T/D_L < 0.1$), whereas the coarse scale diffusion processes 222 were characterized by transverse diffusivities that are approximately ~60-90% of the longitudinal diffusivity ($0.6 < D_T/D_L < 0.9$). This exemplary biomodal separation is consistent with in vivo biexponential signal models of "slow" and "fast" diffusion, respectively. Yet, unlike the biexponential models, the disclosed RSI analysis allows for additional quantification of the orientation structure at each scale through analysis of the FOD spectrum. For example, when comparing the FOD spectrum across voxels, the orientation structure can be quite dissimilar at the fine and coarse scale, e.g., particularly in gray matter voxels (as shown in the exemplary representative FOD spectrum 214), and somewhat in white matter voxels (as shown in the exemplary representative FOD spectrum 213). However, for example, in all voxels the orientation structure at neighboring scales appear similar to one another. This can suggest local blurring of the model parameters across scales (volume fractions and FODs). Later in this patent document, the degree of blurring is quantified, e.g., using the model resolution matrix. For example, this exemplary blurring quantification shows that the optimally regularized RSI model can allow for resolving in the exemplary fixed tissue sample, e.g., approximately three length scales at the fine, intermediate, and coarse scale level. For example, each of the 12 scales in FIG. 2 may not be considered independent, and the lack of diffusion at the intermediate scale is a property of the data and not the model. It can be noted that the intrinsic "scale resolution" of the disclosed RSI model can be due to the acquisition protocol and not the model itself or Tikhonov regularization level. For example, the Tikhonov regularization level can control the smoothness of the individual FODs of the spectrum.

In biological tissue, the modes of diffusion can include hindered diffusion and restricted diffusion. Hindered diffusion relates to the increase in diffusion path length molecules must travel when diffusing around cellular obstructions, and is described in terms of the "tortuosity", e.g., as $\lambda = \sqrt{D/ADC}$, which relates the apparent diffusion coefficient of water (ADC) to the diffusion coefficient measured in the absence of any obstacles D. Restricted diffusion, on the other hand, relates to the physical blockage of molecules trapped within cellular compartments. If the diffusion time Δ is long enough, the length scale of diffusion can vary dramatically depending on whether diffusion is hindered or restricted.

For example, to provide insight into the physical nature of the length scales probed in the disclosed RSI model, the geometric tortuosity $\lambda_g = \sqrt{D_L/D_T}$ (e.g., assuming hindered diffusion) and the compartment size diameter (e.g., assuming restricted diffusion, and estimated using Monte-Carlo simulations) were computed and plotted, as shown in the bottom rows of the diagram 200 in FIG. 2. For example, based on these exemplary tortuosity and compartment size calculations, and together with the nature of the FOD spectrum (e.g., FOD spectrums 213 and 214), the exemplary fine scale diffusion processes 221 probed by the disclosed RSI model were shown to be restricted and not hindered, and the physical compartment of restriction was shown to be consistent with neurites (axons and dendrites), and possibly even long slender glial cell processes. Also, for example, the exemplary coarse scale diffusion processes 222 were shown to reflect water hindered within the extra-neurite compartment, e.g., including large cell bodies, extracellular space, and glia. Exemplary theoretical and experimental support for these exemplary neurite-specific implementation results is provided. For example, the rationale for the neurite results and their suggestions is explained by using theoretical and empirical evidence, together with the described calculations for the geometric tortuosity and compartment size diameters. For example, further empirical support for this exemplary suggestion is provided in the exemplary q-space data, e.g., by comparing the exemplary restricted FOD (r-FOD) and hindered FOD (h-FOD) at two representative length scales (e.g., $D_T/D_L = 0$ and $D_T/D_L = 0.82$, respectively, identified in the diagram 200) against histological material from corresponding anatomical regions.

The main source of water restriction in biological tissues includes cell membranes, and the vast majority of oriented cylindrical compartments in biological tissue relate to neuronal extensions, or neurites. For example, in the rat brain, the diameter of unmyelinated and myelinated subcortical axons range between 0.02 and 3.0 μm, with a mean of 0.2-0.6 μm, which is consistent with the exemplary results of the compartment diameter (d) calculations at the fine scale (as shown in the values for d on the bottom of the diagram 200 of FIG. 2, left). For example, if it was assumed that the fine scale diffusion is hindered and not restricted by neurites, the geometric tortuosity at this scale would have to be less than 2. This is not the case, as represented by the exemplary $\lambda_g$ values greater than 2 in the diagram 200 of FIG. 2, left, for fine scale diffusion). For example, tortuosities greater than 2 can only be achieved under extreme pathophysiological states, e.g., such as severe brain ischemia. For example, the maximum geometric tortuosity introduced by various packed cellular objects in the brain ECS has been estimated to be no greater than 1.225, for which the only geometric tortuosities in this range fall within the coarse length scales probed by the exemplary RSI model. Even in an ideal simulated environment consisting of a bundle of cylindrical fibers organized in the most compact way, the transverse ADC ($D_T$) cannot mathematically exceed $(2/\pi)^2$ or 0.4 times the longitudinal ADC ($D_L$), which corresponds to a geometric tortuosity maximum $\lambda_g = \pi/2 = 1.57$. Thus, all water contributing to the fine scales of the disclosed RSI model are restricted and not hindered. For example, since neurites fit well with the predicted geometry of the restricting compartment (e.g., cylinders with diameters <3-4 μm), as opposed to large spherical cell bodies, the source of restriction primarily stems primarily from neurites (and, for example, with a possible small contribution from elongated cylindrical glial processes). In addition, for example, all hindered water (e.g., with tortuosities less than the mathematical maximum of 1.57) contributes to the coarse length scales, as demonstrated by the disclosed RSI model. The source of this hindered water can be considered more uncertain, which may include the ECS and also other compartments of the extra-neurite space, e.g., such as cell bodies and glia. For example, the short diffusion time (e.g., Δ=23 ms) applied in the exemplary implementation, together with the fact that the tissue was fixed (e.g., with paraformaldehyde, which decreases the ADC), can place the exemplary result in a regime that limits the ability to probe any restricted compartment (e.g., spherical or cylindrical) greater than about $\sqrt{2D_L\Delta}{\approx}4$ µm. For example, this can mean that any water restricted within compartments greater than 4 µm may be indistinguishable from hindered water. Thus, water trapped within many cell bodies (e.g., with diameters on the order of 5-15 µm), which may otherwise appear restricted at long diffusion times, may appear hindered in the disclosed q-space implementations. Also, for example, while some elongated glial processes may contribute to the restricted volume fraction, the majority of intra-glial water may also contribute to the hindered fraction for the following reasons. First, for example, the water permeability of glia cell membranes are orders of magnitude greater than that of neurons, e.g., raising the likelihood of increased exchange with the hindered ECS compartment during the exemplary diffusion time of the exemplary implementation. Second, for example, many glia (e.g., and in particular, protoplasmic astrocytes, which take up as much as 10-20% of the neuropil volume fraction), have far more "spongiform" morphologies than neurons, which may allow for the remaining water in the glial compartment to travel fast, effectively hindered paths during the exemplary diffusion time of the exemplary implementation. Therefore, in contrast to neurites, glia processes are not well approximated by a distribution of cylinders at the 4 µm scale, which should prevent them from contributing to the restricted (neurite) volume fraction. This phenomenon is demonstrated in FIG. 3.

Figure 3:
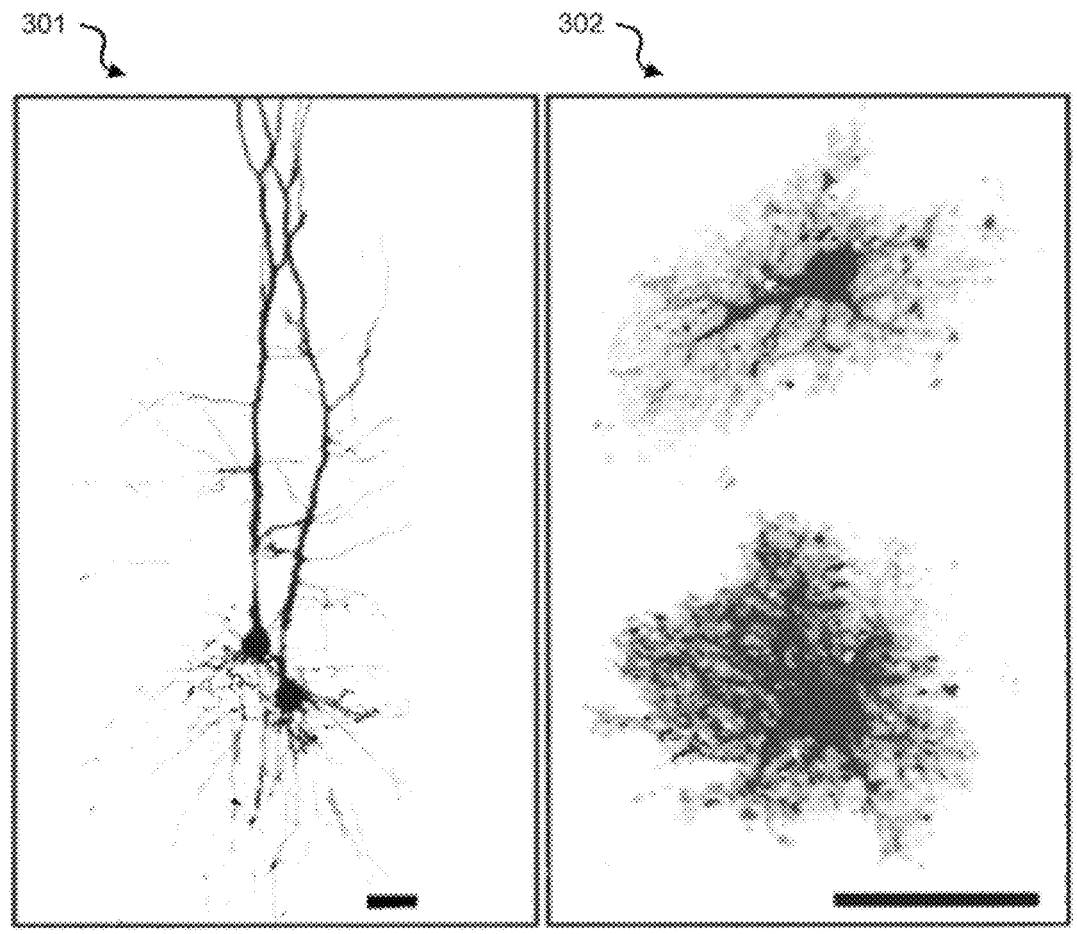
FIG. 3 shows an exemplary comparison of neuronal and glial cell morphologies in a rat cerebral cortex.

FIG. 3 shows images 301 and 302 demonstrating an exemplary comparison of neuronal and glial cell morphologies in the rat cerebral cortex. The image 301 shows an exemplary confocal image of two layer V pyramidal neurons. The image 302 shows an exemplary image of maximum projections of dye-filled, non-reactive astrocytes in layer IV. The exemplary scale bars shown in the images 301 and 302 represent 25 µm.

The results of the exemplary implementations shown in FIG. 2 demonstrate that the disclosed RSI model can separate the intra-neuritic restricted water from extra-neuritic hindered water in a tissue sample. For example, water contributing to the fine scales probed by the disclosed RSI model was shown to stem from water restricted within neurites (e.g., axons and dendrites), and water in the extra-neurite compartment (e.g., including hindered ECS water and restricted water in cell bodies and glia) contributed to the coarse scales probed by the disclosed RSI model. For example, the density and orientation structure of neurites can therefore be uniquely captured by the volume fraction and orientation distribution of the r-FOD.

Exemplary implementations of the disclosed technology were performed to investigate the anatomical substrate of the differential orientation information conveyed by the r-FOD and h-FOD. For example, the exemplary implementations compared their orientation distribution and volume fraction against the histoarchitecture in selected brain regions (e.g., including the striatum, globus pallidus, cerebral cortex, and cerebellum) known to have complex but characteristic tissue architectures.

In an exemplary implementation, the disclosed RSI technology was implemented in the striatum and globus pallidus. For example, in both the striatum and globus pallidus, the tissue architecture is characterized by the dense bundles of penetrating corticofugal axons, and by a relatively complex architecture with topographically organized axonal terminal fields, neurons and glial cells.

Figure 4:
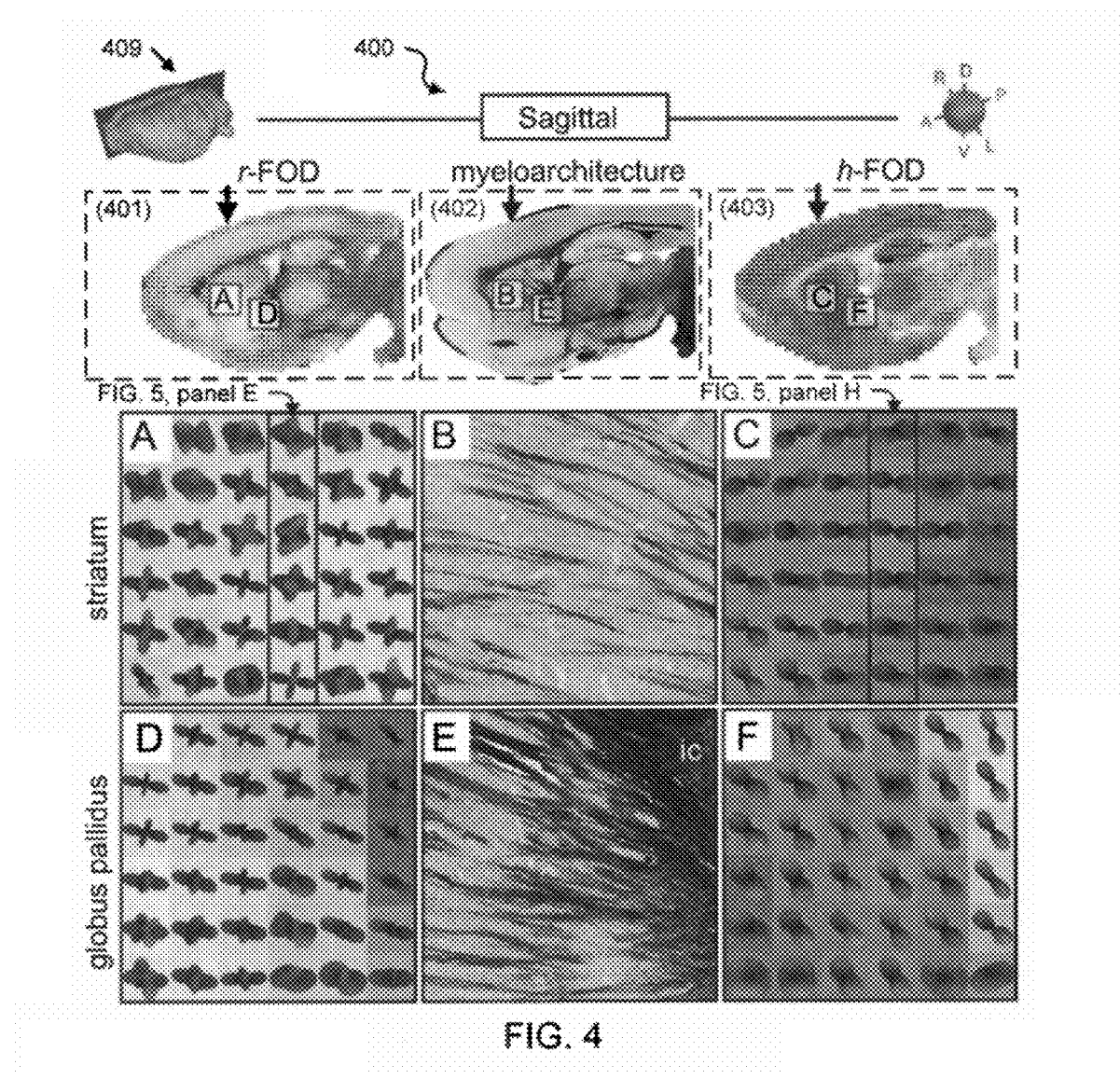
FIG. 4 shows an exemplary sagittal comparison of RSI and histology in the striatum and globus pallidus.

FIG. 4 shows a diagram 400 demonstrating a sagittal comparison of the disclosed RSI techniques and histology in the striatum and globus pallidus. For example, the diagram 400 shows exemplary color-coded RSI reconstructions of the r-FOD and the h-FOD shown together with myelin stained histological sections of the dorsolateral striatum and globus pallidus from the same specimen. The diagram 400 includes the exemplary color-coded RSI reconstruction of the r-FOD of the striatum shown in a panel A, the exemplary myelin stained histological section of the striatum shown in a panel B, and the exemplary color-coded RSI reconstruction of the h-FOD of the striatum shown in a panel C. The diagram 400 includes the exemplary color-coded RSI reconstruction of the r-FOD of the globus pallidus shown in a panel D, the exemplary myelin stained histological section of the globus pallidus shown in a panel E, and the exemplary color-coded RSI reconstruction of the h-FOD of the globus pallidus shown in a panel F. For example, all of the exemplary RSI distributions were scaled to fit within the voxel boundary, while the h-FOD was further normalized by subtracting the minimum to highlight its preferred orientation. Exemplary RSI volume fractions are shown as voxel grayscale intensities (e.g., dark corresponds to increased volume fraction). The diagram 400 includes a graphic representing a single sagittal slice 409 of the brain from which the MRI data was acquired. For example, the diagram 400 includes three inset images featuring an exemplary r-FOD image 401, an exemplary myeloarchitecture image 402, and an exemplary h-FOD image 403 of the sagittal slice 409. The exemplary inset images 401, 402, and 403 include arrows on top of the images (and also identifying frames in FIG. 4 panels A and C) that indicate the position of a coronal slice 509, which is shown later in FIG. 5 (e.g., in FIG. 5 panels E and H, respectively). For example, the diagram 400 shows the oblique orientation of the elongated dark myelin stained fibers shown in the panels B and E correspond well to the anteroposterior component (e.g., shown in blue color) of the r-FOD shown in the FIG. 4 panels A and D, but less well with the elongated h-FOD shown in the FIG. 4 panels C and F. For example, the diagram 400 shows the r-FOD volume fractions (e.g., shown as grayscale darkening from left to right in the panel D of the globus pallidus) are shown to fit well with the density of the myelin labeled fibers in the panel E.

In an exemplary implementation, the disclosed RSI technology was implemented in the cerebral cortex. For example, the cerebral cortex features a characteristic laminar and columnar organization with radially and tangentially oriented neurites.

Figure 5:
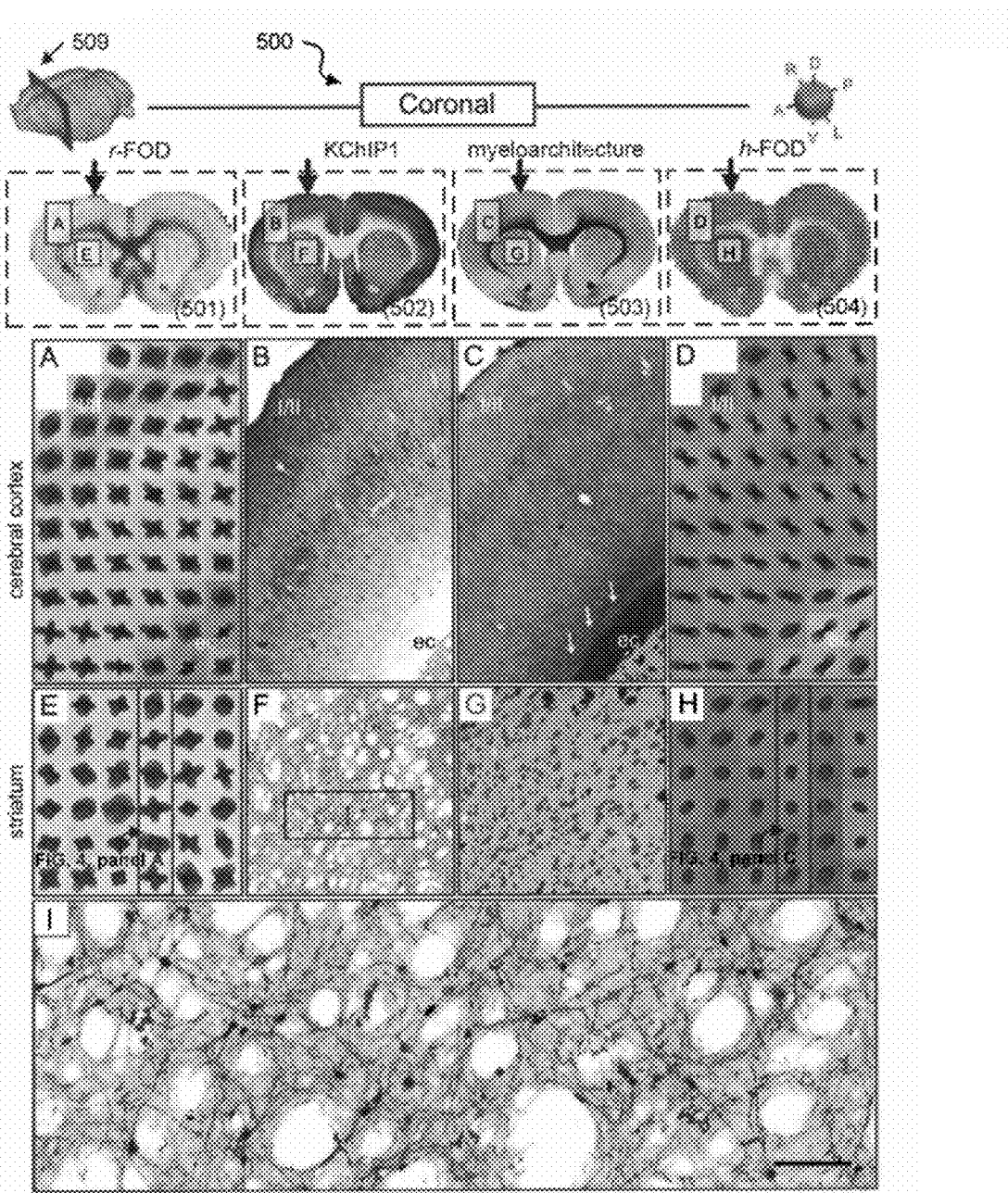
FIG. 5 shows an exemplary coronal comparison of RSI and histology in the cerebral cortex and striatum.

FIG. 5 shows a diagram 500 demonstrating a coronal comparison of disclosed RSI techniques and histology in the cerebral cortex and striatum. For example, the diagram 500 shows exemplary color-coded RSI reconstructions of the r-FOD and the h-FOD shown together with myelin stained histological sections and exemplary potassium channel (KChlP1) stains of the parietal cortex and dorsolateral striatum from the same specimen. The diagram 500 includes the exemplary color-coded RSI reconstruction of the r-FOD of the cerebral cortex shown in a panel A, the exemplary KChlP1 stained section of the cerebral cortex shown in a panel B, the exemplary myelin stained histological section of the cerebral cortex shown in a panel C, and the exemplary color-coded RSI reconstruction of the h-FOD of the cerebral cortex shown in a panel D. The diagram 500 includes the exemplary color-coded RSI reconstruction of the r-FOD of the striatum shown in a panel E, the exemplary KChlP1 stained section of the striatum shown in a panel F, the exemplary myelin stained histological section of the striatum shown in a panel G, and the exemplary color-coded RSI reconstruction of the h-FOD of the striatum shown in a panel H. For example, all of the exemplary RSI distributions were scaled to fit within the voxel boundary, while the h-FOD was further normalized by subtracting the minimum to highlight its preferred orientation. Exemplary RSI volume fractions are shown as voxel grayscale intensities (e.g., dark corresponds to increased volume fraction). The diagram 500 includes a graphic representing a single coronal slice 509 of the brain from which the MRI data was acquired. For example, the diagram 500 includes three inset images featuring an exemplary r-FOD image 501, an exemplary KChlP1 image 502, an exemplary myeloarchitecture image 503, and an exemplary h-FOD image 504 of the coronal slice 509. The exemplary inset images 501, 502, 503, and 504 include arrows on top of the images (and also identifying frames in FIG. 5 panels E and H) that indicate the position of the sagittal slice 409, which was shown in FIG. 4 (e.g., in FIG. 4 panels A and C, respectively). For example, in the cerebral cortex panels of the diagram 500, the primary orientation of the r-FOD and h-FOD are aligned radial to the cortical surface, while the r-FOD displays additional tangential orientations, which are most prominent in superficial layers I/II. For example, in the striatum panels of the diagram 500, the through-plane r-FOD and h-FOD orientations (e.g., shown as anteriorposterior orientation, in blue) reflect the cross-sectioned myelin stained fibers passing through the striatum (e.g., shown as dark dots in the FIG. 5 panel E and as light dots in FIG. 5 panel F). For example, again the exemplary r-FOD displays substantial additional in-plane structure (e.g., shown in the red and green peaks), e.g., which can reflect the complex geometry of corticostriatal terminal plexuses (e.g., shown later in FIG. 6, panel D) and vast networks of dendritic arbors in the region (e.g., shown in the cut-out panel in FIG. 5, panel I). The exemplary scale bar of FIG. 5, panel I represents 50 µm.

Figure 6:
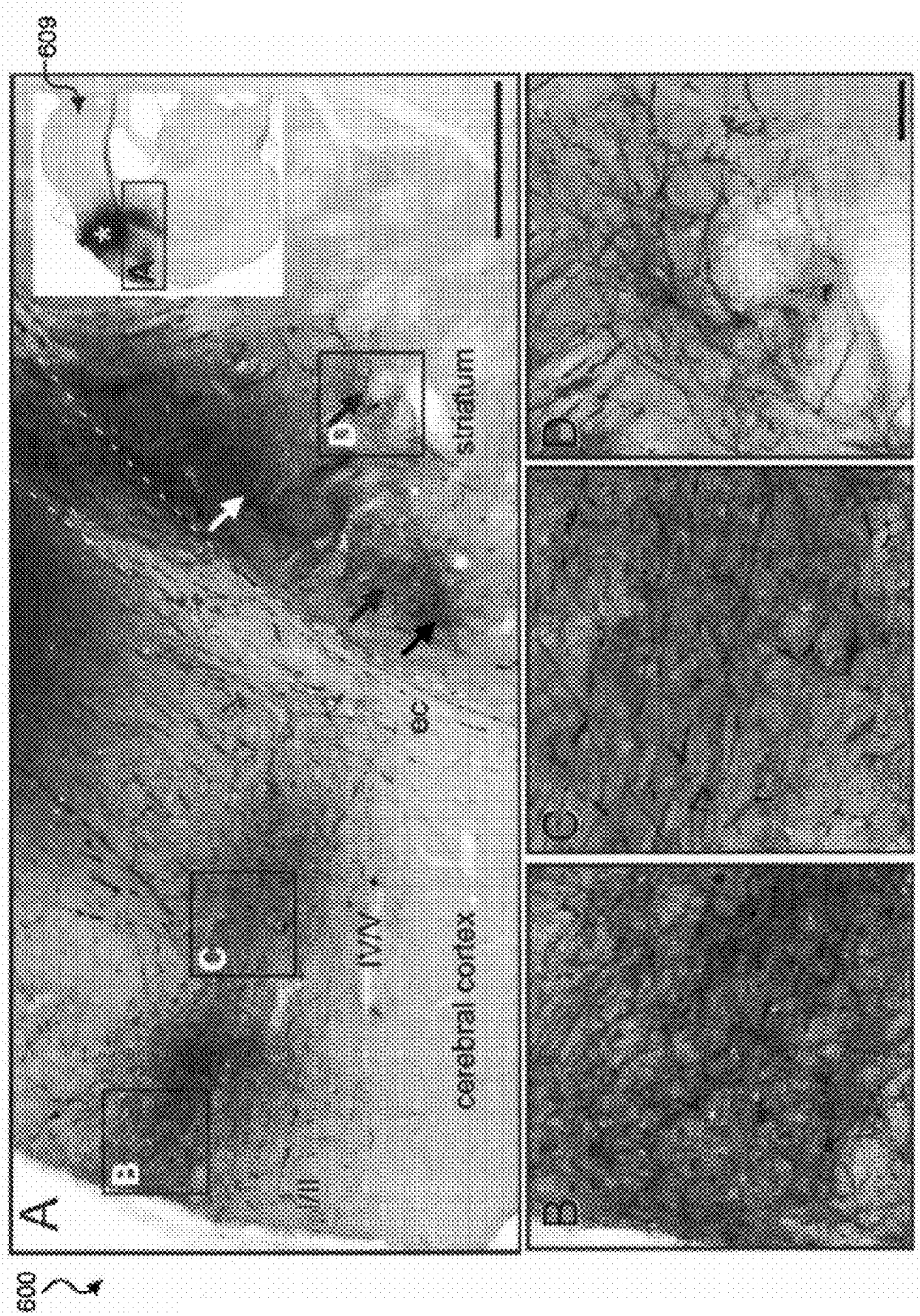
FIG. 6 shows exemplary images of an axonal architecture in the cerebral cortex and dorsal striatum.

FIG. 6 shows a diagram 600 demonstrating an axonal architecture in the cerebral cortex and dorsal striatum. The diagram 600 includes exemplary histological images showing specific corticocortical and corticostriatal axonal projections, anterogradely labeled by axonal tracer injection in the primary somatosensory cortex (e.g., darkly stained region indicated by the exemplary asterisk in inset image 609). The diagram 600 includes a panel A image overview of the secondary somatosensory cortex and dorsal striatum, e.g., showing the distribution of distinct, darkly labeled axonal plexuses. The FIG. 6 panel A shows the columnar distribution of labeled fibers in the cerebral cortex, with profuse arborizations in layers I-III and V, and laminar distribution of striatal fiber plexuses (e.g., shown by exemplary arrowheads) extending in parallel with the overlying external capsule (e.g., labeled as "ec" in the FIG. 6). FIG. 6 panels B, C, and D include magnified images showing detailed fiber architectures in cerebral cortex layer I/II (FIG. 6 panel B), layer IV/V (FIG. 6 panel C), and dorsal striatum (FIG. 6 panel D). For example, FIG. 6 shows the perpendicular fiber orientations in the deeper part of the cortex (FIG. 6 panel C), and striatum (FIG. 6 panel D), which match the r-FOD in FIG. 5 panels A and E. Also, for example, the more complex fiber orientations in the superficial cortex (e.g., in FIG. 6 panel B) fit well with the more pronounced tangential r-FOD peaks in FIG. 5 panel A. The exemplary scale bars of FIG. 6, represents 500 µm and 50 µm.

For example, the penetrating corticofugal axons appear dark in the myelin stain (e.g., FIG. 4, panels B and E; and FIG. 5, panel G), while the complex network of dendritic arbors and axonal terminal fields can be visualized using voltage-gated potassium channel stains (e.g., as shown in FIG. 5 KChlP1 and panels F and I) and axonal tracing techniques (e.g., as shown in FIG. 6 panel D), respectively. For example, in the striatum and globus pallidus, the dissociation between the h-FOD and r-FOD was shown to be pronounced (e.g., FIG. 4 panels A and C and panels D and F; and FIG. 5 panels E and H).

For example, in the anterior dorsal striatum, the exemplary r-FOD features three peaks, of which the anteriorposterior component corresponds well with the through-plane orientations of penetrating corticofugal axons (e.g., the exemplary blue peaks in FIG. 4 panel A compared with FIG. 4 panel B); while the more complex, crossing orientations appear to reflect the more random organization of corticostriatal terminal plexuses, dendritic arbors, and cellular processes in the region (e.g., the exemplary red and green peaks of the r-FOD in FIG. 5 panel E compared with the exemplary histoarchitecture in FIG. 5 panel F and I, and FIG. 6 panel D).

For example, in the globus pallidus, a similar pattern of exemplary r-FOD orientations was demonstrated, e.g., with prominent peaks well aligned with the oblique axial fibers penetrating the region (e.g., the exemplary blue peaks in FIG. 4 panel D compared with panel E), and less prominent, dorsoventrally (green) and mediolaterally (red) oriented peaks. For example, the larger amplitude peaks are consistent with the orientation of pallidal dendrites and striatopallidal axonal terminations in the region.

For example, by contrast, the exemplary h-FOD in the globus pallidus and dorsal striatum has a broader disk-like shape, e.g., with oblique dorsoventral orientation in the globus pallidus (FIG. 4 panel F), and horizontal orientation in the striatum (FIG. 4 panel C, FIG. 5 panel H). For example, the exemplary h-FOD was normalized by subtracting the minimum to highlight their preferred orientation, e.g., which can turn spherical FODs into disk-like distributions. None of these exemplary regions demonstrate the primary orientation of the exemplary h-FOD aligned consistently with the penetrating myelinated fibers (e.g., as shown by FIG. 4 panel B compared with FIG. 4 panel C, and by FIG. 4 panel E compared with FIG. 4 panel F). The primary orientation of the h-FOD in this region can reflect the combined hindrance of extra-neurite water by both penetrating cortico- and striatofugal axonal projections, and the highly oriented striatal and pallidal neurites. For example, this can explain why the exemplary h-FOD appears to align somewhere in between the primary (blue) and secondary and tertiary (green and red) peaks of the r-FOD (e.g., as shown in FIG. 4 panels B, C, E, and F). This also can support the existing notion that in most regions (excluding uniformly oriented dense white matter fiber tracts) the fiber architecture is less well characterized by the fast hindered water fraction compared to the slow restricted fraction.

In the exemplary cerebral cortex implementation, the exemplary h-FOD is aligned radially to the cortical surface (e.g., as shown in FIG. 5 panel D), which is consistent with the orientation of pyramidal cell axons and dendrites, as well as most corticoefferent and corticoafferent fibers (e.g., as shown in FIG. 5 panels B and J). By contrast, for example, the exemplary r-FOD not only reflects the same radial orientations, but also displays prominent orientations tangential to the cortical surface (e.g., as shown in FIG. 5 panel A), e.g., with the largest tangential amplitude occurring in the superficial cortical layers I/II. For example, the tangential peaks of the exemplary r-FOD can reflect the horizontal orientation of cortical neurites. For example, the complex, characteristic radial and tangential organization of cortical neurites is demonstrated in FIG. 6 panels A-C.

For example, in the external capsule (ec) below the cortical grey matter, both the exemplary h-FOD and r-FOD are elongated parallel with mediolaterally oriented fibers (FIG. 5 panels A-D), while the exemplary r-FOD displays additional perpendicular orientations (FIG. 5 panel A), e.g., which appear to reflect corticoefferent fibers passing through the external capsule towards the underlying striatum and the fibers peeling off the external capsule into the cortex (shown by the exemplary arrows in FIG. 5 panel C).

Exemplary implementations were performed to qualitatively compare the exemplary RSI maps of the total restricted volume fraction (e.g., by summing scales $D_T/D_L$=0, 0.08, 0.16, 0.25, shown in FIG. 2 in the fine scale diffusion processes 221) with the myelin and KChIP1 stained sections. Exemplary results are shown in FIG. 7, which provide further support for the notion that the fine (restricted) scales probed by the disclosed RSI techniques reflect water restricted within neurites.

Figure 7:
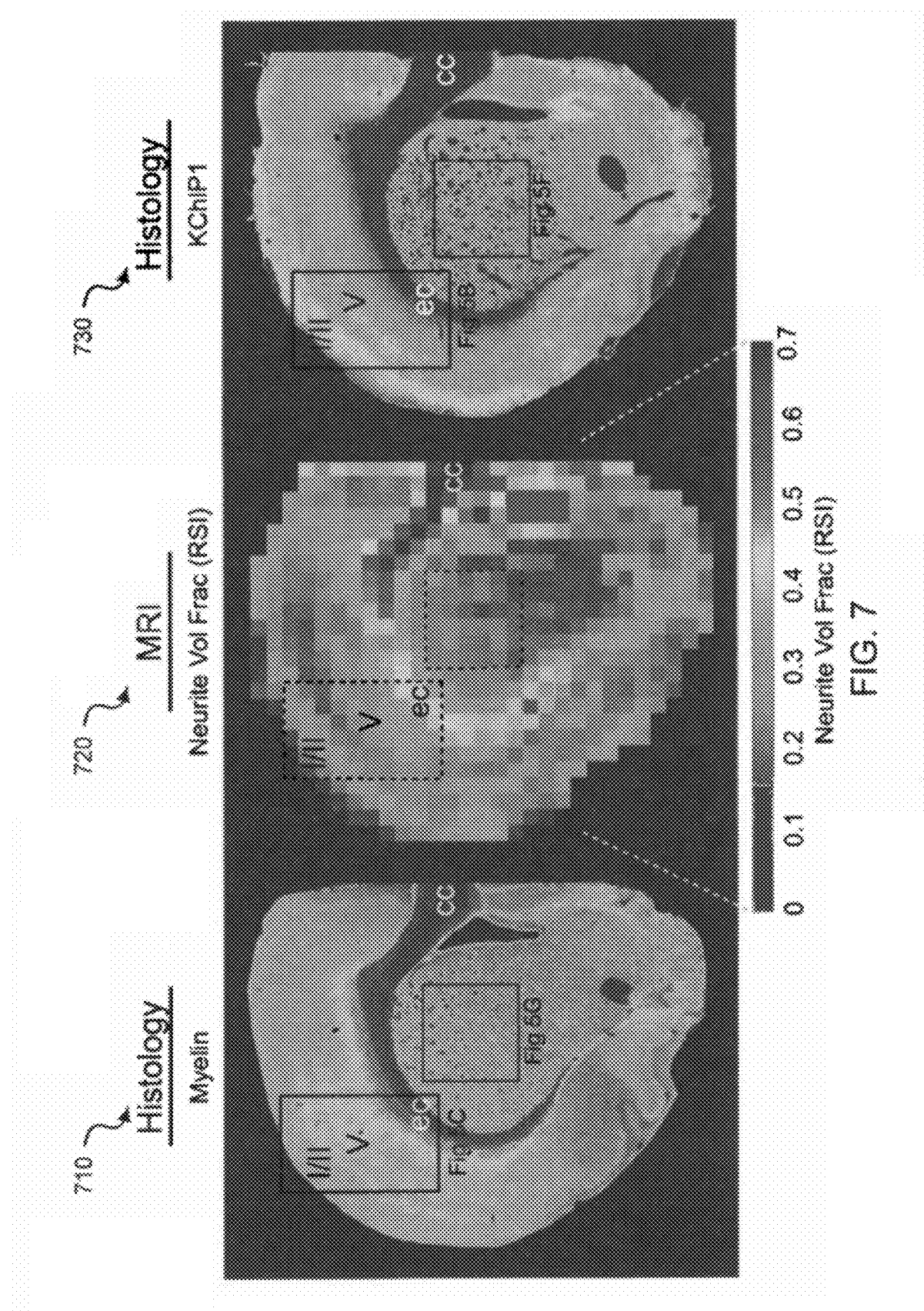
FIG. 7 shows an exemplary comparison of RSI restricted neurite volume fraction with histological measures of fiber architecture.

FIG. 7 shows a set of images 710, 720, and 730 of coronal comparison of RSI estimates of (restricted) neurite volume fraction with histological measures of fiber architecture. The images 710, 720, and 730 represent the same coronal section as in FIG. 5 (e.g., frames within the images 710, 720, and 730 indicate corresponding panels of FIG. 5). For example, the RSI neurite volume fraction (image 720) was shown to be consistent with the combination of both myelinated axons (image 710) and unmyelinated dendrites (image 730). For example, the image 720 shows increased neurite volume fraction in superficial layers of the cerebral cortex (I/II), e.g., which are also visible in the potassium channel (KChIP1) stain in the image 730.

For example, the exemplary RSI maps were shown to be consistent with the expected neurite volume fraction across grey and white matter as the model predicts. Exemplary RSI estimates of the neurite volume fraction in the cerebral cortex varied from approximately 18-31%, with the highest fraction occurring in positions corresponding to layers I/II followed by layer V. This exemplary pattern is consistent with the high density of apical dendrites and horizontally oriented neurites in layers I/II (e.g., FIG. 6 panel B), as well as numerous dendritic arbors and profuse plexuses of thalamocortical afferents in layer V (e.g., FIG. 6 panel C). Exemplary histological substrates for this pattern are seen in the KChIP1 stain (e.g., FIG. 5 panel B, and the image 730 of FIG. 7), and the axonal tracer data (e.g., FIG. 6 panels B and C). For example, in the underlying white matter shown in FIG. 7 (e.g., external capsule (ec) and corpus callosum (cc)), the exemplary RSI estimates of the total restricted volume fraction increased dramatically to approximately 42-84%. This exemplary result is consistent with the presence of densely packed white matter fibers in this region, which appeared dark red on the myelin stain (image 720 of FIG. 7). For example, these exemplary results are consistent with the expected neurite volume fraction in grey and white matter, and indicate that the restricted volume fraction can be a surrogate measure of the neurite volume fraction.

Figure 8:
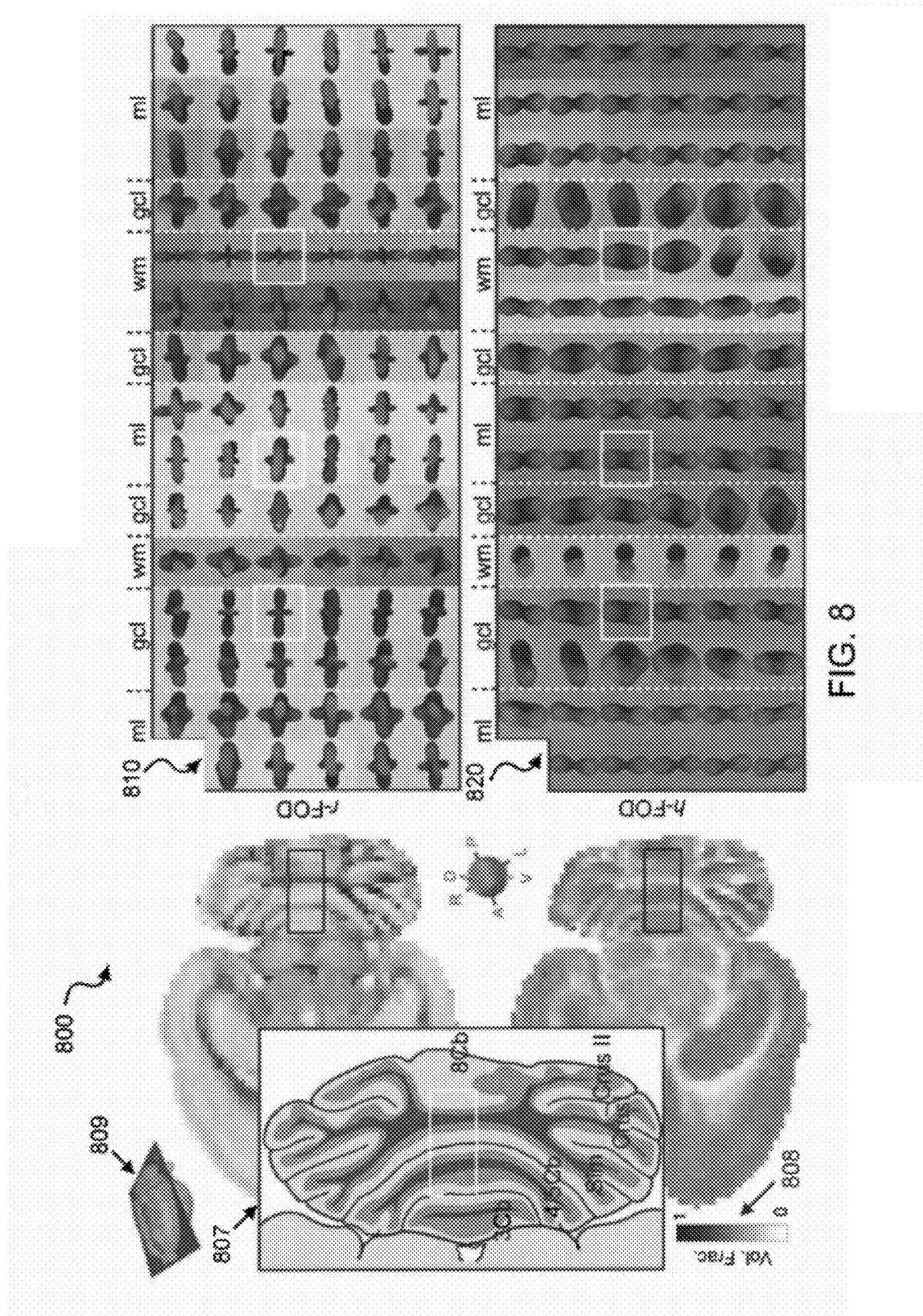
FIG. 8 shows an exemplary axial RSI analysis in the cerebellum.

In an exemplary implementation, the disclosed RSI technology was implemented in the cerebellum. FIG. 8 shows a diagram 800 demonstrating axial RSI analysis of the cerebellum. The diagram 800 includes an exemplary color-coded RSI reconstruction of the r-FOD (shown in panel 810) and an exemplary color-coded RSI reconstruction of the h-FOD (shown in panel 820) for a horizontal cerebellar slice taken at level of lobules 3, 5, and 8, e.g., corresponding to a level ~4.6 mm below bregma. The diagram 800 includes an inset atlas diagram 807 illustrating the anatomical structures. The diagram 800 includes a graphic representing a single horizontal slice 809 of the brain from which the MRI data was acquired. The diagram 800 includes a legend 808 of the volume fraction values. The exemplary distributions were scaled to fit within the voxel boundary, while the exemplary h-FOD was further normalized by subtracting the minimum to highlight its preferred orientation. The exemplary RSI volume fractions are shown as voxel grayscale intensities (e.g., dark corresponds to increased volume fraction, indicated in the legend 808). The exemplary white boxes shown in the panels 810 and 820 correspond to voxels plotted in FIG. 10. The abbreviations included in the atlas diagram 807 and the panels 810 and 820 are as follows: Cb (cerebellar lobule); CrusI (crus 1 of the ansiform lobule); CrusII (crus 2 of the ansiform lobule); gcl (granule cell layer); ml (molecular layer); Sim (simple lobule); and wm (white matter). The diagram 800 shows that the cerebellar white matter and cortical layers are differentiated by distinct differences in r-FOD and h-FOD orientation and volume fraction.

The exemplary implementation of the disclosed RSI model, shown in FIG. 8, included analyses that focused on the cerebellar vermis in a horizontal slice at the level of lobules 3, 5, and 8, e.g., where the cerebellar folia are mediolaterally oriented, and orientation structure is easier to interpret in relation to the employed slice planes. For example, the cerebellar white matter, granule cell layer, and molecular layers were all readily identified on basis of the r-FOD and h-FOD volume fraction and orientation (FIG. 8). In this example, the narrow Purkinje cell layer could not be distinguished, e.g., due to partial voluming.

For example, in the white matter (wm) shown in FIG. 8, the cerebellar afferent and efferent fibers largely follow the foliated structure of the cerebellum, but also form more complex (crossing) orientations in some regions. As shown in previous examples, the preferred orientation of white matter fibers was clearly reflected in both the exemplary r-FOD and h-FOD (e.g., FIG. 8 panels 810 and 820). While, for example, the r-FOD also showed additional secondary and tertiary orientations (FIG. 8 panel 810) that are consistent with crossing afferent and efferent fibers in this region (but, for example, may also reflect partial voluming with neighboring layers).

For example, in the granule cell layer (gcl) shown in FIG. 8, the exemplary gcl is characterized by the presence of numerous small granule cells, and further also smaller numbers of other cell types. For example, radially (translobularly) oriented mossy- and climbing fibers can penetrate the gcl and ascend together with granule cell axons through the Purkinje cell layer into the overlying molecular layer. In the exemplary gcl, the exemplary r-FOD showed prominent radial (blue and green) peaks (FIG. 8 panel 810), e.g., which is consistent with the orientation of mossy- and climbing fibers, and less prominent mediolaterally (red) oriented peaks, which may be associated with the different cellular extensions in the gcl. The exemplary h-FOD, on the other hand, tended to be more variably elongated in both translobular or parlobular directions (FIG. 8 panel 820).

For example, in the molecular layer (ml) shown in FIG. 8, the exemplary ml contains several categories of radially (translobularly) oriented neurites (e.g., including Purkinje cell dendrites, ascending granule cell axons, dendrites of Golgi- and stellate cells, and glial extensions. For example, these orientations are clearly visible as blue and green peaks in the r-FOD (FIG. 8 panel 810). For example, another characteristic feature of the ml is the presence of numerous, mediolaterally (parlobularly) oriented parallel fibers, e.g., which fit well with the prominent mediolateral (red) peaks of the r-FOD (FIG. 8 panel 810). The exemplary h-FOD, on the other hand, illustrates a single peak pointed in the direction of the parallel fibers (FIG. 8 panel 820), e.g., which is plausible given the high packing density of parallel fibers in this region compared with other neurites in the ml (e.g., Purkinje cell dendrites and ascending granule cell axons), leading to increased tortuosity of extra-neurite water in the orthogonal direction.

Considering the exemplary results of FIG. 8 together, the exemplary r-FOD demonstrates the stereotypic organization of cerebellar neurites in each layer, and the exemplary h-FOD can be indicative of the densely packed white matter and parallel fibers. These exemplary results further support for the notion that the coarse scale hindered fraction of diffusion is less characteristic of the underlying fiber architecture, e.g., as compared with the fine scale restricted fraction.

Exemplary implementations were performed to demonstrate a comparison of the disclosed RSI technology with exemplary SD techniques, e.g., how exemplary multi-scale RSI measures compared with existing fixed-scale SD and DSI. For example, fixed-scale estimates of the fiber orientation distribution (FS-FOD) were computed using a single deconvolution kernel ($D_T/D_L$=0.08), which can represent an exemplary SD for HARDI acquisitions to arbitrary q-space data, and DSI estimates of the water diffusion orientation distribution function (DSI-dODF) were computed, which were compared with the exemplary RSI r-FOD and exemplary RSI h-FOD in the cerebral cortex and cerebellum.

Figure 9:
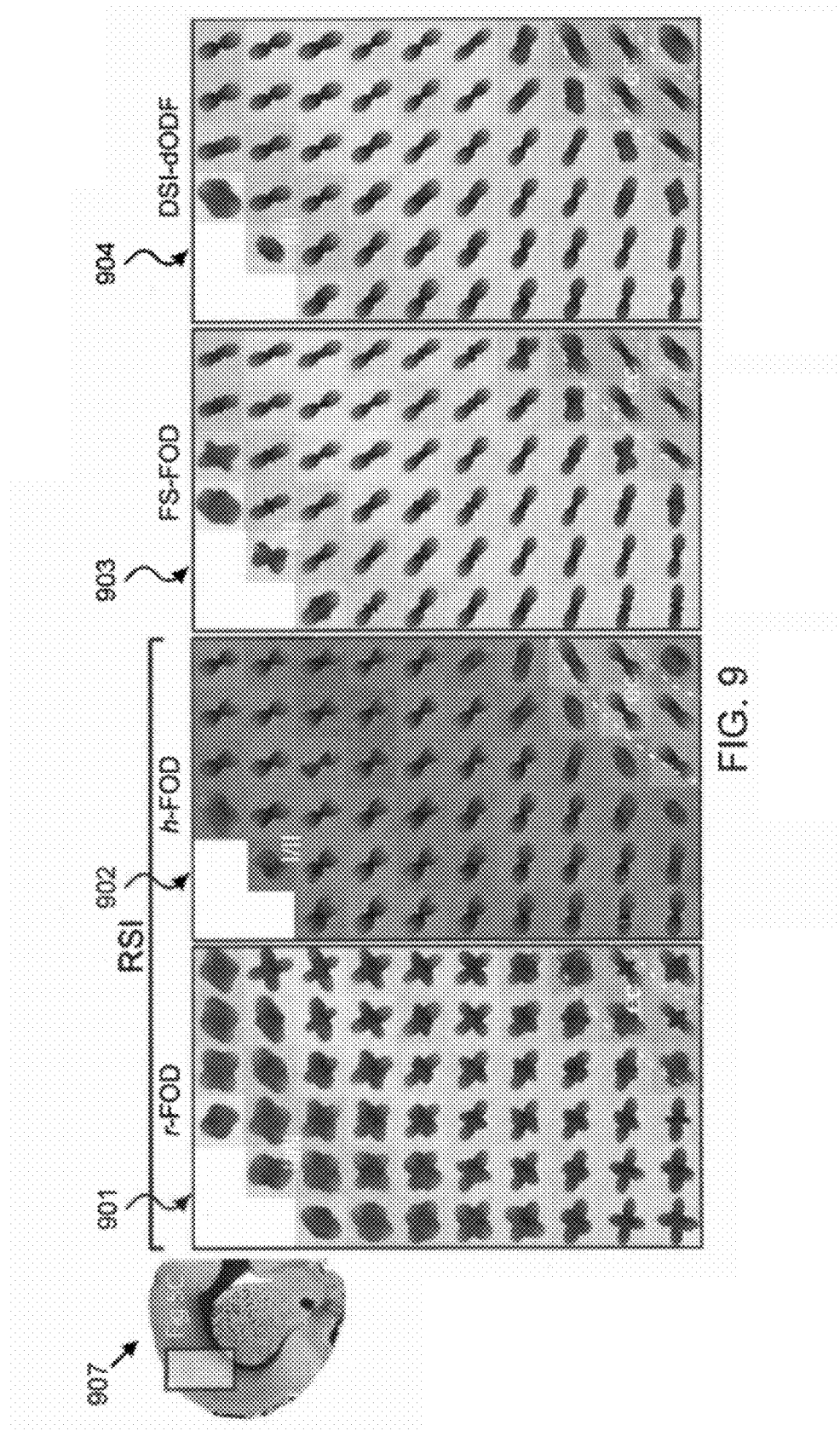
FIG. 9 shows an exemplary comparison of RSI with spherical deconvolution (SD) and diffusion spectrum imaging (DSI) in the cerebral cortex.

FIG. 9 shows exemplary color-coded reconstructions demonstrating the comparative data of the disclosed RSI techniques with SD and DSI techniques in the cerebral cortex. Image 901 shows RSI reconstructions of the exemplary r-FOD, and image 902 shows RSI reconstructions of the exemplary h-FOD. Image 903 shows SD reconstructions of the fixed-scale FOD (FS-FOD), and image 904 shows DSI reconstruction the dODF (DSI-dODF). FIG. 9 shows a diagram 907 that shows the region sampled in the exemplary implementation, which is the same as the region shown in FIG. 5 panels A-D. For example, the exemplary distributions were scaled to fit within the voxel boundary, while both the exemplary h-FOD and DSI-dODF were further normalized by subtracting the minimum to highlight their preferred orientation. The exemplary RSI volume fractions are shown as voxel grayscale intensities (e.g., dark corresponds to increased volume fraction). The exemplary FS-FOD and DSI-dODF are plotted on the exemplary r-FOD volume fraction map. In FIG. 9, the exemplary abbreviations I/II and ec refer to the cerebral cortex layer I/II and the external capsule, respectively.

For example, in contrast to the exemplary RSI r-FOD, both the FS-FOD and DSI-dODF demonstrate little evidence for the numerous horizontally oriented neurites tangential to the cortical surface (e.g., as shown in FIG. 6 panels B, C), and have similar orientation structure to the exemplary RSI h-FOD. The exemplary results in the cerebral cortex showed that the FS-FOD and DSI-dODF reflected mainly the radial orientation of cortical neurites. The exemplary results in the cerebral cortex showed that the exemplary RSI r-FOD was able to resolve both the well-known radial and tangential organization of cortical neurites. FIG. 9 also showed a qualitative similarity between the exemplary h-FOD and the DSI-dODF, e.g., which were both normalized by subtracting the minimum to highlight their preferred orientation. The exemplary r-FOD and FS-FOD were not normalized as their minimums were effectively zero. For example, DSI-dODF quantifies the statistical likelihood of water diffusion in a given direction, which is heavily weighted by the volume fraction of "fast" hindered diffusion along that direction and less so by the volume fraction of "slow" restricted diffusion.

Figure 10:
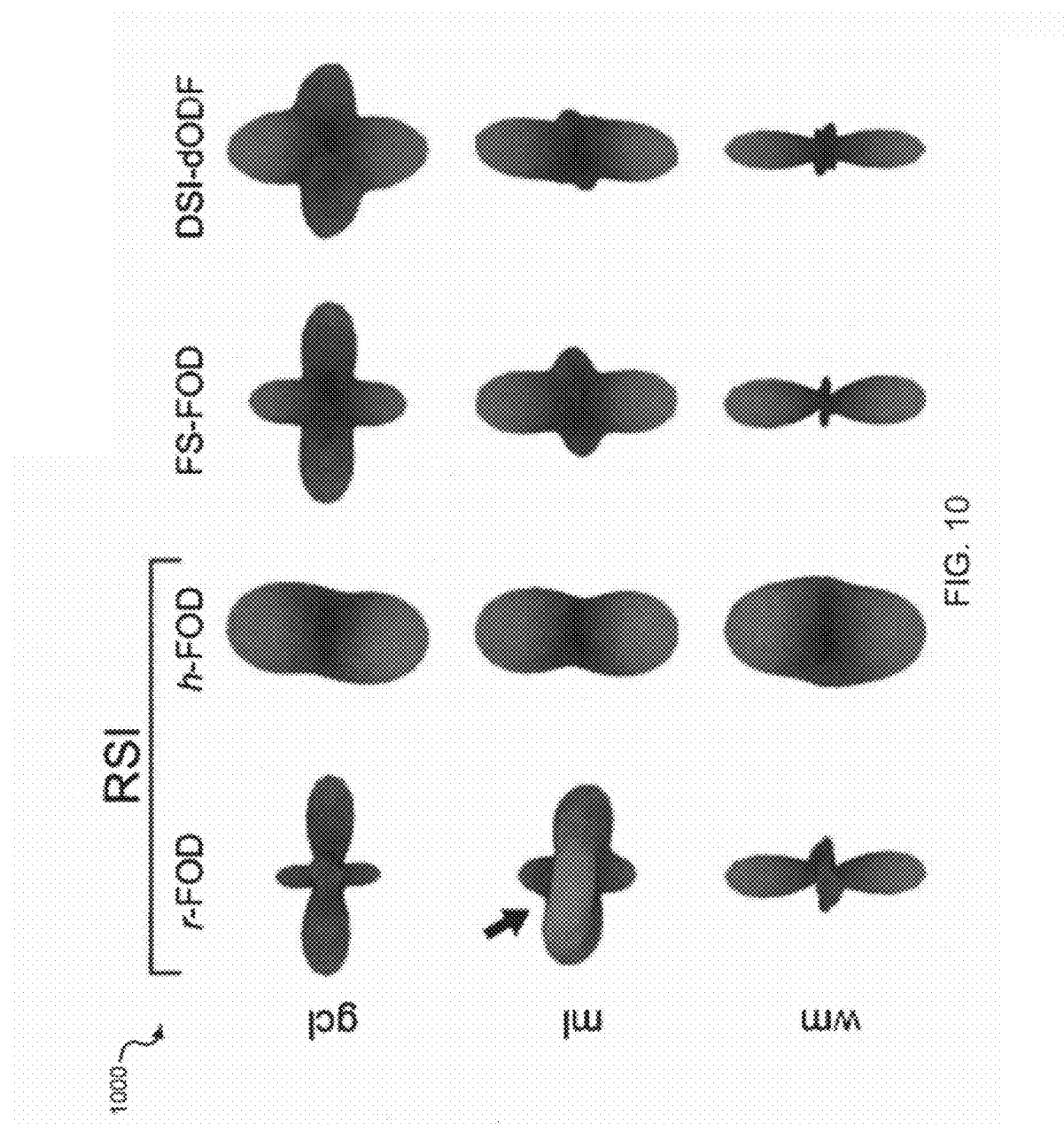
FIG. 10 shows an exemplary comparison of RSI with SD and DSI in the cerebellum.

FIG. 10 shows a diagram 1000 comparing exemplary RSI estimates of the r-FOD and h-FOD versus the FS-FOD and DSI-dODF in three representative voxels from different layers of the cerebellum. Color-coded RSI reconstructions of the r-FOD and h-FOD are compared against the FS-FOD and DSI-dODF. The exemplary sampled voxels were identified by the white boxes shown in FIG. 8. The abbreviations included in the diagram 1000 are as follows: Cb (cerebellar lobule); CrusI (crus 1 of the ansiform lobule); CrusII (crus 2 of the ansiform lobule); gcl (granule cell layer); ml (molecular layer); Sim (simple lobule); and wm (white matter).

For example, in the molecular layer (ml), the diagram 1000 shows that the r-FOD shows additional radially (translobularly) oriented green peaks (e.g. identified by the exemplary arrow), e.g., which are consistent with the orientation of Purkinje cell dendrites and ascending granule cell axons in the region. These exemplary peaks are not evident in either the FS-FOD or DSI-dODF.

For example, in white matter, the diagram 1000 shows that the main (red) peak of the exemplary r-FOD and h-FOD were well aligned with the main peak of the FS-FOD and DSI-dODF, e.g., which follow the dominant direction of cerebellar afferent and efferent fibers in this region. It is noted, for example, that in these voxels the secondary and tertiary peaks of the exemplary r-FOD and FS-FOD are present in the data of the exemplary implementation, which may, for example, be due in part to ringing artifacts, e.g., introduced during reconstruction, as their amplitudes are substantially small compared to the main peak. Also, for example, small spurious peaks in the r-FOD, FS-FOD, and DSI-dODF may also have been introduced in the data of the exemplary implementation, e.g., which may be a result of the numerical sampling bias associated with non-uniform (Cartesian) sampling of q-space.

For example, in the granule cell layer, the diagram 1000 shows that the FS-FOD and DSI-dODF both demonstrated prominent mediolateral (red) and radial (blue) peaks consistent with the orientation of mossy- and climbing fibers in the region. These same exemplary peaks were also present in the RSI r-FOD and h-FOD. Yet additional information can be gleaned from exemplary RSI data. For example, the strong mediolateral (red) orientation of the h-FOD suggests mediolaterally oriented neurites may have higher packing densities compared with radially oriented neurites, e.g., producing a higher degree of tortuosity of extra-neurite water.

The ability to separate hindered and restricted diffusion can also increase the sensitivity of RSI to resolve neurite orientations in voxels with a high partial volume fraction of hindered diffusion. For example, in the molecular layer (ml), the FS-FOD, DSI-dODF, and RSI h-FOD demonstrated prominent mediolateral (red) peaks consistent with the orientation of parallel fibers in the ml. For example, however, the RSI r-FOD showed strong additional radially (translobularly) oriented blue and green peaks, e.g., which are consistent with the orientation of Purkinje cell dendrites, ascending granule cell axons, dendrites of Golgi- and stellate cells, and glial extensions in this region. These exemplary results were consistent across other cerebellar voxels (e.g., as shown in FIG. 8).

An exemplary RSI model resolution matrix is described. For example, the concept of the model resolution matrix in linear estimation problems can provide ways to characterize the bias in linear inverse problems. The basic idea is to see how well a particular inverse solution $\hat{\beta}$ matches the original model parameters $\beta$ through the expression $\hat{\beta}=A^{\dagger}A\beta$, where $A^{\dagger}$ is the regularized inverse matrix, and $A^{\dagger}A$ is the model resolution matrix. In practice, a model resolution matrix is commonly used in two different ways. For example, the first is to examine the diagonal elements of $A^\dagger A$ for their departure from unity. A value of one would indicate perfect resolution, e.g., where $\hat{\beta}=I\beta$, with I being the identity matrix. In this exemplary way, the trace of $A^\dagger A$ can be used to indicate the intrinsic dimensionality of the problem, e.g., by quantifying the total number of resolvable parameters. For example, the second is to multiple $A^\dagger A$ by a particular "test model" $\beta^{test}$ to see how well the true (test) model would be resolved using the regularized inverse matrix. For example, often the text models are simple vectors of all zeros, except for a single element equal to one, which when multiplied by $A^\dagger A$ simply picks off the corresponding columns of $A^\dagger A$. Thus, the columns of $A^\dagger A$, or "resolution kernels", describe how well the true parameters are recovered or blurred by the regularized inverse matrix. Similarly the rows of $A^\dagger A$ can be viewed as quantifying how sensitive a particular parameter estimate is to the true model.

The exemplary model resolution matrix described herein can be used to quantify the blurring and intrinsic dimensionality of our optimally regularized RSI model. For example, to do this, the regularized model resolution matrix $A^\dagger A$ was projected (e.g., Eqs. [10], [11]) onto the FOD surface via $\overline{Y}_L A^\dagger A \overline{Y}_L^T$, where $\overline{Y}_L$ is a large block diagonal matrix of SH vectors. In this exemplary way, the model resolution can be visualized directly on the FOD surface, rather than in spherical harmonic space, which is more difficult to interpret. The resultant matrix was then row normalized (e.g., the same axis limits were used for each row element) and plotted in FIG. 11A.

Figure 11A:
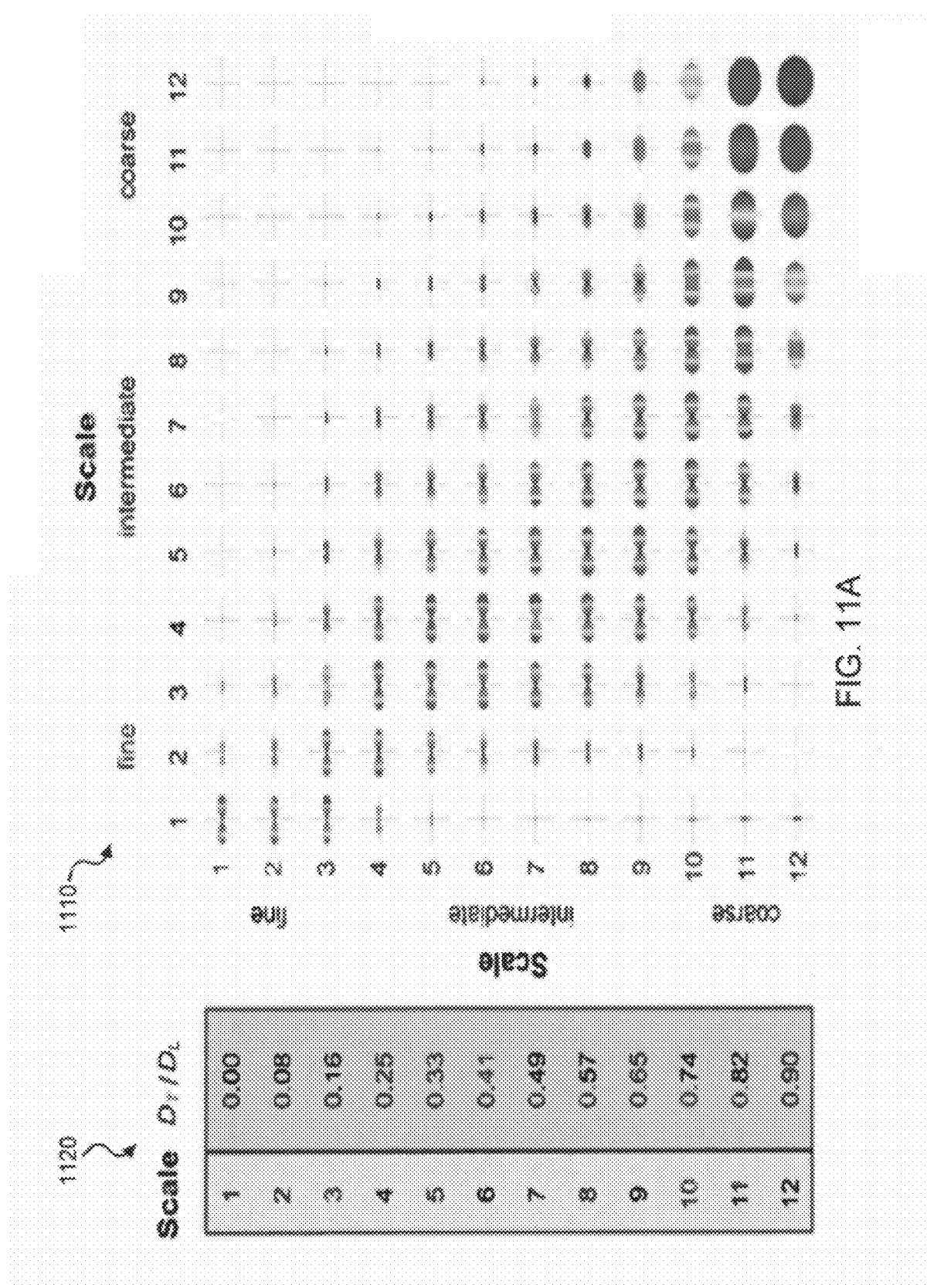
FIG. 11A shows an exemplary RSI model resolution matrix.

FIG. 11A shows an exemplary RSI model resolution matrix 1110. For example, each row illustrates the sensitivity of the recovered (estimated) FOD at that scale (row number) to FODs at all other scales (column number). All exemplary FODs shown in the matrix 1110 are without subtracting the minimum, but setting negative values set to zero. A table 1120 represents the exemplary scale to $D_T/D_L$ values. For example, for simplicity and without loss of generality, only the columns of the resolution matrix that corresponds to unit fibers pointed along the horizontal axis were plotted in the matrix 1110 (e.g., "test models" were horizontal unit fibers), and the two isotropic terms were ignored. Each exemplary row of the RSI model resolution matrix 1110 can be interpreted as the sensitivity of the recovered (estimated) FOD at that scale to FODs at all other scales. For example, a perfect resolution would result in a diagonal matrix of "cigar-like" FODs along the horizontal axis (labeled).

As shown in FIG. 11A, exemplary FODs at the fine and coarse scale were separable, e.g., despite significant blurring across neighboring scales. For example, rows 1-2 of the matrix 1110 have little or no contribution from columns 10-12, and rows 10-12 have little to no contribution from columns 1-2. This exemplary separablility fits well with the empirical observations (e.g., like those shown in FIG. 2). Also, for example, the isotropic FODs in the bottom right hand corner demonstrate how estimates of coarse scale hindered FODs have higher angular uncertainly compared with the restricted FODs in the upper left, e.g., which also fits well with the empirical observations. As described above, the resolution matrix in FIG. 11A quantitatively demonstrates how information is blurred across neighboring scales using our optimally regularized model and q-space acquisition parameters (e.g., G, $\Delta$, and $\delta$). This exemplary model resolution framework also presents a principled method to optimize the acquisition parameters for finer scale resolutions. For example, multi-diffusion time protocols can be employed to parse restricted length scales in more detail (e.g., leading to diagonal terms in the upper left-hand corner of FIG. 11A), e.g., in order separate the size scale and geometry of various restricting compartments in tissue (e.g., such as cell bodies and dendrites). Additionally, for example, the trace of the resolution matrix can also be used to quantify the effective number of resolvable scales, e.g., which were calculated in the exemplary q-space data to be just under 3 (e.g., 2.67).

An additional source of bias to deconvolution-based HARDI methods employing spherical harmonic basis functions are ringing artifacts (e.g., spurious sidelobes) that can be introduced during reconstruction. These artifactual sidelobes can result from truncation of the spherical harmonic series, e.g., leading to a form of Gibbs ringing on the surface. For example, for a 4th order (L=4) harmonic expansion, there will be exactly L/2−1=1 sidelobes that occurs at 90° to the main peak. These artifactual peaks can be mitigated with model regularization techniques, e.g., such as Tikhonov regularization or other methods such as Laplace-Beltrami regularization, while balancing the tradeoff between angular resolution on the one hand and suppression of ringing artifacts on the other.

For example, an additional implementation of the Monte Carlo simulation was performed to examine the extent to which the regularized RSI model was prone to ringing artifacts. In brief, for example, synthetic diffusion signals were generated using an exemplary RSI model including a single fiber system with two diffusion scales, e.g., one restricted ($D_T/D_L$=0), and one hindered ($D_T/D_L$=0.82) with various volume fractions. For each exemplary Monte Carlo run, a random Rician noise was added to the exemplary synthetic signal at a given signal-to-noise (SNR) ratio with respect to the signal power at b=0. An exemplary regularized RSI model was used (e.g., 12 scales) to estimate the model parameters, and then the implementation was repeated for various SNR levels and hindered and restricted volume fractions.

Figure 11B:
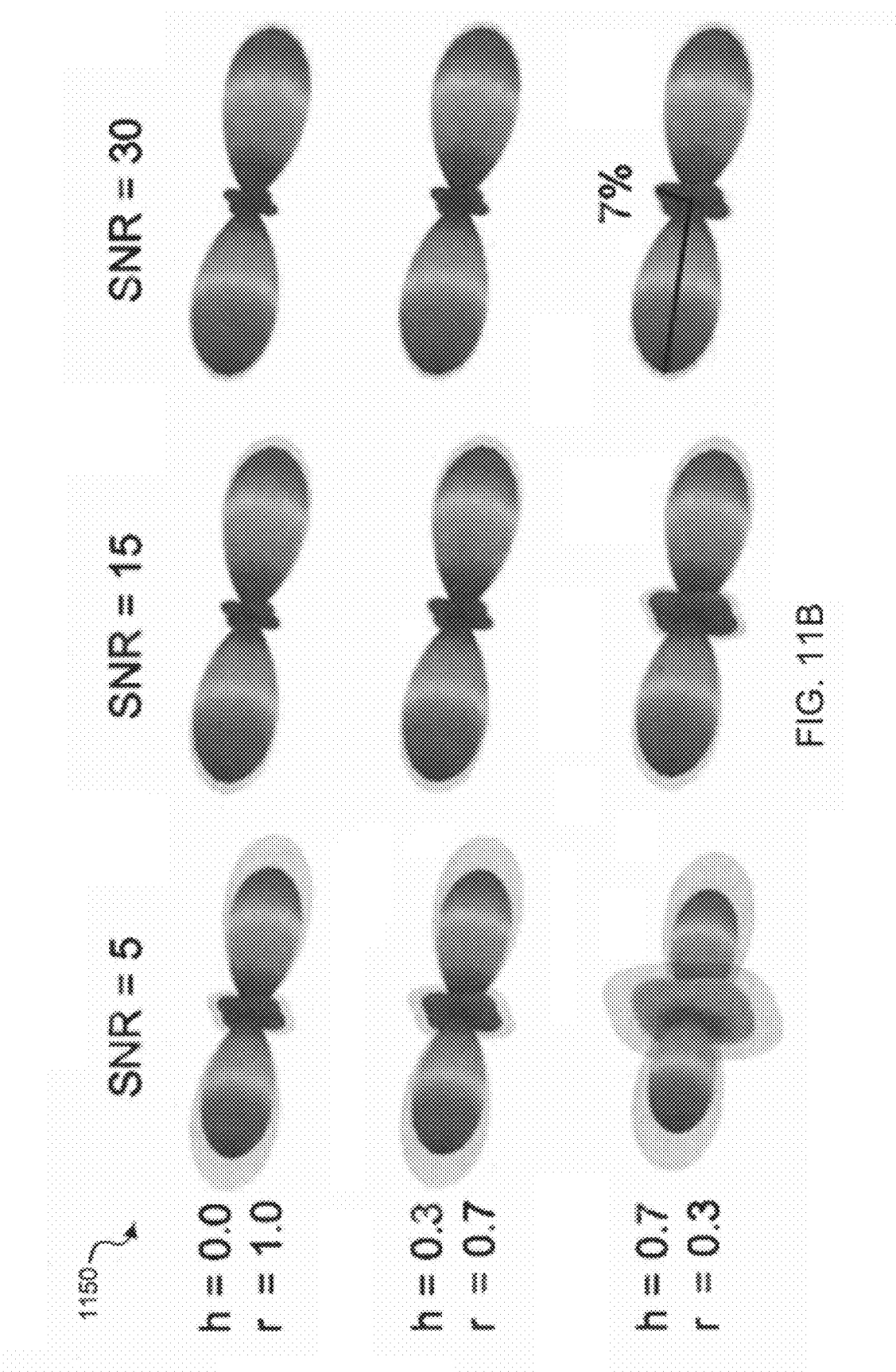
FIG. 11B shows exemplary RSI Monte Carlo simulations.

Exemplary results of the Monte Carlo simulations are shown in diagram 1150 of FIG. 11B. The diagram 1150 shows the mean r-FOD (color-coded surface) and mean plus standard deviation (gray opaque surface) over 100 Monte Carlo runs for various SNR levels and hindered (h) and restricted (r) volume fractions. FIG. 11B shows that the ringing artifacts increased both as the SNR decreased and as the volume fraction of hindered diffusion increased. The diagram 1150 shows that the amplitude of the 90° ringing artifact increases both with decreasing SNR and increasing hindered volume fraction. For example, the amplitude of these ringing artifacts was very small compared to the main peak, even at very low SNR. The SNR of the exemplary q-space data in white and grey matter was approximately 29.8 and 55.1, respectively. For example, the amplitude of the ringing artifacts would not be greater than about 7% of the main peak, even in regions with a high partial volume fraction of hindered diffusion, such as cortical grey matter (~70-80%). Thus, these exemplary implementations show that the secondary and tertiary orientations of the exemplary r-FOD reflect the underlying neurite architecture of the region.

Exemplary implementations demonstrated the correspondence of the disclosed restricted volume fraction and orientation distribution (r-FOD) to the underlying neurite density and three-dimensional organization in white and gray matter structures. For example, it has been described how exemplary RSI reconstructions of the r-FOD captured additional anatomical structure, e.g., in gray matter regions. Implementations of the disclosed RSI techniques can offer a more detailed characterization of tissue water compartmentalization in health and disease. For example, the exemplary multi-scale linear framework of the disclosed technology to can be applied important clinical applications, e.g., in probing salient microstructural features of normal and pathological tissue in vivo.

The disclosed RSI analysis method described in this patent document can provide one or more of the following features. For example, the disclosed RSI technology can use a distribution of non-exchanging cylinders to model the tissue microstructure and spherical harmonics to describe their orientation distribution. The disclosed RSI technology can harness multiple b-value data to separate scale information at the hindered and restricted level. Exemplary implementations of the disclosed RSI technology demonstrated neurite volume fraction across various grey and white matter regions. Exemplary implementations of the disclosed RSI technology demonstrated the intra- and extra-cylindrical diffusivities can take on a broad range (or spectrum) of values when fitting the data, rather than just an explicit fit. For example, this can preserve a linear implementation, e.g., simplifying estimation and decreasing computation time significantly. For example, the spectrum of independent scales and orientation distributions further allows the disclosed RSI technology to model the tissue microstructure with minimal a priori assumptions on the number of hindered and restricted water compartments, their respective geometries, and partial volume fractions, e.g., without imposing some form of geometric dependence between the hindered and restricted compartment to infer on nonlinear parameters describing the axon diameter distribution. For example, the disclosed RSI technology can model the geometries of the hindered and restricted compartments independently, e.g., which can account for numerous additional structures in the extra-neurite compartment (e.g., cell bodies, glia, ECS) that can alter the tortuosity of the hindered compartment. In some examples, the determined parameters from an exemplary RSI analysis can be used as input into a visualization protocol (e.g., MRI visualization software) to render one or more images of the analyzed biological tissue, e.g., in which the visualization protocol can clearly display (e.g., highlight) biological structure(s) in a region of interest (e.g., a tumor lesion) that is defined based on the determined parameters of the RSI analysis, and quantify the volume or other characteristics of the biological structure in the region of interest based on the determined parameters of the RSI analysis.

In another aspect of the disclosed RSI technology, methods, devices and systems can be used for estimating the unknown parameters of the disclosed linear mixture model, e.g., using linear and/or nonlinear estimation theory. For example, the disclosed estimation processes can include model regularization of the solution vector, which may place prior assumptions in the form of constraints on the form and extent of the estimated model parameters, e.g., such as imposing a smoothness, sparceness, and non-negative constraints on the solution vector. These exemplary prior constraints may vary as a function of the location of the particular MRI imaging voxel with respect to the subject's anatomy, and can be derived from the data itself or prior data, e.g., such as data from a pre-determined atlas of model parameters. The disclosed estimation processes may also take the form of a Bayesian estimation problem, which casts the linear mixture model estimation problem into a statistical estimation problem.

The disclosed estimation processes can also include techniques to remove any unwanted contributions to the measured signal while preserving signals of interest, e.g., in order to estimate other model parameters more accurately. For example, an estimation process can be implemented to remove the unwanted contribution from extracellular water diffusion signal, e.g., which can be associated with vasogenic or cytotoxic edema within the imaging voxel, in order to estimate more accurately the diffusion properties of the underlying gray and white matter tissue compartments within the same imaging voxel, the properties including the orientation, density, and diameter distribution of axons and dendrites.

The disclosed estimate processes may also combine various linear and nonlinear mixtures of estimated model parameters or measured or predicted signals to classify different features of healthy and diseased tissue. An exemplary estimate process can use estimated values for isotropic restricted diffusion within spherical geometries to characterize the properties of tumor tissue and distinguish it from healthy tissue in terms of its histological properties (e.g., cell size, density, etc), spatial extent (e.g., tumor size, shape), severity (e.g., tumor grading), and changes over time of these parameters or measurements. Moreover, the disclosed technology may use various linear and nonlinear combinations of estimated model parameters and or measured or predicted signals over multiple time points to quantify changes of biological tissue parameters over time. For example, an exemplary estimate process can use changes in isotropic restricted diffusion to measure changes in tumor cellularity over time, e.g., changes in tumor cellularity with or without treatment. The disclosed technology may also use these measures to predict various clinical outcomes, e.g., such as predict the probability of tumor recurrence in patients.

In another aspect of the disclosed technology, methods, devices and systems can be used for optimizing the acquisition MRI data to be analyzed using the disclosed RSI techniques for estimating the biological tissue parameters of interest. For example, an exemplary optimization process can include using the bias variance tradeoff in the exemplary linear mixture model to optimize the acquisition of diffusion MRI signals, e.g., on different MRI hardware and software systems with various constraints or limitations on the scan time, SAR and gradient slew rate, etc., to estimate the disclosed model parameters with minimum expected mean squared error. More specifically, the exemplary MRI data acquisition optimization process can be implemented based on statistical efficiency optimization (e.g., the accuracy with which parameters can be estimated from the diffusion data in a given amount of imaging time) developed by N. S. White and A. M. Dale in 2009 as described in the scientific journal Human Brain Mapping 30: pp. 3696-3703 entitled "*Optimal Diffusion MRI Acquisition for Fiber Orientation Density Estimation: An Analytic Approach*". For example, the spherical harmonics (SH) can be used to form an explicit analytic expression for the efficiency of the minimum variance (maximally efficient) linear unbiased estimator of the FOD. Using this exemplary expression, optimal b-values can be calculated for maximum FOD estimation efficiency with SH expansion orders of L=2, 4, 6, and 8 to be approximately b=1,500, 3,000, 4,600, and 6,200 s/mm$^2$, respectively. The arrangement of diffusion directions and scanner-specific hardware limitations may play a role in determining the realizable efficiency of the FOD estimator that can be achieved in practice. Thus, the exemplary statistical efficiency optimization technique can select diffusion directions in MRI based on maximizing the statistical efficiency. For example, scanner-specific hardware limitations can be incorporated to determine the optimal b-values (e.g., that can be just slightly lower than the ideal (theoretical) b-values). The analytic expression for the statistical efficiency of the unbiased FOD estimator can be used to describe tradeoffs between angular resolution, b-value, and FOD estimation accuracy.

An exemplary technique to optimize the acquisition of MRI data to be analyzed using the disclosed RSI techniques, e.g., by determining exemplary MRI pulse sequence parameters that maximize the statistical efficiency. The efficiency of an estimator, which can also be viewed as a measure of the expected accuracy of the estimator, can be defined as the reciprocal of estimator variance per unit scan time:

$$E = \langle |f-\hat{f}|^2 \rangle^{-1}/T \quad [13a]$$

where $\langle \cdot \rangle$ is the expectation operator, and T is the total time required for the acquisition. For example, T can be set to 1 (e.g., assuming a constant scan time). For example, f can represent an efficient unbiased estimate of the FOD by an ordinary least-squares (OLS) solution:

$$\hat{f} = (R_L^H R_L)^{-1} R_L^H \bar{s} = Y_L(x) Z_L^{-1} Y_L^H(r) \bar{s} \quad [13b]$$

For example, combining Eqs. [13a] and [13b], the following expression for the efficiency of the OLS FOD estimator can be represented as:

$$E = \langle |f - Y_L(x) Z_L^{-1} Y_L^H(r) \bar{s}|^2 \rangle^{-1}. \quad [13c]$$

Substituting the expression for the normalized signal $\bar{s}$ (e.g., $\bar{s} = R_L f + \bar{n}$) and simplifying can determine:

$$E = \langle \|Y_L(x) Z_L^{-1} Y_L^H(r)\bar{n}\|^2 \rangle^{-1}. \quad [13d]$$

in which $\bar{n}$ represents white noise with mean zero and variance $\sigma_n^2$, and the expression for the efficiency of the OLS FOD estimator $\hat{f}$ can be represented by:

$$SNR \triangleq s_0/\sigma_n.$$

$$E = \frac{1}{\text{trace}(\sigma_n^2/s_0^2 \cdot Z_L^{-2})} = \frac{1}{\sigma_n^2/s_0^2 \cdot \sum_i z_i^{-2}} = SNR^2 \frac{1}{\sum_i z_i^{-2}} \quad [13e]$$

where the root mean squared (RMS) signal-to-noise ratio (SNR) is defined as

For example, the expression for the efficiency of the OLS FOD estimator in Eq. [13e] can be considered as ideal in the sense that it assumes a continuous sampling of measurement directions and FOD reconstruction points (e.g., as M, N→∞) and pulse-sequence parameters that are independent of the b-value. However, for example, the realizable efficiency of the exemplary FOD estimate can depend on the efficiency of gradient sampling vectors in r, and the dependence of the echo-time (TE) and repetition time (TR) on the b-value. For example, an expression for the realizable efficiency $\tilde{E}$ of the exemplary FOD estimator (per unit scan time) can be represented as:

$$\tilde{E} \approx \frac{(SNR_0 \cdot e^{-TE(b)/T_2})^2}{TR(b)} \cdot \frac{1}{M \cdot \sum_i \gamma_i^{-2}(r,x)} \quad [13f]$$

where $SNR_0$ is the SNR in RMS units at TE=0 and b=0, $\gamma_i(r,x)$ is the i-th singular value of an exemplary forward convolution matrix R(r,x), and i=1, 2, . . . , p is the spherical harmonic index for an L-th order series expansion. For example, the first term on the left hand side of Eq. [13f] can be considered as a reduction in efficiency due to constraints imposed by the pulse-sequence and scanner hardware, while the second term on the right hand side of Eq. [13f] can be considered as the relative efficiency of the gradient sampling scheme. For example, the expression for the realizable efficiency $\tilde{E}$ may include computing the singular values numerically.

Some exemplary applications of the disclosed RSI technology are described.

Figure 12A:
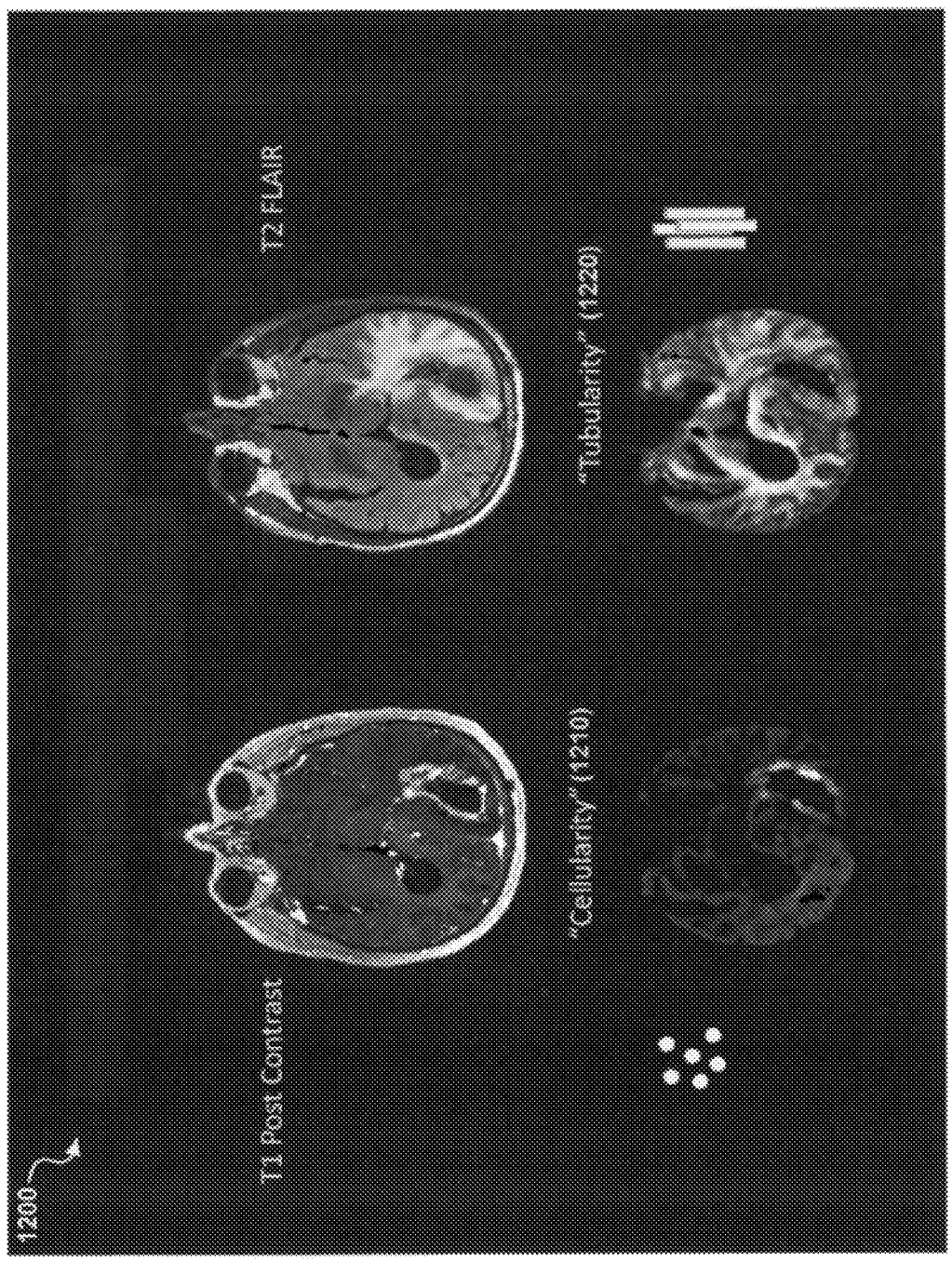
FIG. 12A shows a diagram of an exemplary application of the disclosed technology to a subject with a glioblastoma.

In one example, FIG. 12A shows a diagram 1200 of an exemplary application of the disclosed technology to a subject with a glioblastoma. The diagram includes an image 1210 representing the "cellularity" and an image 1220 representing "tubularity", which were generated using disclosed RSI technology. For example, the linear mixture model included components that modeled isotropic restricted diffusion, isotropic hindered diffusion, anisotropic (oriented) restricted diffusion, and anisotropic (oriented) hindered diffusion. The predicted signal from isotropic restricted component was used to generate the exemplary "cellularity" map, while the estimated model parameters for the anisotropic restricted component was used to generate the exemplary "tubularity" map, which is map of oriented white matter.

Figure 12B:
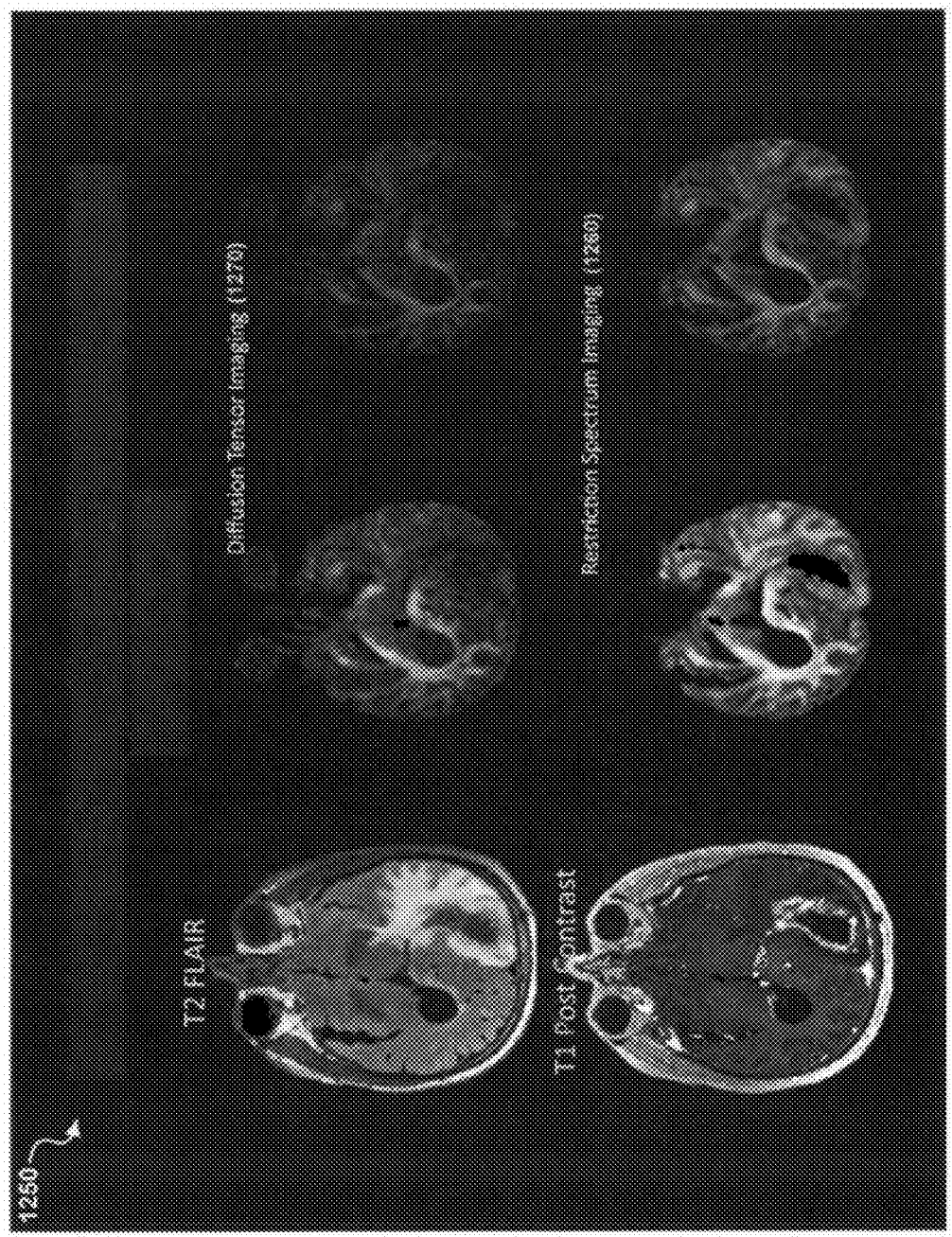
FIG. 12B shows a diagram of an exemplary comparison of the disclosed technology with diffusion tensor imaging techniques.

FIG. 12B shows a diagram 1250 of an exemplary comparison of the disclosed technology with diffusion tensor imaging techniques. The diagram 1250 includes RSI images 1260 and DTI images 1270 showing a "tubularity" measure that provides a characterization of white matter tissue, which is shown in regions of edema (e.g., hyper-intense area in T2 FLAIR) surrounding the tumor. For example, the exemplary red-green-blue images quantify the 3D orientation of white matter. The exemplary red-green-blue image of the RSI images 1260 provides substantially improved resolution and performance over the corresponding exemplary red-green-blue image of the diffusion tensor imaging technique (DTI images 1270).

In another aspect, the disclosed RSI technology can be used to estimate cell sizes and densities in vivo.

The disclosed RSI spectrum model can be used to separate hindered and restricted diffusion compartments in tumors. For example, extending the exemplary RSI model for estimating these quantities can include expanding the isotropic restricted component of the spectrum to reflect the predicted signals from cells along a spectrum of diameters. These exemplary predicted intracellular signals can be generated, for example, using Monte Carlo simulations, as described in further detail below. For example, diffusion theory suggests that intracellular water should be more easily distinguished based on their fluctuations as a function of diffusion time $\Delta$ (e.g., rather than predicting signal changes as a function of b-value alone). This can result from increased sensitivity to compartments with larger diameters as one allows more time (e.g., increased $\Delta$) for water molecules to "fill" their respective compartments. This exemplary concept is applicable based on the assumption that intracellular water signal is restricted over the time scales of the experiment and exchange with the extracellular compartment is negligible.

Figure 13:
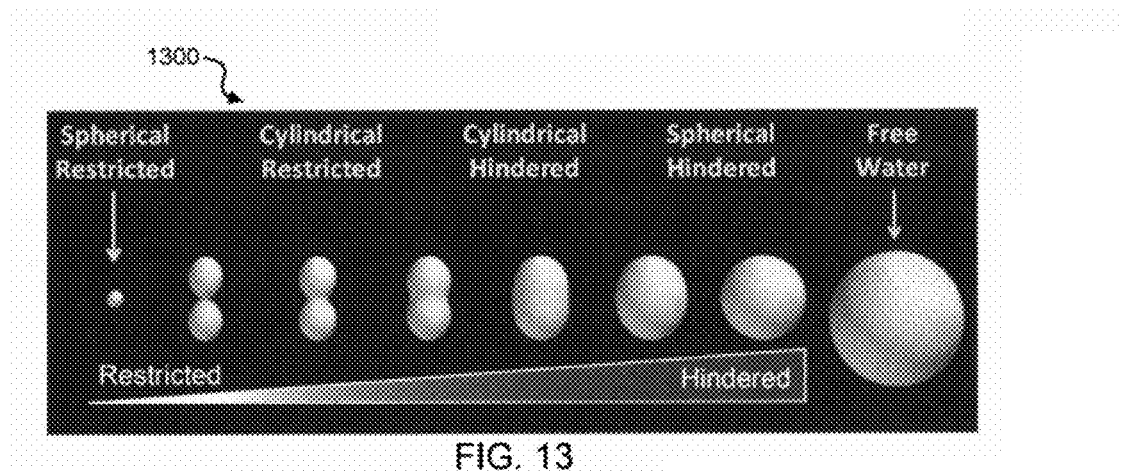
FIG. 13 shows an exemplary RSI apparent diffusion spectrum.

FIG. 13 shows an exemplary RSI apparent diffusion spectrum 1300. For example, the spectrum 1300 shows exemplary geometries representing restricted and hindered diffusion, e.g., including spherical restricted and spherical hindered diffusion, cylindrical restricted and cylindrical hindered diffusion, and free water diffusion.

Figure 14:
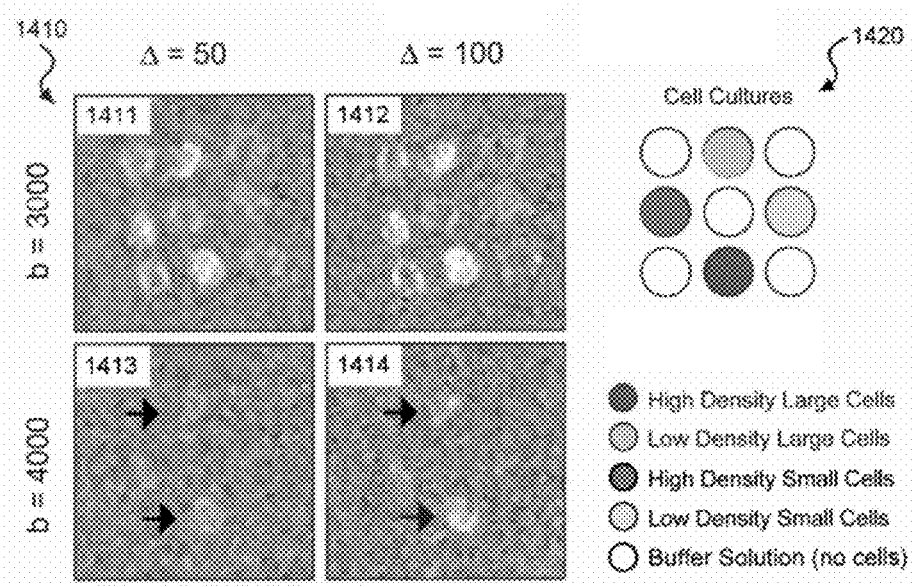
FIG. 14 shows a diagram demonstrating the application of exemplary RSI techniques to measure cell size and density.

Exemplary implementations of the exemplary RSI technology to estimate cell sizes and densities were performed in a well-controlled cell culture phantom with two different cell types (e.g., including diameter ranges) and two different concentrations (densities), which is shown in FIG. 14.

FIG. 14 shows a diagram 1410 demonstrating the application of an exemplary RSI technique to measure cell size and density, e.g., using multi-diffusion time, multi-b-value sequences on clinical scanners. In this example, an MRI phantom housing nine separate pipet bulbs (samples) of different solutions was scanned on a clinical 3T system with an 8-channel head coil. Diagram 1410 includes a diagram map 1420 of the exemplary nine cell samples. Four of the exemplary samples contained cultures of large (HeLa) and small (Jurkat) diameter cells with high and low concentrations (densities). All other exemplary samples were filled with buffer solution (controls). The relative density of cells can be distinguished on the basis of the intracellular water signal at b=3000 (images 1411, 1412), while their diameters can be distinguishing by varying the diffusion time Δ (e.g., only signal from large diameter cells enhance with increases A at a fixed b-value, images 1413, 1414). The exemplary images 1411, 1412, 1413, and 1414 were plotted on the same scale.

For example, both cell density and diameter can be distinguished on the basis of the intracellular water signal as a function of b-value and Δ. For example, the diagram 1410 shows signal enhancement in large cells when varying Δ from 50 to 100 msec at a fixed b-value (e.g., hindered extracellular water is nulled). This exemplary result is consistent with the large diameter cells transitioning from a partially filled to completely filled state. Moreover, for example, this enhancement did not occur with small diameter cells, whose compartments were completely filled over both diffusion times. For example, the diagram 1410 shows the relative densities of both small and large diameter cells can be distinguished on the basis of their signal magnitude at a given b-value. These exemplary results demonstrate the feasibility of probing both cell size and density with extended multi-diffusion time, multi-b-value RSI acquisitions on clinical scanners.

In another aspect, the disclosed RSI technology can include a spectrum-derived cellularity index (RSI-CI) for each voxel of MRI data. The exemplary RSI-CI can maximize sensitivity to the spherical restricted compartment, e.g., which can be used to identify tumor tissue in cancer tissue with sensitivity and specificity.

Diffusion-weighted magnetic resonance imaging (DW-MRI) can non-invasively measure tissue microstructure by assessing the water diffusion properties of tissue in vivo at the microscopic scale. The physical basis of DW-MRI relies on the random thermal displacements of water molecules that take place during the experimental diffusion time (e.g., between 50-100 ms). During this time, water molecules can travel distances on the order of 1-15 μm, constantly bouncing off and interacting with various structures, e.g., such as cell membranes, macromolecules, and organelles. The combined effect of these obstacles can be to both hinder and restrict the otherwise free diffusion of water in the medium, e.g., which can result in a reduction in the DW-MRI measured, referred to as apparent diffusion coefficient (ADC). For example, ADC measurements can often overlook the fact that diffusion hindrance and restriction are different physical processes, which can provide differential information about the pathophysiological state of tissue.

The dissociation of hindered and restricted diffusion pools within voxels may offer a mechanism through which primary tumor and secondary physiological effects can be separated. The disclosed RSI technology can be used to resolve a range of hindered and restricted diffusion pools within voxels over a spectrum of length scales of spherical and cylindrical geometries. For example, the described RSI-CI techniques can isolate the spherically restricted water fraction and thereby achieve greater sensitivity and specificity for detecting tumor (e.g., in the presence of edema) and distinguishing it from normal appearing white matter (NAWM). Exemplary implementations using the disclosed RSI technology demonstrated the ability of exemplary RSI-CI techniques in distinguishing tumor from NAWM, and the results of the exemplary RSI techniques were also compared with ADC measures, e.g., at equivalent b-factors.

The exemplary implementations included performing diffusion-weighted magnetic resonance imaging (DW-MRI) on four exemplary pre-surgical patients with biopsy-confirmed glioblastoma multiforme (GBM) using four b-factors (e.g., 0, 500, 1500, and 4000 sec/mm$^2$) and diffusion directions (e.g., 0, 6, 6, and 15) for each b-factor, respectively. The exemplary RSI analysis was implemented, which includes fitting a spectrum of spherical and cylindrical hindered and restricted compartments over a range of length scales to the DW-MR data, and computing a spectrum-derived cellularity index (RSI-CI) for each voxel which maximizes sensitivity to the spherical restricted compartment. For example, the apparent diffusion coefficient (ADC) was calculated as the trace of the diffusion tensor fit to the same exemplary dataset. The sensitivity and specificity for delineating tumor from normal appearing white matter (NAWM) was assessed using receiver operating characteristic (ROC) curves and area under the curve (AUC) for RSI-CI and ADC. Results of the exemplary implementations demonstrated qualitative improvements in tumor conspicuity in RSI-CI data as compared to the ADC data for all exemplary patients. For example, ROC analysis indicated significantly greater overall accuracy of the disclosed RSI-CI technique for delineating tumor from NAWM as compared with ADC technique (e.g., mean AUC=0.976 for RSI-CI, and 0.764 for ADC, p=0.026). By separating hindered and restricted water compartments, the exemplary RSI technique provided more sensitive and specific measures of tumor pathology as compared with the ADC. The disclosed RSI-CI techniques can be used to facilitate earlier detection of residual, recurrent, and infiltrating tumor in patients with cancer (e.g., high-grade gliomas).

The exemplary implementations included the following materials and methods. For example, human subjects (also referred to as patients) were used in exemplary experiments approved by an institutional review board, and written informed consent was obtained from all patients. For example, to limit the potential confound of surgical effects, patients were included in this study if they had biopsy-proven glioblastoma multiforme (GBM) and received the exemplary RSI MRI scans prior to surgical resection. In addition, patients were excluded if they were on VEGF inhibitors (e.g., bevacizumab) at the time of the MRI scan. Four exemplary patients met the pre-surgical criteria.

For example, MR imaging was performed using an exemplary 3.0T GE Signa Excite scanner equipped with a 12-channel head coil. The exemplary imaging protocol included pre- and post-Gadolinium 3D volumetric T1-weighted IR-SPGR sequences (TE/TR=2.8/6.5 ms; TI=450 ms; FA=8°; FOV=24 cm; 0.93×0.93×1.2 mm) and a 3D T2-weighted FLAIR sequence (TE/TR=126/6000 ms; TI=1863 ms; FOV=24 cm; 0.93×0.93×1.2 mm). For RSI, a single-shot pulsed-field gradient spin-echo (PGSE) echo-planar imaging (EPI) sequence was used (TE/TR=96 ms/17 s; FOV=24 cm, matrix=128× 128×48) with 4 b-factors (b=0, 500, 1500, and 4000 s/mm$^2$), and 6, 6, and 15 unique diffusion directions for each non-zero b-factor, respectively (28 total volumes, ~8 min scan time).

For example, prior to analysis, the exemplary raw RSI data was corrected for geometric distortions caused by susceptibility, gradient nonlinearities, and eddy currents. For example, this was followed by correction of rigid-body patient motion using in-house software. The exemplary ADC was calculated using the trace of the diffusion tensor fit to the full exemplary RSI dataset (e.g., all b-factors and diffusion directions).

Figure 15:
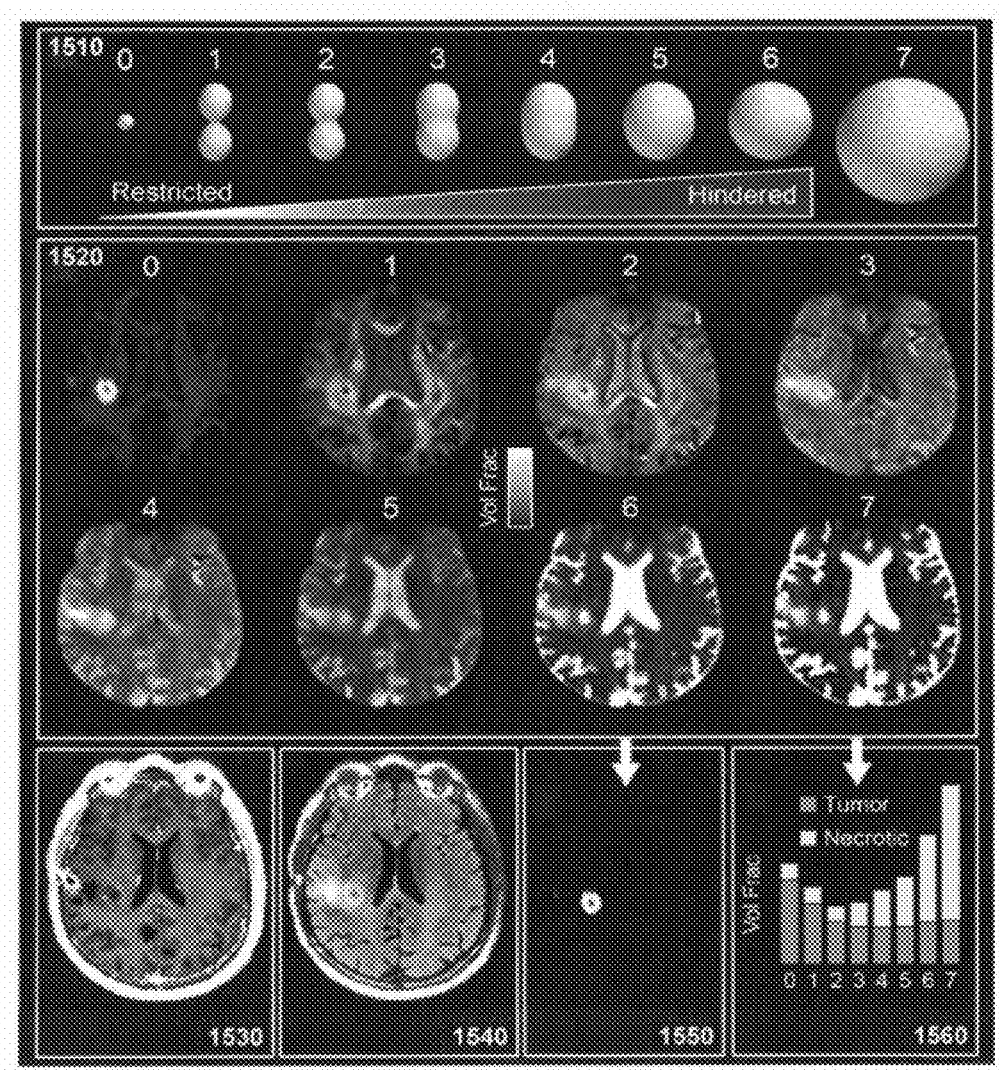
FIG. 15 shows an exemplary RSI analysis of a patient with right frontal brain tumor.

An exemplary RSI-CI analysis technique is described. For example, for fixed diffusion time acquisitions, the RSI model can be reduced to a spectrum of ADC's at each voxel of the form:

$$S = S_0 \exp\left[-b\left(\sum_i ADC_i\right)\right] \quad [14a]$$

$$ADC_i = (ADC_\| - ADC_\perp^{[i]})\cos^2\alpha + ADC_\perp^{[i]} \quad [14b]$$

where $ADC_\|$ and $ADC_\perp$ are the apparent parallel and perpendicular diffusivities of a cylindrical tissue element, $\alpha$ is the angle between the cylinder (long) axis and the diffusion gradient direction, and $S_0$ is the signal measured at b=0. For example, to define the spectrum, $ADC_\|$ was set to $ADC_\|=1\times 10^{-3}$ mm$^2$/sec and vary $ADC_\perp$ from 0 mm$^2$/sec to $ADC_{11}$ in six equally spaced steps (e.g., shown in FIG. 15, illustration 1510, exemplary scales 1-6). Two additional isotropic terms were included, e.g., one modeling restricted diffusion ($ADC_\|=ADC_\perp=0$ mm$^2$/sec, shown in FIG. 15, illustration 1510, exemplary scale 0) and one "free" water ($ADC_\|=ADC_\perp=3\times10^{-3}$ mm$^2$/sec, shown in FIG. 15, illustration 1510, exemplary scale 7). For example, to account for the unknown orientation of the cylindrical components (e.g., FIG. 15, illustration 1510, exemplary scales 1-6, where ($ADC_\|<ADC_\perp$), a spherical harmonic (SH) parameterization was used for their orientation distribution. Exemplary parameter maps were then fit to the unnormalized signal (S), which included the ADC spectrum components (e.g., as shown in the T2-weighted volume fractions, FIG. 15, images 1520) and the SH coefficients using least-squares estimation with Tikhonov regularization. An exemplary constrained minimum variance beamformer (CMVB) was used to combine the parameter maps into a single image (herein termed the "RSI cellularity index", or RSI-CI) with maximum sensitivity to spherical restricted diffusion (e.g., the exemplary scale 0), while attenuating signal from all other scales (e.g., the exemplary scales 1-7). For example, the exemplary results of implementing the described analyses are shown in subsequent figures and tables. For example, normalized RSI-CI values are presented, e.g., by dividing by the mean RSI-CI signal NAWM.

FIG. 15 shows an exemplary RSI analysis of a patient with right frontal GBM. FIG. 15 shows an illustration 1510 of the RSI ADC spectrum model, e.g., which can be used to fit the multi-b-factor DW-MRI data. The illustration 1510 includes exemplary scales 0-2 corresponding to restricted diffusion and exemplary scales 3-6 corresponding to hindered diffusion. For example, the exemplary scales 0, 6, and 7 are isotropic diffusion, while scales 1-5 represent anisotropic diffusion (e.g., oriented). FIG. 15 shows a set of images 1520 of RSI-derived (T2-weighted) volume fraction maps for each scale in the illustration 1510. FIG. 15 shows an image 1530 of T1-weighted post-contrast, an image 1540 of T2-weighted FLAIR, and an image 1550 of RSI-derived cellularity index (RSI-CI), e.g., corresponding to a weighted ("beamformed") linear combination of scales 0-7 showing maximal sensitivity to spherically restricted diffusion (scale 0). FIG. 15 shows an image 1560 of an exemplary RSI ADC "spectrum" for two representative voxels in tumor and necrotic tissue.

Figure 16:
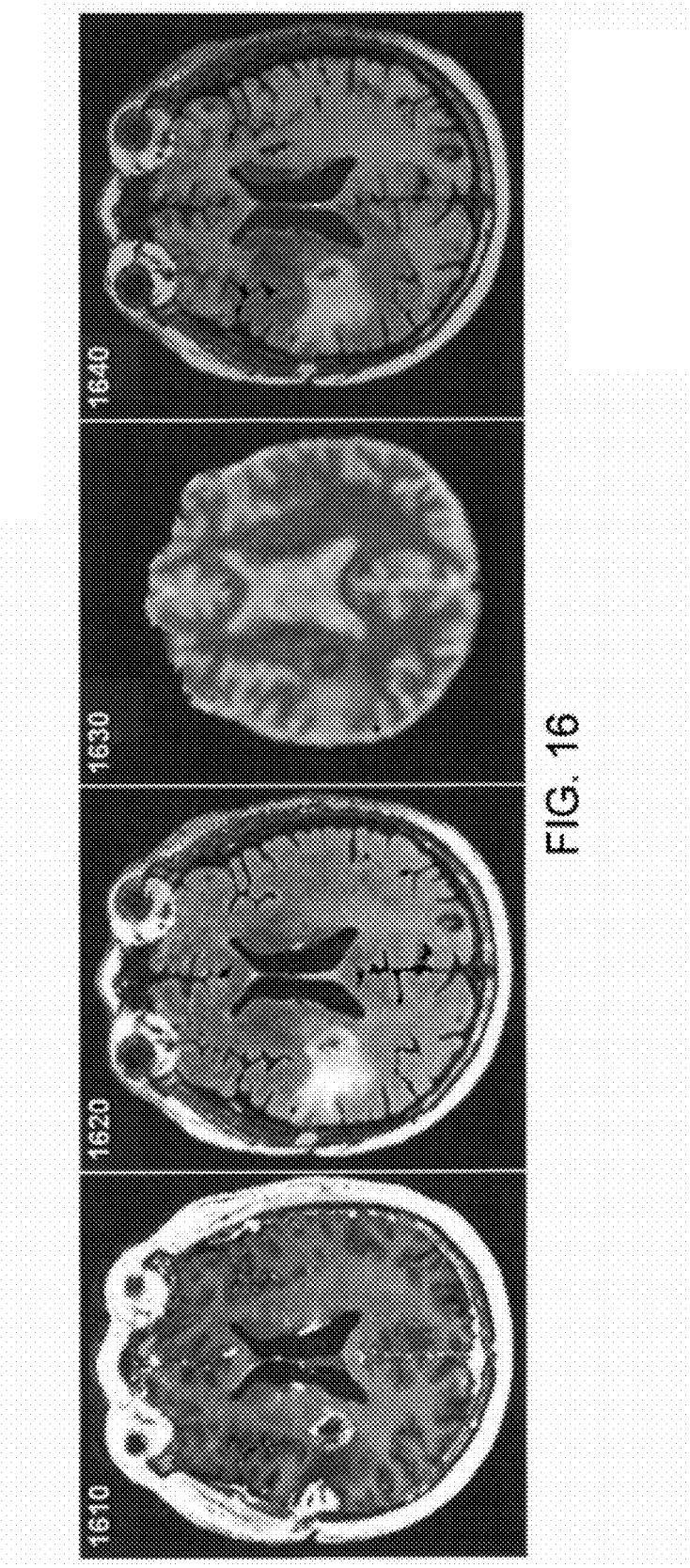
FIG. 16 shows MRI images with identified regions of interest used for analyses including an exemplary RSI-Celluarity Index (CI) analysis.

Exemplary analyses were performed for regions-of-interest (ROIs). For example, manual ROIs were drawn for tumor (Tumor) and peritumoral edema (Edema) using co-registered 3D volumetric T1 post-contrast, 3D volumetric FLAIR, and ADC maps using the Amira® software package (Visage Imaging, Inc.), e.g., manual ROIs drawn by a board certified neuroradiologist (e.g., Rater #1, NF). For example, Tumor was identified as the region of low ADC within and around the primary enhancing tumor site identified on the T1 post-contrast sequence excluding non-enhancing necrotic portions with high ADC. For example, Edema was identified as the region of hyperintensity on FLAIR surrounding the tumor site. A normal appearing white matter (NAWM) ROI was then calculated automatically on the registered 3D volumetric T1 pre-contrast sequence using NeuroQuant® software (Cortechs Labs, Inc.), which provides FDA approved grey, white, and cerebral spinal fluid (CSF) segmented volumes as well as subcortical labels. For example, to generate the NAWM ROI, the NeuroQuant® white matter segmentation volume was used and masked it with an expanded Edema ROI (e.g., eroded 2 cm in all directions) to avoid contamination with tumor infiltration. Exemplary Tumor, Edema, and NAWM ROIs are shown in FIG. 16 for a single exemplary patient. For example, to ensure the results were insensitive to variability in the manual drawing procedure, this process was repeated by a second image analysis expert with over 10 years of experience (e.g., Rater #2, NW).

FIG. 16 shows MRI images with identified ROIs used for analyses. FIG. 16 includes an image 1610 of a post-Gd T1-weighted IR-SPG, an image 1620 of T2-weighted FLAIR, an image 1630 of ADC, and an image 1640 of ROIs overlaid on the exemplary FLAIR image. The image 1641 shows a tumor (e.g., manual, red), an edema 1642 (manual, blue), and a NAWM 1643 (automated, green).

Exemplary analyses were performed for receiver operating characteristic (ROC) analysis. For example, ROC curves were used to quantify the increase in tumor conspicuity in the exemplary RSI-CI vs. ADC analysis techniques. For example, to generate the curves, the cumulative distribution of the voxel intensity histogram for Tumor (sensitivity) was plotted against NAWM (1-specificity) for each exemplary patient, and the area under the curve (AUC) was calculated.

The exemplary results of the exemplary implementations using the disclosed RSI-CI techniques to investigate the microstructural features of brain tumors in vivo are presented. For example, in contrast to traditional DWI and DTI methods, the disclosed RSI technology harnesses multi-b-value acquisitions over an extended range (e.g., $b_{max}=4000$ sec/mm$^2$) with or without multiple diffusion times to explicitly separate hindered and restricted diffusion compartments over a range (spectrum) of length scales and geometries. For example, in fixed diffusion time sequences, this can amount to fitting a spectrum of oriented (anisotropic) and un-oriented (isotropic) ADC's at each voxel. For example, the exemplary RSI spectrum-derived cellularity maps demonstrate maximize sensitivity to the spherical restricted compartment, e.g., providing significantly greater sensitivity and specificity for delineating tumor tissue (e.g., in GBM) as compared with ADC at equivalent (high) b-factors.

Figure 17:
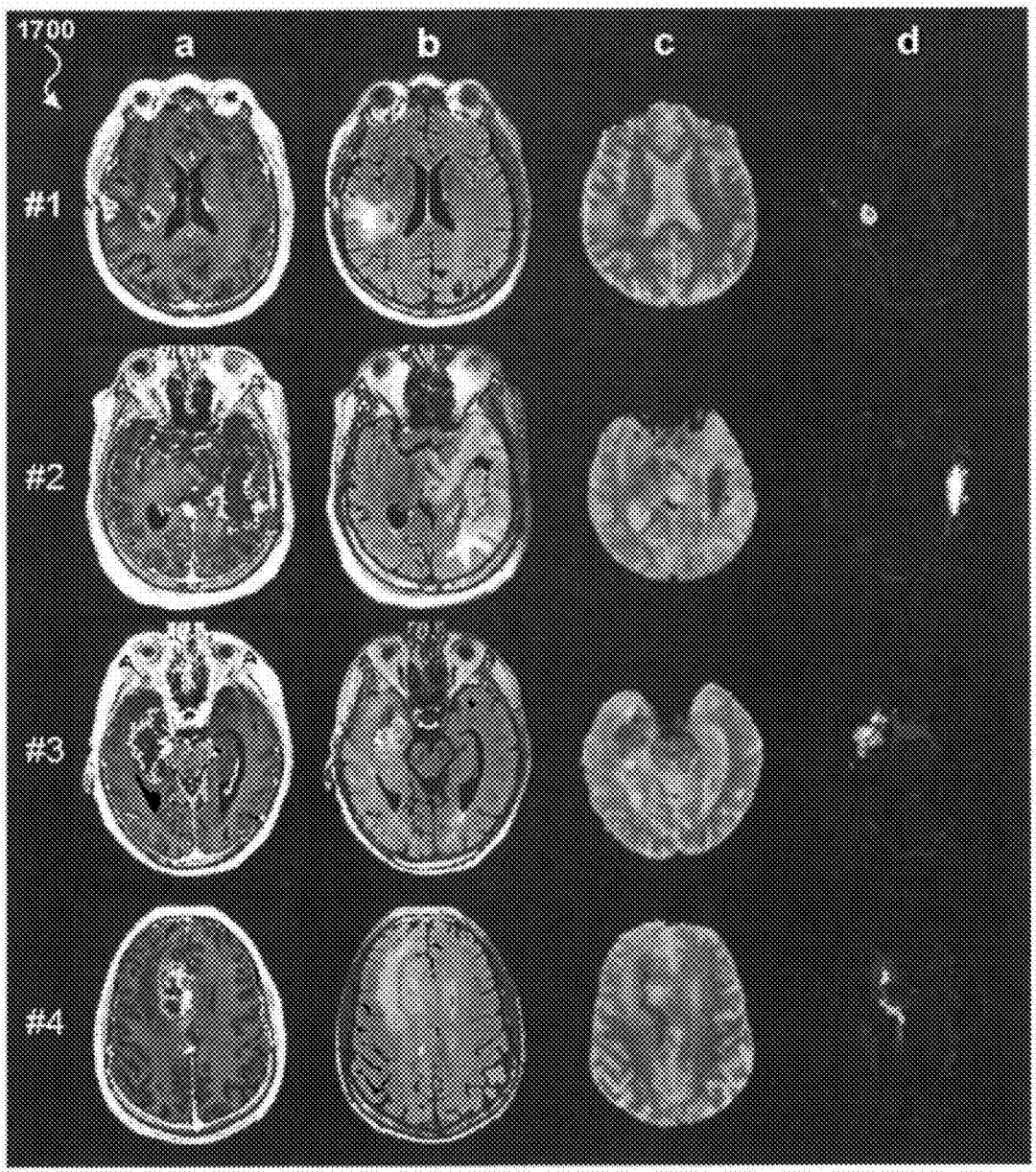
FIG. 17 shows MRI images of exemplary cancer patients.
Figure 18:
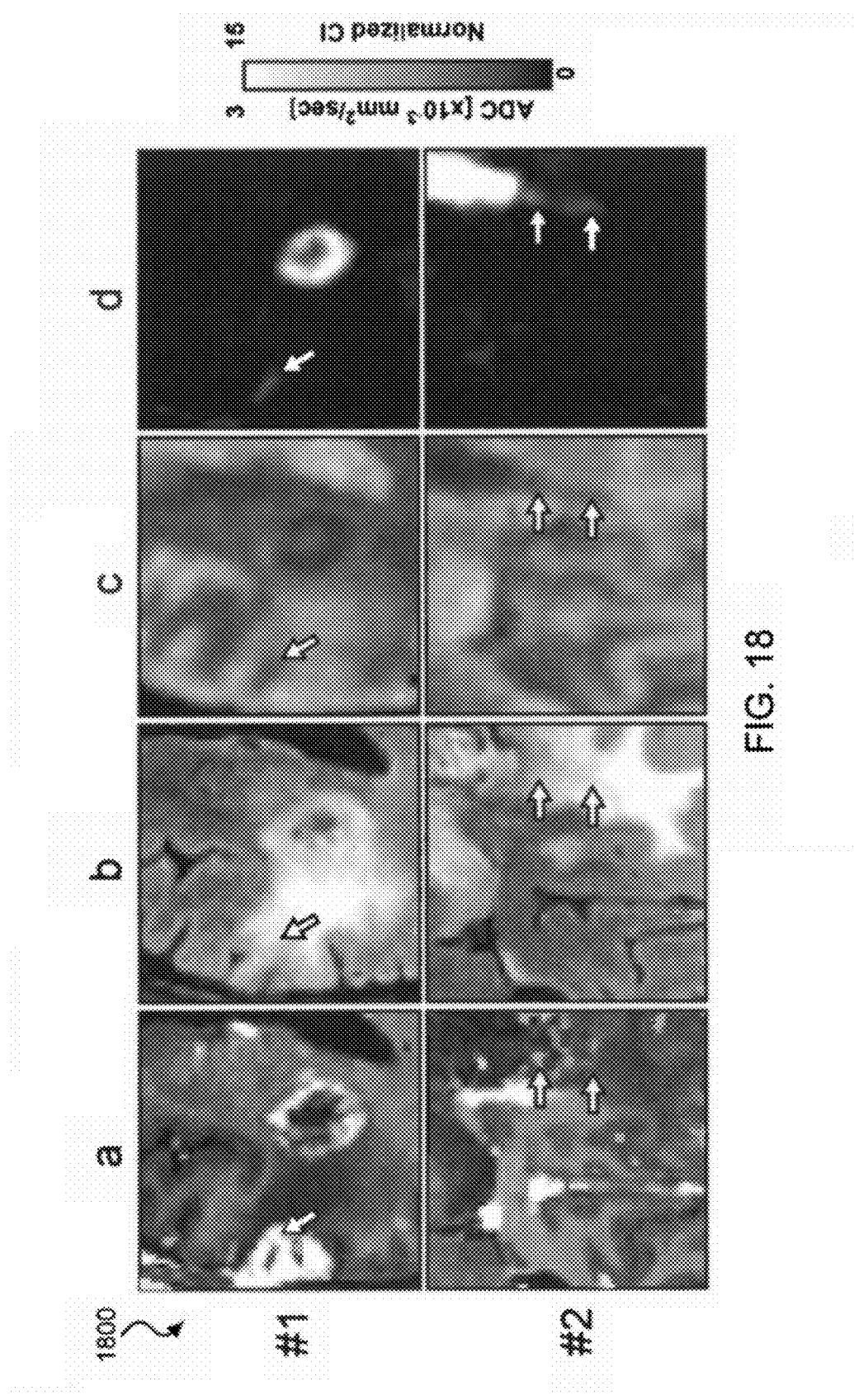
FIG. 18 shows a set of MRI images including an exemplary RSI-CI analysis.
Figure 19A:
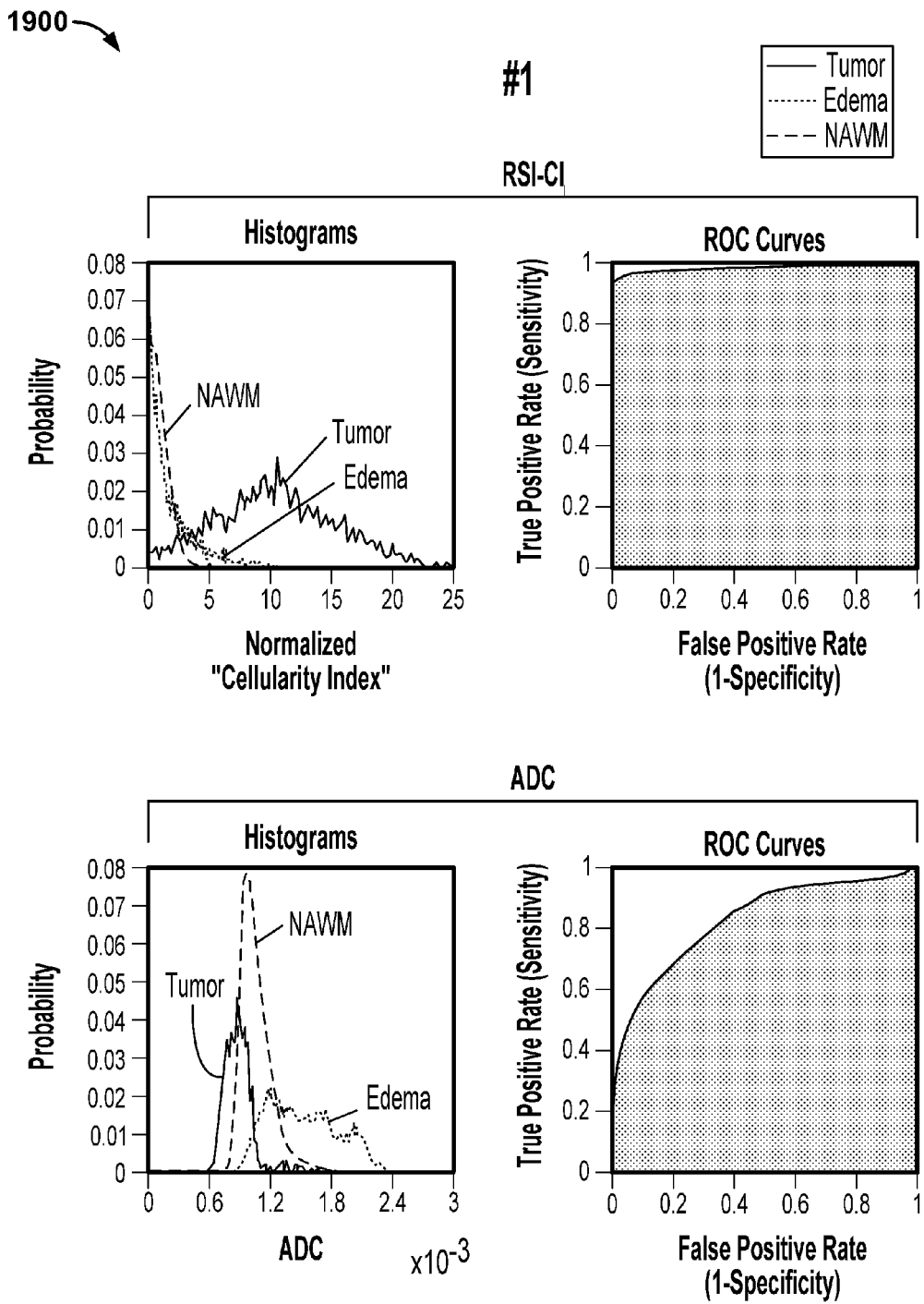
Figure 19B:
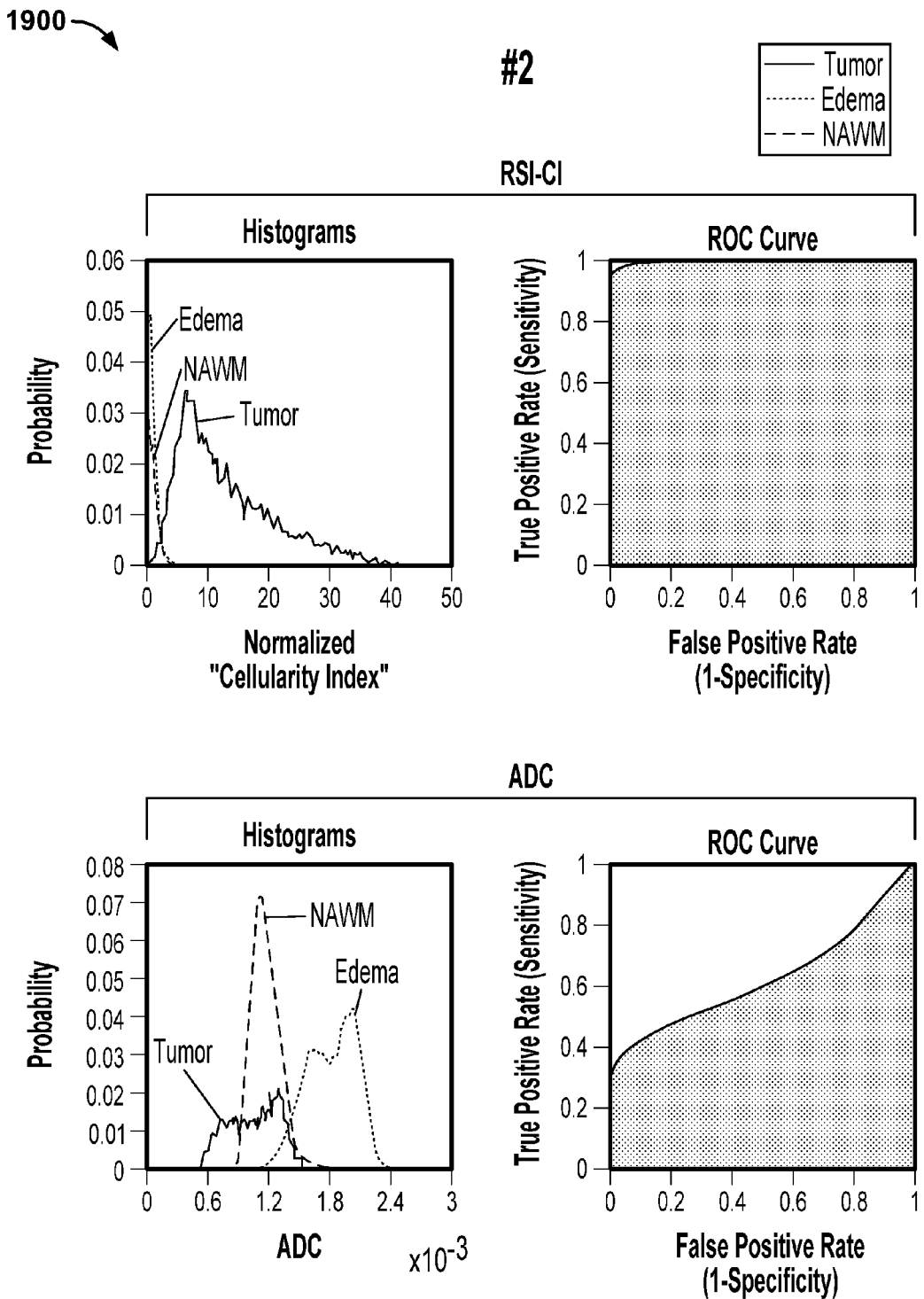
Figure 19D:
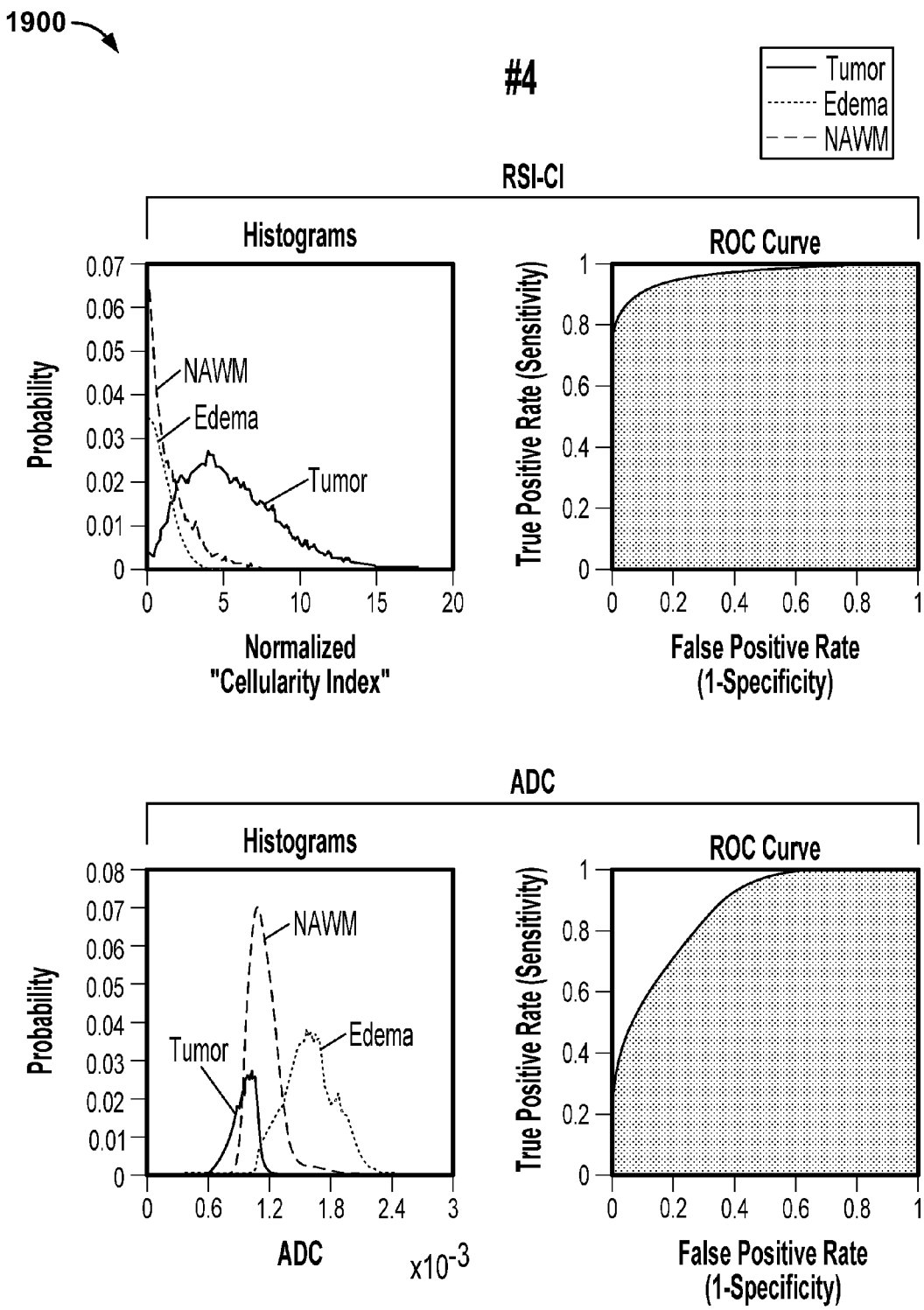

Qualitative improvements in tumor conspicuity and visualization of tumor margins was demonstrated in FIGS. 17 and 18 in the exemplary RSI-CI maps, e.g., as compared with the ADC for the exemplary patients.

FIG. 17 shows a diagram 1700 of MRI images of four exemplary GBM patients, e.g., designated as #1, #2, #3, and #4. The diagram 1700 includes exemplary MRI analyses featuring post-Gd T1-weighted IR-SPGR images in column (a), T2-weighted FLAIR images in column (b), ADC images in column (c), and RSI-CI images in column (d).

FIG. 18 shows a set of images 1800 demonstrating a close-up comparison of the exemplary RSI-CI technique versus exemplary ADC techniques, e.g., in two exemplary patients (designated as patient #1 and #2). The set of images 1800 includes exemplary MRI images of post-Gd T1-weighted IR-SPGR in column (a), T2-weighted FLAIR in column (b), ADC in column (c), and RSI-CI in column (d). The exemplary arrows in the images for patient #1 indicate a lateral region of biopsy-confirmed tumor. The exemplary arrows in the images for patient #2 indicate region of possible infiltration in non-enhancing peritumoral edema.

In all of the exemplary patients, dramatic qualitative improvements in tumor conspicuity was shown for the exemplary RSI-CI based data as compared with the exemplary ADC based data (e.g., as shown in FIG. 17). For example, for ADC, high-grade tumors appear hypointense compared with surrounding hyperintense edema and CSF, but otherwise appear relatively similar to NAWM. For RSI-CI, for example, signal from tumor is enhanced (hyperintense) while signal from all non-tumor tissue is suppressed (hypointense) leading to greater overall tumor conspicuity and delineation of tumor boarders without the need for additional thresholding.

FIGS. 19A-19D show a diagram 1900 of signal intensity histograms and ROC analysis for each of four exemplary patients (designated as patient #1, #2, #3, and #4) using ROIs from Rater #1. The exemplary ROC curves quantify the sensitivity and specificity for distinguishing Tumor from NAWM using RSI-CI (left) and ADC (right).

Table 1 includes normalized RSI-CI and ADC signal values, e.g., in all three ROIs for each patient. Also included in Table 1 are the AUC statistics for distinguishing tumor from NAWM. The exemplary signal data are mean data with standard deviation (e.g., the standard deviation shown in parentheses (std)). For example, the exemplary signal data from Rater #1 is represented as the top number within each cell, and the Rater #2 as the bottom number within each cell. For example, the AUC were significantly higher for exemplary RSI-CI data as compared with ADC data for both Rater #1 ($p=0.026$) and Rater #2 ($p=0.006$). For example, statistical differences in the AUC statistic were assessed using two-sample t-tests assuming unknown and unequal means and variances.

The exemplary quantitative ROC analysis indicated greater sensitivity and specificity for distinguishing Tumor from NAWM using the described RSI-CI technique as compared with ADC for each exemplary patient (FIGS. 19A-19D). For example, the overall classification accuracy in distinguishing Tumor from NAWM, as assessed with the AUC, was also significantly greater in the exemplary RSI-CI data as compared with ADC across all exemplary patients (e.g., mean AUC=0.976 for RSI-CI and 0.764 for ADC, $p=0.026$). These exemplary results were subsequently confirmed using ROIs drawn by Rater #2 (mean AUC=0.940 for RSI-CI and 0.641 for ADC, $p<0.006$) (Table 1). For example, as shown in Table 1, the exemplary RSI-CI signal values of tumor were shown to be 8.9 times greater (on average) than NAWM, and some portions exceeding 30 times greater (as shown in FIGS. 19A-19D and Table 1, e.g., exemplary patient #2). For example, in comparison, the mean ADC signal was on average 0.87 times lower in tumor compared with NAWM (as shown in Table 1).

The disclosed RSI technology can provide detailed characterization of the microscopic diffusion properties of biological tissue. For example, by harnessing DW-MRI data collected with multiple b-factors over an extended range ($b_{max}=4000$ sec/mm$^2$), the exemplary RSI techniques can allow intravoxel hindered and restricted diffusion to be separated along a spectrum of length scales and spherical and cylindrical geometries. The exemplary RSI-CI techniques can provide maximum sensitivity to spherical restricted diffusion, greater tumor delineation from normal appearing white matter, and accurate identification of early infiltrating tumor in peritumoral edema. Also, for example, the disclosed RSI spectrum-derived cellularity index can be applied to monitor changes in tumor pathology over time, to distinguish tumor recurrence from radiation induced-necrosis, and to provide in vivo tumor grading.

In other exemplary implementations of the disclosed RSI-CI techniques, prostate cancer detection was examined.

For example, distinguishing indolent disease from aggressive disease is a major concern in prostate cancer detection. The serum prostate-specific antigen (PSA) test is a primary prostate screening biomarker with the digital rectal exam (DRE) as an adjunct. However, for example, after more than 20 years of PSA screening, perhaps a million men may have

TABLE 1

| Patient | Normalized RSI-CI | | | | ADC [$\times 10^{-3}$ mm$^2$/sec] | | | |
|---|---|---|---|---|---|---|---|---|
| | Tumor | NAWM | Edema | AUC | Tumor | NAWM | Edema | AUC |
| #1 | 10.50 | 1.00 | 1.80 | 0.986 | 0.89 | 1.00 | 1.24 | 0.824 |
| | (4.89) | (0.74) | (1.93) | | (0.14) | (0.12) | (0.26) | |
| | 8.10 | 1.00 | 1.35 | 0.917 | 0.99 | 1.00 | 1.27 | 0.585 |
| | (5.50) | (0.74) | (1.60) | | (0.23) | (0.12) | (0.31) | |
| #2 | 13.13 | 1.00 | 0.99 | 0.997 | 1.04 | 1.12 | 1.81 | 0.628 |
| | (7.95) | (0.75) | (0.88) | | (0.25) | (0.14) | (0.30) | |
| | 12.49 | 1.00 | 0.99 | 0.993 | 1.07 | 1.12 | 1.81 | 0.528 |
| | (7.99) | (0.75) | (0.87) | | (0.26) | (0.14) | (0.30) | |
| #3 | 6.32 | 1.00 | 2.92 | 0.955 | 1.05 | 1.16 | 1.34 | 0.737 |
| | (3.64) | (0.79) | (2.21) | | (0.18) | (0.13) | (0.17) | |
| | 5.70 | 1.00 | 2.86 | 0.919 | 1.02 | 1.16 | 1.40 | 0.729 |
| | (3.75) | (0.79) | (1.80) | | (0.17) | (0.13) | (0.14) | |
| #4 | 5.50 | 1.00 | 1.55 | 0.965 | 0.95 | 1.10 | 1.41 | 0.867 |
| | (3.00) | (0.77) | (1.50) | | (0.11) | (0.12) | (0.21) | |
| | 4.93 | 1.00 | 1.28 | 0.931 | 0.98 | 1.10 | 1.44 | 0.723 |
| | (3.01) | (0.77) | (1.24) | | (0.12) | (0.12) | (0.22) | |
| Mean | 8.86 | 1.00 | 1.82 | 0.976 | 0.98 | 1.13 | 1.45 | 0.764 |
| | 7.81 | 1.00 | 1.62 | 0.940 | 1.02 | 1.10 | 1.48 | 0.641 | been over-diagnosed and unnecessarily treated for clinically insignificant prostate cancer. In patients who screen positive, the next step can include a systematic, template-based, transrectal, ultrasound-guided biopsy of the prostate gland, which is an invasive procedure with significant complications. Systematic random biopsies can be prone to under-sampling and under-estimation of Gleason grade.

The disclosed RSI technology can be implemented to resolve a range of hindered and restricted diffusion pools over a spectrum of spherical and cylindrical geometries in prostate cancer, e.g., using the described RSI-CI techniques. For example, by isolating the spherical restricted compartment from the cylindrically restricted and hindered compartments, RSI-CI can provide significantly greater accuracy in distinguishing tumor from normal healthy cells. For example, the RSI-CI can correlate with higher tumor grade based on Gleason score and can provide significantly greater accuracy in discriminating aggressive from indolent lesions.

Figure 20A:
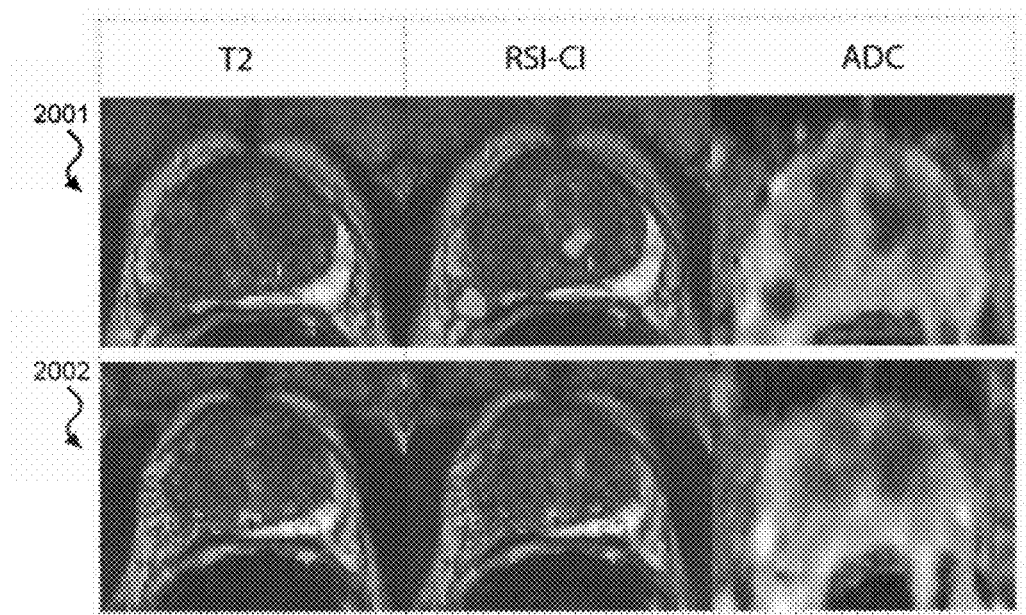
FIGS. 20A and 20B show sets of MRI images including an exemplary RSI-CI analysis of prostate cancer.
Figure 20B:
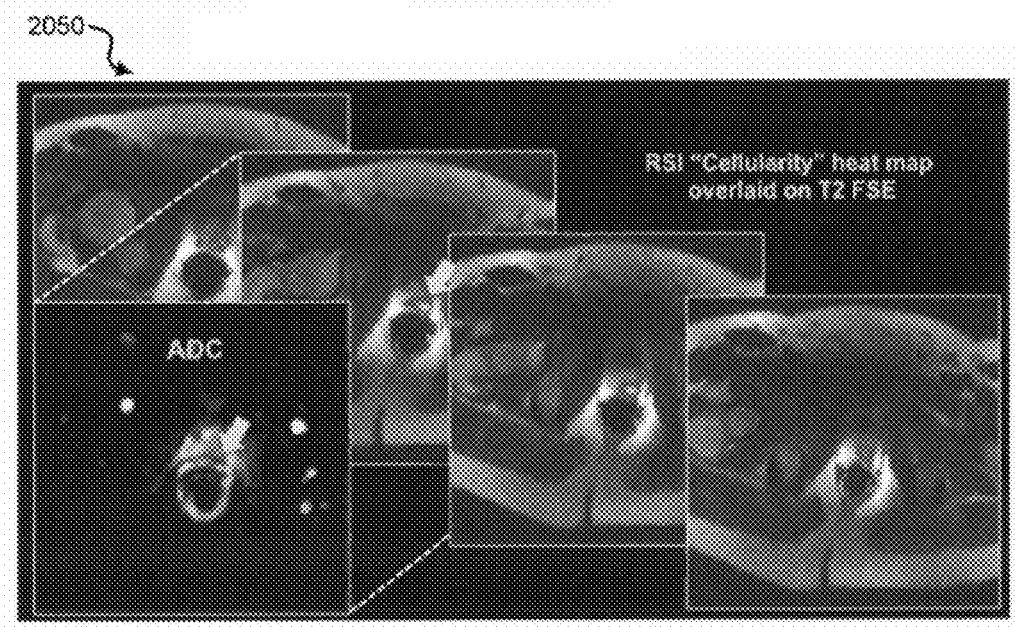

Exemplary implementations were performed in two patients with prostate cancer to produce the described results herein. For example, the prostate cancer appears conspicuous on RSI-CI compared with ADC. FIG. 20A shows a set of MRI images 2001 and 2002 including T2, ADC, and an exemplary RSI-CI based analyses in a patient with prostate cancer. FIG. 20B shows a series of MRI images 2050 of another exemplary RSI analysis in a patient with prostate cancer. For example, the identified color region of the image 2050 represents the RSI-CI heat map overlaid on the exemplary T2 FSE image.

In another aspect, the disclosed RSI technology can be implemented in tractography applications, e.g., including analysis of white matter architecture, even in the presence of inflamed tissue.

Tractography techniques in diffusion MRI can be used in reconstructing white matter tracts, e.g., in patients with brain tumors such as gliomas. For example, tractography can include producing two- and three-dimensional representations of the location and orientation of critical white matter tracts relative to the main tumor margins. For example, in clinical practice, these exemplary tools can rely on estimates of the strength of directionality of diffusion (also referred to as fractional anisotropy (FA)). For example, large FA values suggest highly anisotropic diffusion, e.g., which can suggest highly organized white matter structure. Low FA values can suggest disruption to the organization of fibers due to demyelination, axonal loss, and/or other processes of cellular degeneration. However, for example, delineating white matter tracts in regions of vasogenic edema surrounding a tumor can be complicated due to the limited ability to probe information on fiber tract orientation in regions of extremely low FA.

The disclosed RSI technology can provide the ability to accurately estimate the location and integrity of fiber tracts, e.g., in peritumoral tissue. Implementations of the disclosed RSI techniques can provide critical information used for surgical planning. Exemplary RSI techniques can probe the orientation of tissue microstructures over a spectrum of length scales and geometries, and therefore recover complex information on fiber tract orientation in regions of edema. For example, RSI uses multiple b-values to separate hindered from restricted diffusion pools and can remove the fast, hindered volume fraction associated with edema. For example, RSI modeling of the slow, restricted component increases the sharpness of the estimates, allowing for a better estimation of fiber tract orientation. For example, the exemplary RSI techniques can be used to provide quantification and visualization of white matter tracts, e.g., in regions of peritumoral edema, as well as other states of tissue inflammation or damaged and/or diseased tissue, e.g. including tissue affected by sclerosis, stroke, and tumor infiltration. For example, the disclosed RSI methods can be used to guide neurosurgical planning and limit postoperative morbidity in patients with a variety of brain tumors and other lesions complicated by edema.

For example, for patients with high grade gliomas, gross total resection can significantly prolong survival, increase time to progression, reduce seizures, and improve symptoms resulting from mass effect. However, extensive resection of tumor and peritumoral tissue has the potential to increase neurological and cognitive morbidity when resections include projection fibers or long-range association fibers that connect areas of eloquent cortex. Specifically, damage to the corticospinal tract (CST) can result in a temporary or permanent hemiparesis, damage to the superior longitudinal fasciculus (SLF) that may cause language disturbance, and damage to the optic radiations that may result in visual field defects.

Exemplary tractography implementations of the disclosed RSI technology were performed to quantify and visualize white matter anatomy in regions of edema (e.g., baseline) relative to when the edema has at least partially resolved (follow-up). For example, RSI-based fractional anisotropy (RSI-FA) estimates of fiber tracts within regions of edema are shown to be similar to RSI-FA estimates obtained within normal appearing white matter (NAWM). For example, RSI-FA estimates obtained in regions of edema at baseline approximated RSI-FA values obtained at follow-up in the same regions once the edema has resolved.

The exemplary tractography implementations of the disclosed RSI technology included the following exemplary materials and procedures. Human subjects underwent RSI and standard DTI analyses at baseline (with edema) and at follow-up (edema partially resolved). Fractional anisotropy (FA) values obtained with exemplary RSI and DTI techniques were compared within regions of edema and normal appearing white matter (NAWM) at both time points.

For example, human subjects (also referred to as patients) were used in exemplary experiments approved by an institutional review board, and written informed consent was obtained from all patients. Exemplary patients included consecutive patients with biopsy-confirmed high-grade gliomas who showed (1) evidence of peritumoral edema at baseline and (2) partial or complete resolution of the edema on follow-up imaging. Ten exemplary patients included five with glioblastoma multiforme (GBM), two with anaplastic astrocytomas (AA), two with oligoastrocytomas, and one with an anaplastic glioneural neoplasm.

Exemplary MRI scans were performed on a 3.0T GE Signa Excite scanner. The exemplary imaging protocol included a pre- and post-Gadolinium 3D volumetric, $T_1$-weighted, inversion recovery spoiled gradient echo (IR-SPGR) (TE/TR=2.8/6.5 ms; TI=450 ms; FA=8°; FOV=24 cm; 0.93×0.93×1.2 mm; sagittal), a 3D $T_2$-weighted fluid attenuated inversion recovery (FLAIR) sequence (TE/TR=126/6000 ms; TI=1863 ms; FOV=24 cm; 0.93×0.93×1.2 mm; sagittal), and for diffusion MRI, a single-shot pulsed-field gradient spin-echo (PGSE) echo-planar imaging (EPI) sequence (TE/TR=96 ms/17s; FOV=24 cm, matrix=128×128×48; axial). Exemplary diffusion data were acquired with b=0, 500, 1500, and 4000 s/mm², with 1, 6, 6, and 15 unique gradient directions for each b-value, respectively (e.g., 28 total, total time ~8 min). The exemplary diffusion data were then corrected offline for spatial distortions associated with susceptibility and eddy currents, and registered to the 3D anatomical scans.

For example, all image data were pre-processed using MATLAB. Structural scans, including $T_1$-weighted pre- and post-contrast images and $T_2$-weighted FLAIR images were corrected for distortions due to gradient nonlinearities (e.g., gradient unwarping) and rigidly-registered to each other using mutual information. Rigid registration of the structural data to a $T_1$-weighted head atlas was performed using the $T_1$-weighted pre-contrast image, corrected for regions of hypointensity caused by edema using the $T_2$-weighted FLAIR. Exemplary diffusion MRI data were corrected for eddy current distortions using a least squares inverse and iterative conjugate gradient descent method to solve for 12 scaling and translation parameters describing eddy current distortions across the entire diffusion MRI scan, explicitly taking into account the orientations and amplitudes of the diffusion gradient. For example, head motion was corrected by rigidly-registering each diffusion-weighted image to a corresponding image synthesized from a tensor fit to the data. For example, spatial and intensity distortions caused by B0 magnetic field inhomogeneities were corrected using the reversing gradient method. Distortions caused by gradient nonlinearities in the exemplary diffusion data were corrected by applying a predefined, scanner specific, nonlinear transformation. For example, while exemplary diffusion data were post-processed in native space (described below), the derived images (FA and tensor parameters) were resampled into atlas space by first rigidly-registering the non-diffusion weighted (b=0) volume to the $T_2$-weighted FLAIR volume, and then applying the rigid-body registration to atlas computed from the structural data. All exemplary image data from each subject were visually inspected to ensure registration accuracy and any datasets with severe scanner artifacts or excessive head motion were excluded.

For example, both DTI-FA and RSI-FA values were calculated from the entire diffusion dataset (e.g., all b-values). For example, for RSI, the predicted signal from the restricted water fraction was used to fit the tensor parameters while projecting out the hindered water signal. The restricted water fraction was derived from the RSI diffusion spectrum. All exemplary RSI-FA values were then normalized to each patient's DTI-FA value in NAWM in order to place the restricted FA on a similar scale to the DTI FA values.

For example, for longitudinal measurement of RSI-FA and DTI-FA in defined regions of edema and NAWM, it was necessary to account for the changes in brain shape caused by tumor growth or surgical resection. For example, nonlinear registration with the discrete cosine transform method was used to define a parameterized deformation between the first and second time points, before and after resolution of edema. The $T_1$-weighted, pre-contrast images, weighted by $T_2$-weighted FLAIR to correct for hypointensity regions, were used to guide the nonlinear registration, and the computed deformations were then applied to the co-registered DTI-FA and RSI-FA volumes.

Tumor was identified as the enhancing region on the T1 post-contrast sequence. For example, manual ROIs were drawn by an image expert (e.g., 10 years of experience) and verified by a board-certified neuroradiologist (e.g., 2 years of experience). Exemplary ROIs were created for peritumoral edema (Edema) and normal appearing white matter (NAWM) on the 3D volumetric FLAIR sequence, e.g., using axial images that were co-registered to the T1 post-contrast sequence. The exemplary Edema ROI was placed in an area of peritumoral edema that was T2 hyperintense at baseline, but isointense at follow-up. This subregion of the total peritumoral edema was chosen, for example, because it allowed a direct comparison of FA measurements with and without edema across co-registered images. An exemplary NAWM ROI of the same size was then drawn in the homologous region of the contralateral hemisphere. Although ROIs were variable across patients, the ROIs used for edema and NAWM in each patient were held constant across method and across time.

Fiber tract reconstructions were performed using the Amira® software package version 5.4.2 (Visage Imaging, Inc.) and extension modules. For example, for a selected patient, the area of hyperintensity on FLAIR was identified and outlined using a volumetric region growing approach. The pre-processed tensor data were loaded and used to perform streamline fiber tracking according to the fiber assignment by continuous tracking method. In this exemplary implementation, tracking was performed for the superior longitudinal fasciculus (SLF) and corticospinal tract (CST), e.g., due to their importance to language and motor functioning, respectively.

Volumetric seed regions for the SLF and CST were manually drawn based on anatomical landmarks on an image orientated perpendicular to the main direction of the tract. Anatomically defined waypoint ROIs were also used to select the tract of interest and exclude other tracts arising from the same seed region. For each fiber, tracts were initiated from seed regions with an FA>0.2 and tracking was terminated when the FA dropped below 0.2 or the bending angle exceeded 45 degrees.

The exemplary fibers were visualized using illuminated streamlines together with surface renderings of the tumor mass and FLAIR enhanced orthogonal images. For example, editing of fiber bundles was restricted to a minimum and was performed consistently for RSI and DSI computations. For example, only in areas where the cortico-pontine tract is close to the middle cerebral peduncle, fibers not belonging to the cortico-pontine tract were removed by manual intervention. Also, for example, fibers crossing between hemispheres were rejected as they resulted from partial volume effects inherent in the limited spatial resolution of diffusion-weighted images.

For example, statistical analyses were performed with the Statistical Package for the Social Sciences software (SPSS, Inc; version 17.0; Chicago, Ill.). For example, a 2-factor repeated measures analysis of variance (RMANOVA) was performed with type of tissue (FA in edema vs. FA in NAWM) as a repeating factor to evaluate FA differences at baseline between RSI and DTI. For example, a second RMANOVA was performed with time (baseline vs. follow-up) as the repeating factor to evaluate change in FA in regions of resolved edema between RSI and DTI.

Results of the exemplary tractography implementation are described.

Figure 21A:
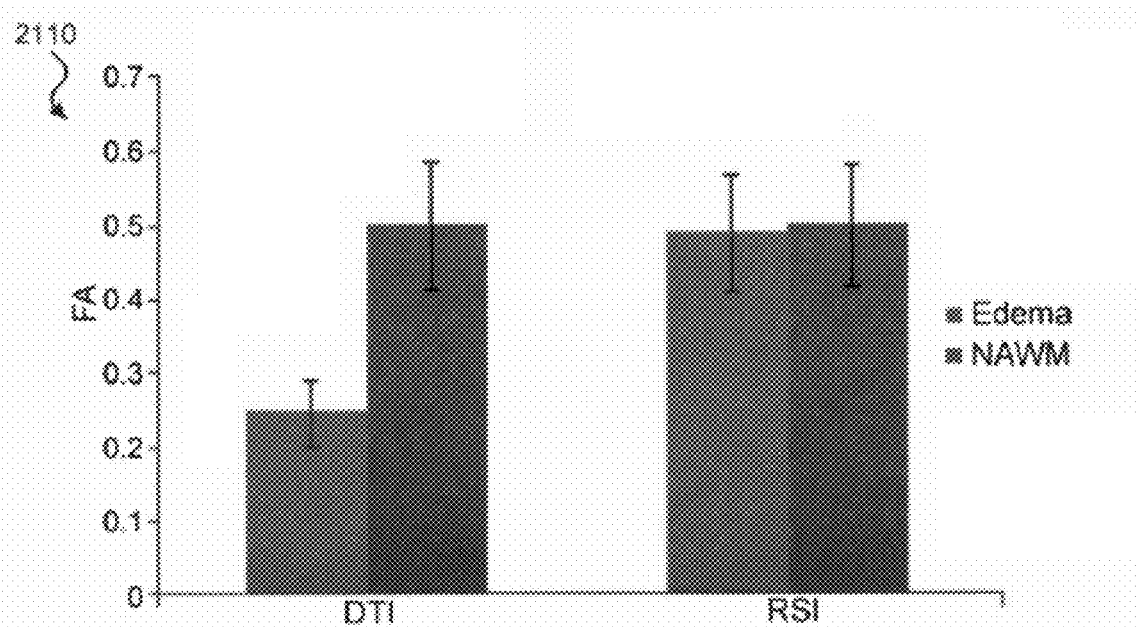
FIGS. 21A and 21B show data plots of exemplary mean baseline fractional anisotropy (FA) values and individual patient FA trajectories.
Figure 21B:
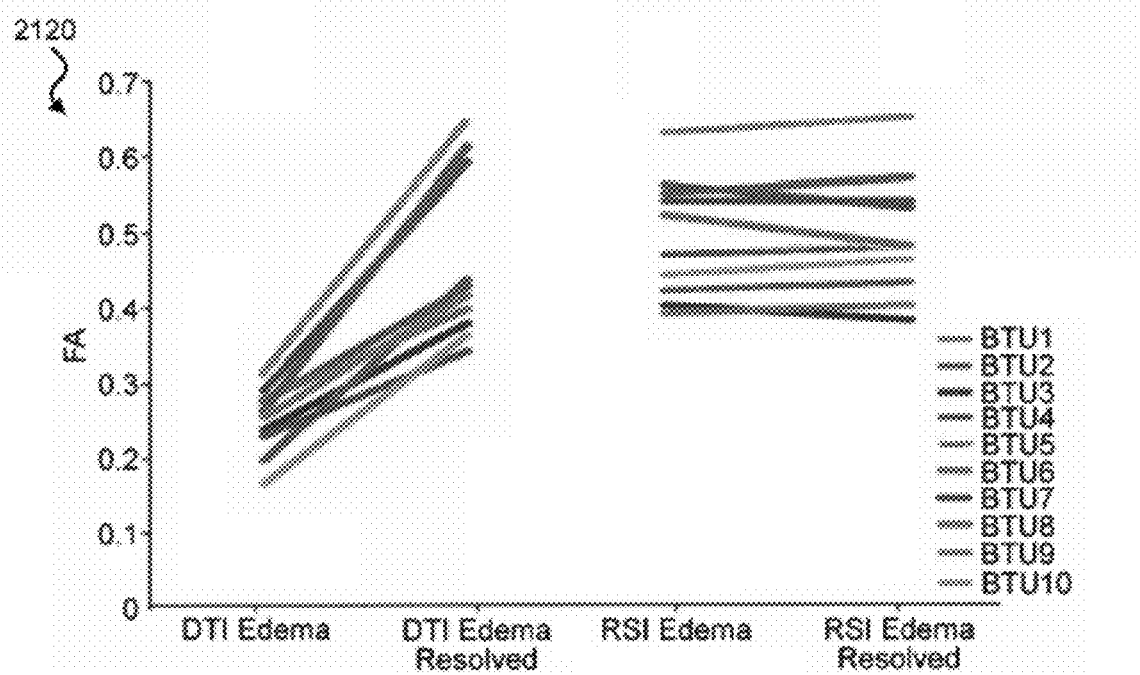

FIG. 21A shows a data plot 2110 of mean baseline FA values in edema and NAWM derived from ROIs using the disclosed RSI techniques and standard DTI techniques. The exemplary error bars represent standard deviations. FIG. 21B shows a data plot 2120 of individual patient trajectories of FA values in edema at baseline and in the same ROI when the edema had resolved for standard DTI and RSI. For example, the data plot 2120 showed a highly consistent pattern across patients, in which large differences in DTI-FA are shown between edema and resolved edema, while the RSI-FA estimates remained substantially constant. The exemplary results from the baseline RMANOVA revealed a main effect of method [$F(1,9)=150.5$, $p<0.001$], indicating that RSI-FA was higher overall than DTI-FA, and a main effect of type of tissue [$F(1,9)=115.6$, $p<0.001$], indicating that FA values were higher in NAWM relative to edema. These main effects were qualified by a method by tissue type interaction [$F(1,9)=$ 150.6]. For example, this interaction revealed FA values obtained in edema vs. NAWM differed as a function of the method. The exemplary follow-up paired t-tests confirmed that RSI-FA did not differ (although it was numerically higher in NAWM) between type of tissue [$t(9)=-1.6$, $p>0.05$)], whereas DTI-FA in edema was significantly lower than DTI-FA in NAWM [$t(9)=-11.9$, $p<0.001$].

The exemplary results from the RMANOVA comparing methods across time revealed a main effect of method [$F(1,9)=59.4$, $p<0.001$], indicating that RSI-FA was higher overall than DTI-FA, and a main effect of time [$F(1,9)=48.4$, $p<0.001$), indicating that FA values were higher in regions of resolved edema relative to baseline regions of edema. An exemplary method by time interaction revealed that the differences in FA between baseline and follow-up varied as a function of the method [$F(1,9)=57.0$, $p<0.001$]. Exemplary paired t-tests demonstrated that RSI-FA did not differ between baseline and follow-up imaging [$t(9)=-0.2$, $p>0.05$], whereas DTI-FA increased significantly at follow-up when the edema had resolved [$t(9)=-7.5$, $p<0.001$].

Figure 22:
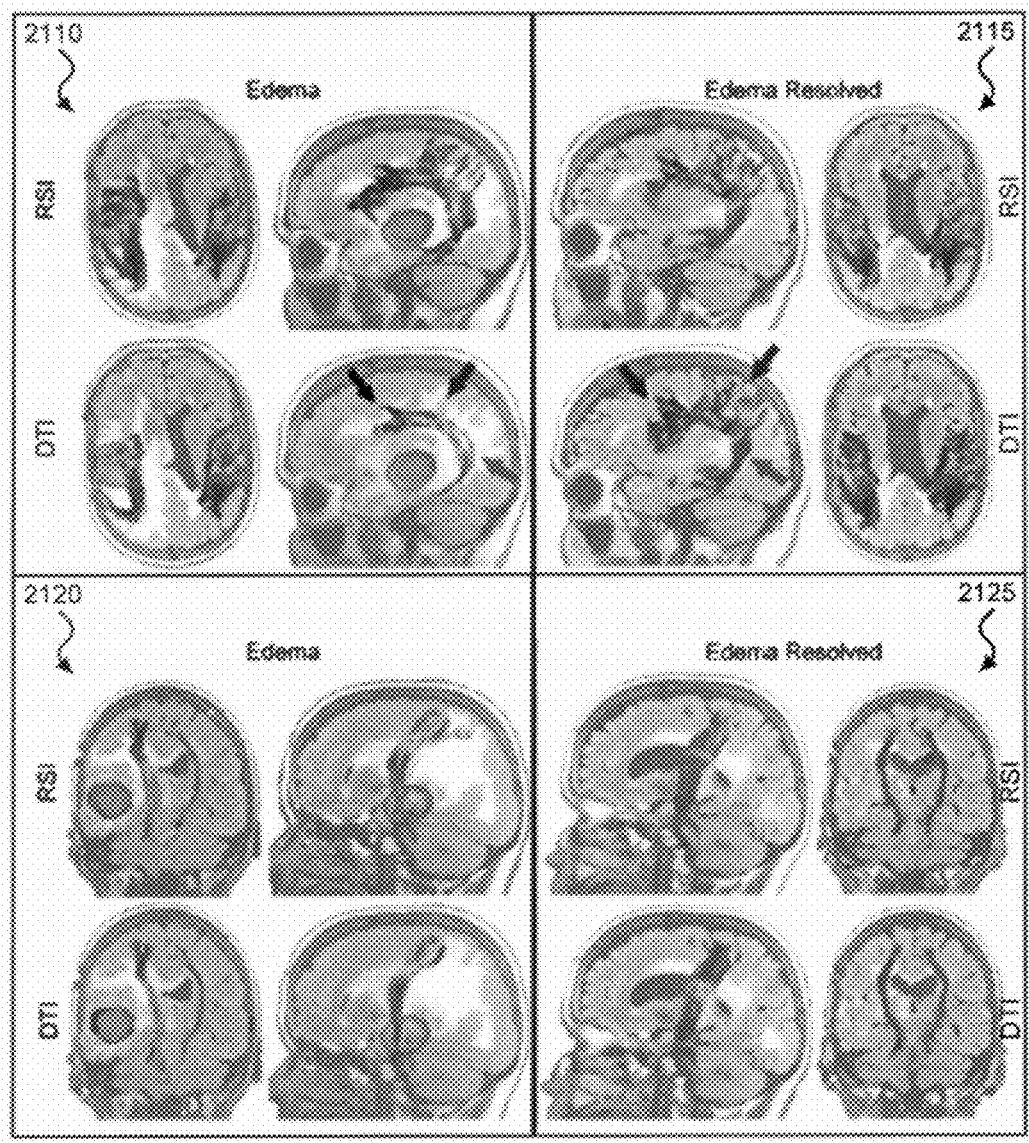
FIG. 22 shows exemplary streamline tractography images.

FIG. 22 shows exemplary streamline tractography images of the SLF (images 2210 and 2215) and CST (2220 and 2225) for a patient with a right temporal lobe GBM projected onto baseline and follow-up FLAIR images. The images 2210 and 2220 show the RSI and DTI-based tractography at baseline in regions of edema, and the images 2215 and 2225 show data obtained using the same tractography algorithm once the edema had mostly resolved. The images 2210, 2215, 2220, and 2225 include exemplary 3D renditions of ipsilateral (red tracts) and contralateral (green tracts) of the SLF are superimposed on axial and sagittal FLAIR slices collected at each time point. The images 2210 and 2220 show the GBM in blue in the pre-operative image. The exemplary black arrows point to frontal and parietal regions of the SLF that terminate completely in edema with DTI, and the exemplary red arrow shows the sparse streamlines in the temporal portion of the SLF with DTI. These exemplary streamlines are "recovered" using DTI only after the edema resolves.

For example, as was shown in FIG. 21A, at a standard FA threshold of 0.20, fewer streamlines are completed for the SLF with DTI, and the full extent of the tract is not appreciated. Conversely, for example, RSI is not significantly affected by edema and looks remarkable similar in the images with edema (e.g., image 2210) and without edema (e.g., image 2215). The images 2220 and 2225 in FIG. 22 show the CST for the same patient tracked through the edema. In this exemplary case, the tracts look more congruent between the DTI and RSI methods.

Figure 23:
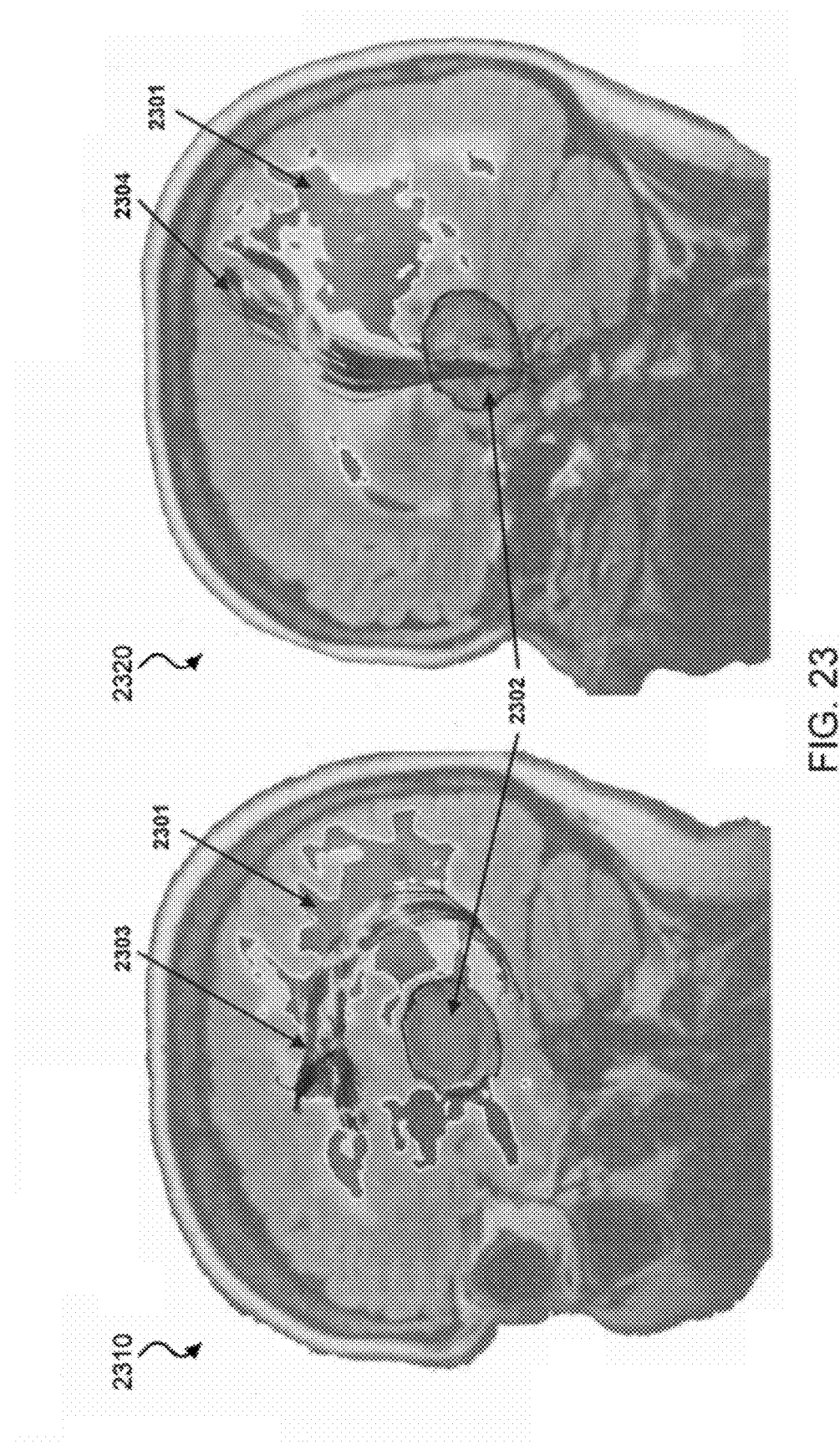
FIG. 23 shows exemplary 3D representations of streamline tractography images.

FIG. 23 shows 3D representation images of the SLF (image 2310) and CST (image 2320) shown relative to regions of subthreshold edema (e.g., region 2301 of FA<0.20 shown in light blue) projected onto a sagittal FLAIR image. The GBM tumor is shown in region 2302 (in blue), and exemplary 3D renditions of ipsilateral tracts of SLF is represented as tracts 2303 (in red) and of ipsilateral tracts of CST is represented as tracts 2304 (in red). For example, the image 2310 shows that the SLF is affected by regions of severe edema, whereas the image 2320 shows that the CST courses anterior to the severe edema, and therefore, streamlines are not as affected in this fiber. For example, FIG. 23 reveals that the CST avoids areas of more severe edema (e.g., subthreshold FA, FA<0.20).

Results of the exemplary tractography implementations showed that the exemplary RSI-FA techniques can remove the fast diffusion component associated with edema and restore anisotropy estimates in edematous white matter that approximate those values obtained when the edema had resolved. Conversely, the standard DTI-FA estimates were shown to be extremely low in edema, but increased when the edema had resolved. These exemplary results confirmed that the underlying structure of white matter was indeed intact in peritumoral tissue, but artifactually masked by vasogenic edema, e.g., of which the disclosed RSI technology was able to determine. This information is critical to patients with high-grade gliomas who are likely to have large regions of peritumoral edema causing mass effect, midline shift, and temporary clinical morbidity. Deciphering intact from destroyed white matter tracts in edematous regions can assist neurosurgeons in planning the optimal surgical route, as well as provide clinicians with information as to whether a patient's neurological deficits are likely chronic, resulting from destroyed fiber tracts, or temporary and likely to subside once the edema and mass effect resolve.

The disclosed RSI technology includes the ability to track fibers through regions of diffuse tumor and peritumoral tissue, e.g., by reducing the FA threshold to lower levels. As shown in FIGS. 22 and 23, the exemplary RSI technique successfully determined fiber tracts through regions of mild and severe edema when a standard FA threshold (e.g., 0.20) was applied. The exemplary longitudinal data showed that for the fiber tract most affected by edema (e.g., SLF), full recovery of the tract was achieved when the majority of edema was resolved.

Figure 24:
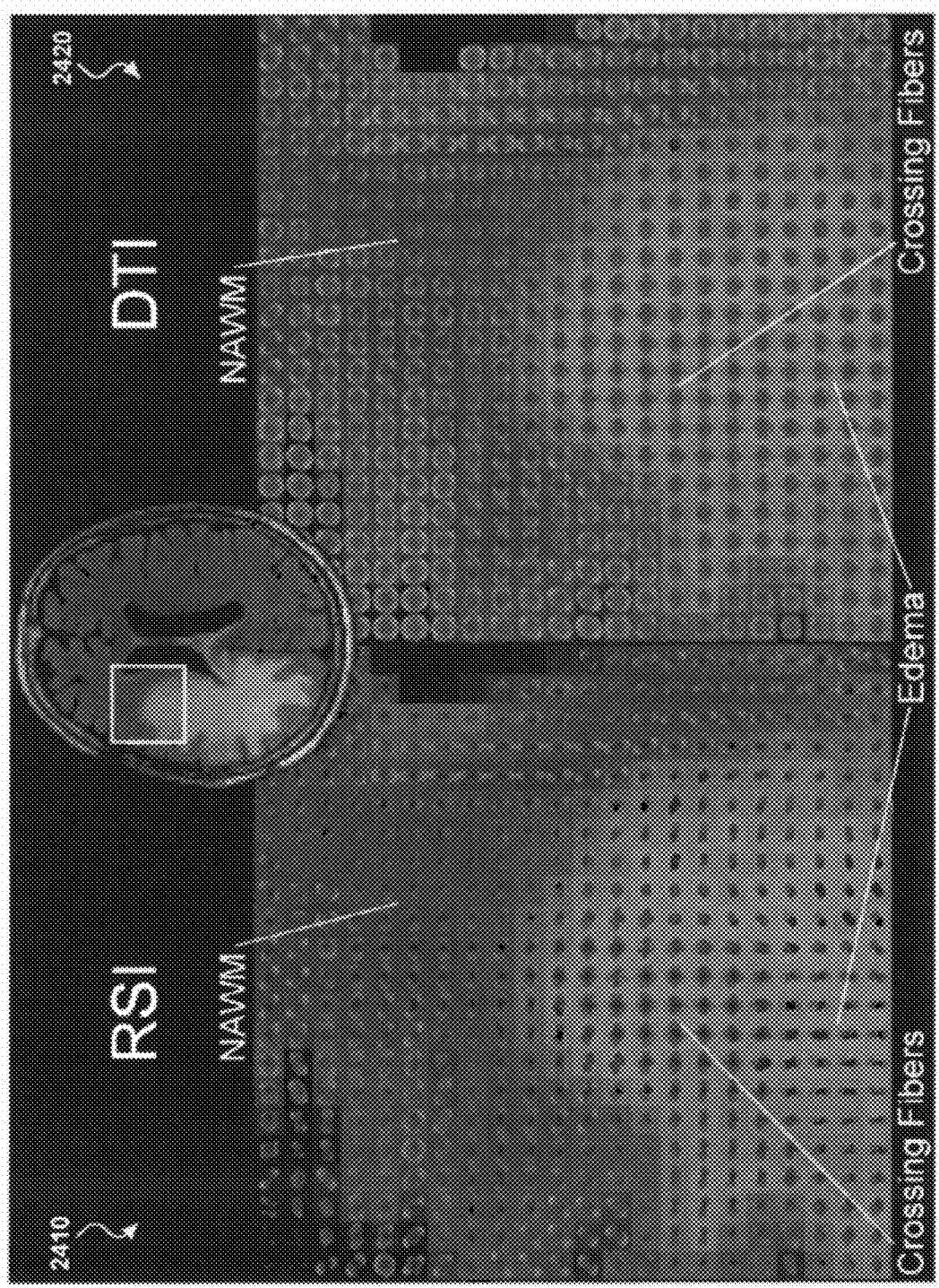
FIG. 24 shows an exemplary diagram of RSI and DTI voxel-wise fiber orientation estimates.

In addition, for example, the disclosed RSI technology can include the ability to increase the sharpness of the orientation estimates in edema and NAWM, e.g., by determining the slow, restricted volume fraction. This is illustrated in FIG. 24, which shows an exemplary diagram of RSI and DTI voxel-wise fiber orientation estimates in edema and NAWM for a single patient. FIG. 24 includes analysis images showing orientation estimates in edema and NAWM for RSI (image 2410) and standard DTI (image 2420). The image 2410 shows that the RSI values are highly oriented ("tubular") across voxels. The image 2420 shows that the standard DTI estimates are more spherical and nearly isotropic in regions of edema. For example, the anisotropy in edema is maintained in the RSI image 2410, but becomes less oriented (and substantially isotropic) in the DTI image 2420. Also for example, the orientation is stronger in NAWM for RSI as compared to DTI. Thus, the exemplary RSI technique allows for visualization of these tracts, maintaining a high degree of sharpness in the orientation estimates in both edema and NAWM.

For example, edema is not the only factor affecting FA estimates and clinical morbidity in patients with brain tumors. Lower FA estimates within peritumoral edema may reflect tumor cell infiltration and/or partial destruction of the extracellular matrix. The disclosed RSI technology can model the slow, restricted volume fraction and therefore can facilitate the interpretation of low FA. For example, the exemplary RSI-FA techniques are not significantly affected by infiltration of tumor cells in the extracellular matrix in the absence of fiber tract compromise.

For example, crossing fibers in multiple regions can result in lower FA estimates. For example, this is particularly of concern in the corona radiata where the superior longitudinal fasciculus crosses the CST and makes it difficult to track with precision. The disclosed RSI technology can also model crossing fibers within both edema and NAWM, e.g., due to its greater angular precision (as shown in FIG. 24).

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them.

Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method of characterizing a biological structure, comprising:
   determining individual diffusion signals from magnetic resonance imaging (MRI) data in a set of MRI images of a biological structure, the MRI data including diffusion weighting conditions that include at least one of diffusion gradient directions, diffusion gradient strengths, sensitivity factors (b-values), or diffusion times;
   combining the individual diffusion signals to determine a processed diffusion signal corresponding to at least one location within one or more voxels of the MRI data;
   calculating one or more parameters from the processed diffusion signal by using the diffusion weighting conditions; and
   using the one or more parameters to identify a characteristic of the biological structure,
   wherein the one or more parameters include values over a range of one or more diffusion length scales based on at least one of diffusion distance or diffusion rate.

2. The method of claim 1, wherein each of the individual diffusion signals includes an orientation and a volume fraction.

3. The method of claim 1, wherein the one or more diffusion length scales include fine scale diffusion processes occurring at one end and coarse scale diffusion processes occurring at the other end of each of the one or more diffusion length scales, wherein the fine scale diffusion processes include transverse diffusivities less than longitudinal diffusivities, and the coarse scale diffusion processes including transverse diffusivities greater than longitudinal diffusivities.

4. The method of claim 1, wherein the one or more parameters include at least one of scaled volume fraction, fiber orientation distribution, compartment geometry, geometric tortuosity, or compartment diameter.

5. The method of claim 4, wherein the fiber orientation distribution includes a hindered fiber orientation distribution (h-FOD) and restricted fiber orientation distribution (r-FOD), and the compartment geometry includes a cylindrical geometry.

6. The method of claim 5, further comprising producing a model of a microstructure of the biological structure based on the fiber orientation distribution.

7. The method of claim 6, wherein the model includes at least one of intra-cylindrical diffusivity values or extra-cylindrical diffusivity values of fibers within the biological structure.

8. The method of claim 7, wherein the compartment geometry further includes a cylindrical geometry.

9. The method of claim 8, wherein the model includes at least one of intra-spherical diffusivity values or extra-spherical diffusivity values of the spherical compartments within the biological structure.

10. The method of claim 8, further comprising deriving cellularity index values over the range of the one or more diffusion length scales for each voxel of the one or more voxels.

11. The method of claim 10, wherein the cellularity index values are derived based on maximizing sensitivity to the spherical compartments in the r-FOD.

12. The method of claim 5, further comprising producing a tractography model of fiber tracts of the biological structure by using fractional anisotropy values.

13. The method of claim 3, wherein the calculating includes fitting estimate values into a linear mixture model of the processed diffusion signal for a plurality of conditions of the diffusion weighting conditions.

14. The method of claim 13, wherein the fitting includes using at least one of spherical harmonic functions or Bessel functions.

15. The method of claim 1, wherein the biological structure includes at least one of cell bodies, axons, dendrites, cell processes, intracellular, or extracellular space.

16. The method of claim 1, wherein the characteristic of the biological structure includes at least one of a categorization as a healthy or a diseased structure, severity of the diseased structure, shape, size, density, or orientation.

17. The method of claim 1, wherein the values corresponding to the identified characteristic include a relative value compared to a normal value of the characteristic.

18. The method of claim 1, further comprising forming an image of the identified characteristic at a particular diffusion length scale using the value of at least one of the one or more parameters at the corresponding diffusion length scale.

19. The method of claim 18, further comprising forming a combined image of the identified characteristic from each of the formed images across the range of the one or more diffusion length scales.

20. The method of claim 13, further comprising acquiring the MRI data by using a bias variance tradeoff in the linear mixture model.

21. An MRI system, comprising:
a magnetic resonance imaging data acquisition system adapted to acquire magnetic resonance (MR) data from a biological structure of a subject, the MR data comprising one or more data voxels; and
a data processing unit that receives the MR data from the magnetic resonance data imaging acquisition system, the data processing unit comprising:
a mechanism that generates diffusion data of the biological structure from the MR data by determining a diffusion signal corresponding to at least one location within the one or more data voxels by combining a plurality of individual diffusion signals, each individual diffusion signal having an orientation and volume fraction, the diffusion data including one or more parameters, and
a mechanism that uses the one or more parameters to identify a characteristic of the biological structure,
wherein the one or more parameters include values over a range of one or more diffusion length scales based on at least one of diffusion distance or diffusion rate, and
wherein the MR data includes at least one of diffusion gradient directions, diffusion gradient strengths, diffusion waveforms, diffusion sensitivity factors (b-values), or diffusion times.

22. The MRI system of claim 21, wherein the one or more diffusion length scales include fine scale diffusion processes occurring at one end and coarse scale diffusion processes occurring at the other end of each of the one or more diffusion length scales, wherein the fine scale diffusion processes include transverse diffusivities less than longitudinal diffusivities, and the coarse scale diffusion processes including transverse diffusivities greater than longitudinal diffusivities.

23. The MRI system of claim 21, wherein the one or more parameters include at least one of volume fraction, fiber orientation distribution, compartment geometry, geometric tortuosity, or compartment diameter.

24. The MRI system of claim 23, wherein the fiber orientation distribution includes an h-FOD and an r-FOD, and the compartment geometry includes a cylindrical geometry.

25. The MRI system of claim 24, wherein the data processing unit further comprises a mechanism that produces a model of a microstructure of the biological structure based on the fiber orientation distribution, the model including at least one of intra-cylindrical diffusivity values or extra-cylindrical diffusivity values of fibers within the biological structure.

26. The MRI system of claim 25, wherein the compartment geometry further includes a cylindrical geometry, and the model further includes at least one of intra-spherical diffusivity values or extra-spherical diffusivity values of the spherical compartments within the biological structure.

27. The MRI system of claim 26, wherein the data processing unit further comprises a mechanism that derives cellularity index values over the range of the one or more diffusion length scales for each voxel of the one or more voxels, wherein the cellularity index values are derived based on maximizing sensitivity to the spherical compartments in the r-FOD.

28. The MRI system of claim 26, wherein the data processing unit further comprises a mechanism that produces a tractography model of fiber tracts of the biological structure using fractional anisotropy values.

29. The MRI system of claim 21, wherein the biological structure includes at least one of cell bodies, axons, dendrites, cell processes, intracellular, or extracellular space, and wherein the characteristic of the biological structure includes at least one of a categorization as a healthy or a diseased structure, severity of the diseased structure, shape, size, density, or orientation.

30. A computer program product comprising a nonvolatile computer-readable storage medium having instructions stored thereon, the instructions comprising:
code for determining individual diffusion signals from MRI data in a set of MRI images of a biological structure, the MRI data including diffusion weighting conditions that include at least one of diffusion gradient directions, diffusion gradient strengths, sensitivity factors (b-values), or diffusion times;
code for calculating one or more parameters of the MRI data by combining the individual diffusion signals to determine a processed diffusion signal corresponding to at least one location within one or more voxels of the MRI data, wherein the combining includes fitting estimate values into a linear mixture model of the processed diffusion signal for a plurality of conditions of the diffusion weighting conditions; and code for using the one or more parameters to identify a characteristic of the biological structure.

31. The nonvolatile computer-readable storage medium of claim 30, wherein the one or more parameters include values over a range of one or more diffusion length scales based on at least one of diffusion distance or diffusion rate.

32. The nonvolatile computer-readable storage medium of claim 30, wherein the characteristic of the biological structure includes at least one of a categorization as a healthy or a diseased structure, severity of the diseased structure, shape, size, density, or orientation.

33. The nonvolatile computer-readable storage medium of claim 31, wherein the values corresponding to the identified characteristic include a relative value compared to a normal value of the characteristic.

34. The nonvolatile computer-readable storage medium of claim 31, further comprising code for forming an image of the identified characteristic at a particular diffusion length scale using the value of at least one of the one or more parameters at the corresponding diffusion length scale.

35. The nonvolatile computer-readable storage medium of claim 34, further comprising code for forming a combined image of the identified characteristic from each of the formed images across the range of the one or more diffusion length scales.

36. A method for estimating parameters of a linear mixture model of diffusion magnetic resonance imaging data, comprising:

receiving MR data from diffusion MRI signals of a biological structure;

using model regularization of a solution vector to estimate model parameters from the MRI data by placing constraints on the form and the extent of the estimated model parameters; and using the estimated model parameters to identify a characteristic of the biological structure.

37. The method of claim 36, wherein the placing constraints includes imposing at least one of a smoothness, sparceness, or non-negative constraints on the solution vector.

38. The method of claim 36, wherein the constraints include prior assumptions and vary as a function of location within a voxel of one or more voxels of the MR data with respect to the biological structure.

39. The method of claim 36, further comprising remove particular contributions from the diffusion MRI signals while preserving desired contributions of the diffusion MRI signals to estimate other model parameters.

40. The method of claim 39, wherein the biological structure includes at least one of cell bodies, axons, dendrites, cell processes, intracellular, or extracellular space.

41. The method of claim 40, wherein the particular contributions include extracellular water diffusion signal that is associated with vasogenic or cytotoxic edema, and the desired contributions include grey and white matter diffusion signal, wherein the identified characteristic includes diffusion properties of grey and white matter, the diffusion properties including orientation, density, and diameter distribution of axons and dendrites.

42. The method of claim 36, wherein the estimated model parameters include isotropic restricted diffusion values within at least one of cylindrical or spherical geometries.

43. The method of claim 42, further comprising using the isotropic restricted diffusion values to identify the characteristic including at least one of a categorization as a healthy or a diseased structure, severity of the diseased structure, shape, size, density, or orientation.

44. The method of claim 42, further comprising using the estimated model parameters over multiple time points to quantify changes of the characteristic of the biological structure over time.

45. The method of claim 42, further comprising using changes in isotropic restricted diffusion to measure changes in tumor cellularity over time, and changes in tumor cellularity with or without treatment.

* * * * *